(12) United States Patent
Wu et al.

(10) Patent No.: US 11,948,939 B2
(45) Date of Patent: Apr. 2, 2024

(54) PROFILE CONTROL OF GATE STRUCTURES IN SEMICONDUCTOR DEVICES

(71) Applicant: Taiwan Semiconductor Manufacturing Co., Ltd., Hsinchu (TW)

(72) Inventors: Kai-Chi Wu, Hsinchu (TW); Ching-Hung Kao, Tainan (TW); Meng-I Kang, Changhua County (TW); Kuo-Fang Ting, Zhubei (TW)

(73) Assignee: Taiwan Semiconductor Manufacturing Company, Ltd, Hsinchu (TW)

( * ) Notice: Subject to any disclaimer, the term of this patent is extended or adjusted under 35 U.S.C. 154(b) by 159 days.

(21) Appl. No.: 17/320,171

(22) Filed: May 13, 2021

(65) Prior Publication Data
US 2022/0223589 A1    Jul. 14, 2022

Related U.S. Application Data

(60) Provisional application No. 63/136,972, filed on Jan. 13, 2021.

(51) Int. Cl.
| | |
|---|---|
| *H01L 27/088* | (2006.01) |
| *H01L 21/8234* | (2006.01) |
| *H01L 29/66* | (2006.01) |
| *H01L 29/78* | (2006.01) |

(52) U.S. Cl.
CPC .. *H01L 27/0886* (2013.01); *H01L 21/823431* (2013.01); *H01L 29/66545* (2013.01); *H01L 29/7831* (2013.01)

(58) Field of Classification Search
CPC ..... H01L 21/823842; H01L 21/823828; H01L 29/7831
See application file for complete search history.

(56) References Cited

U.S. PATENT DOCUMENTS

| | | | |
|---|---|---|---|
| 9,093,530 B2 | 7/2015 | Huang et al. | |
| 9,171,929 B2 | 10/2015 | Lee et al. | |
| 9,214,555 B2 | 12/2015 | Oxland et al. | |

(Continued)

FOREIGN PATENT DOCUMENTS

| | | |
|---|---|---|
| TW | 201816943 A | 5/2018 |
| TW | 201944576 A | 11/2019 |

*Primary Examiner* — Tuan A Hoang
(74) *Attorney, Agent, or Firm* — Sterne, Kessler, Goldstein & Fox P.L.L.C.

(57) ABSTRACT

An integrated circuit (IC) with active and dummy device cell arrays and a method of fabricating the same are discloses. The IC includes a substrate, an active device cell, and a dummy device cell. The active device cell includes an array of source/drain (S/D) regions of a first conductivity type disposed on or within the substrate and an array of gate structures with a first gate fill material disposed on the substrate. The dummy device cell includes a first array of S/D regions of the first conductivity type disposed on or within the substrate, a second array of S/D regions of a second conductivity type disposed on or within the substrate, and an array of dual gate structures disposed on the substrate. Each of the dual gate structures includes the first gate fill material and a second gate fill material that is different from the first gate fill material.

20 Claims, 42 Drawing Sheets

(56) References Cited

U.S. PATENT DOCUMENTS

| | | |
|---|---|---|
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 10,515,943 B2 | 12/2019 | Lee et al. |
| 11,211,387 B2 | 12/2021 | Liaw |
| 2009/0315114 A1* | 12/2009 | Rakshit ........... H01L 21/823842 257/E27.06 |
| 2015/0171218 A1 | 6/2015 | Steigerwald et al. |
| 2019/0109193 A1* | 4/2019 | Liaw .................. H01L 29/7848 |
| 2019/0189614 A1 | 6/2019 | Lee et al. |
| 2019/0252380 A1 | 8/2019 | Sharma et al. |
| 2021/0020639 A1* | 1/2021 | Zhu .................... H01L 29/6656 |

\* cited by examiner

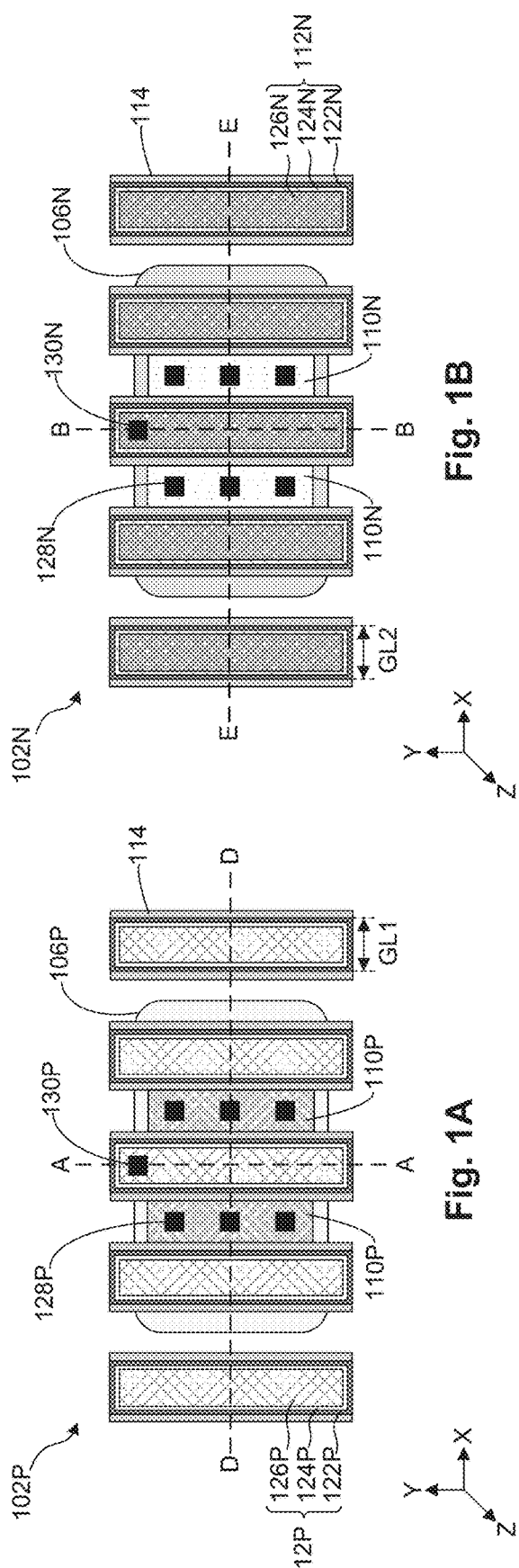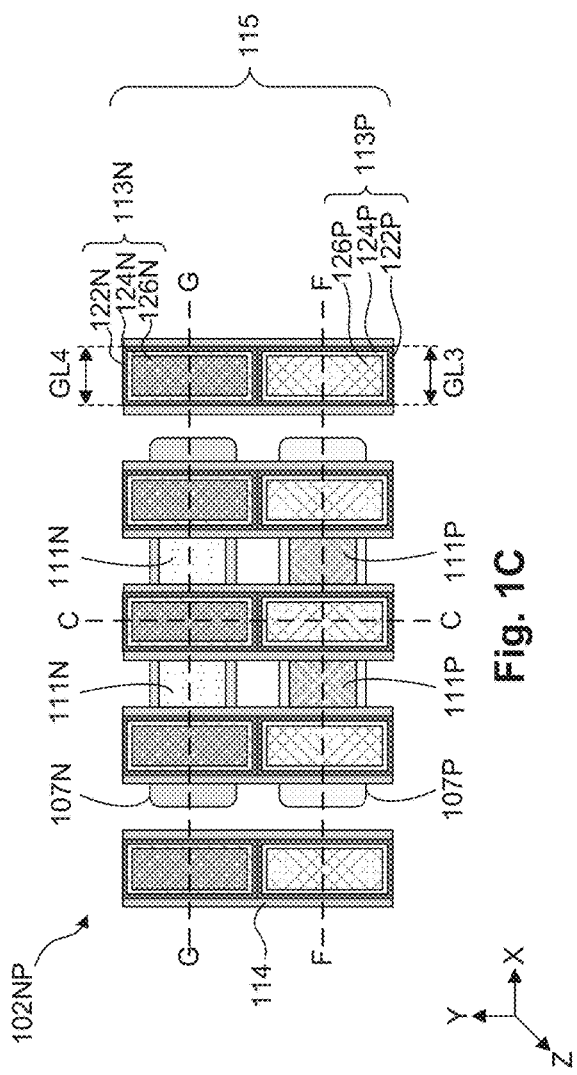

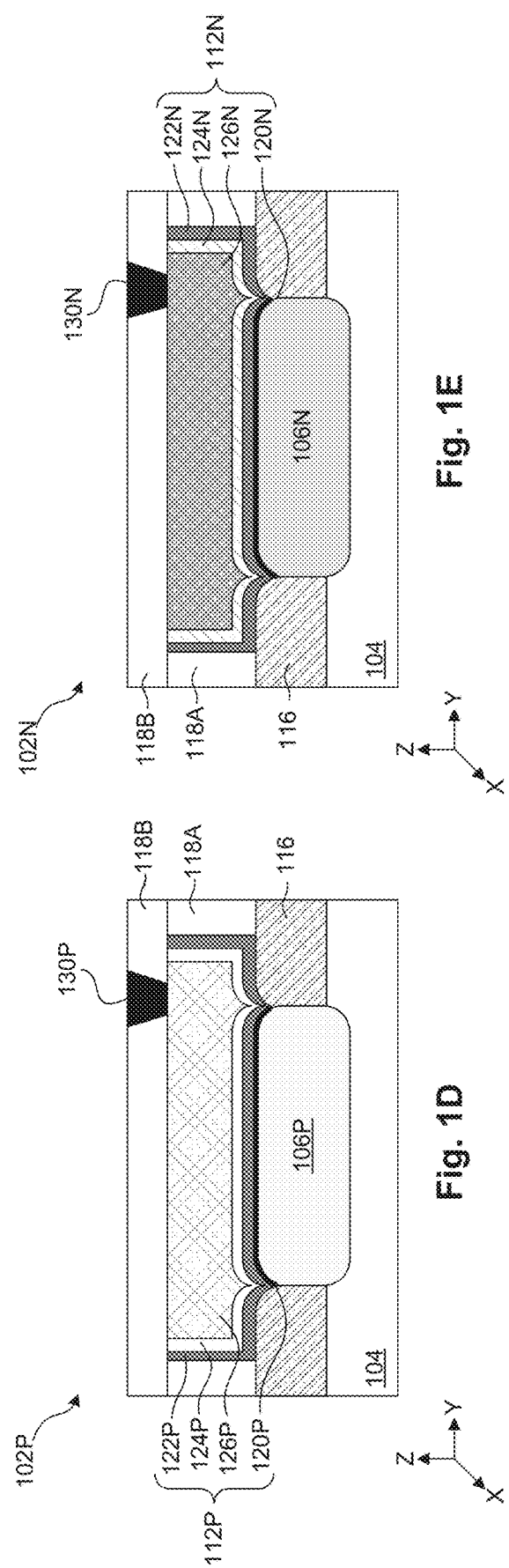
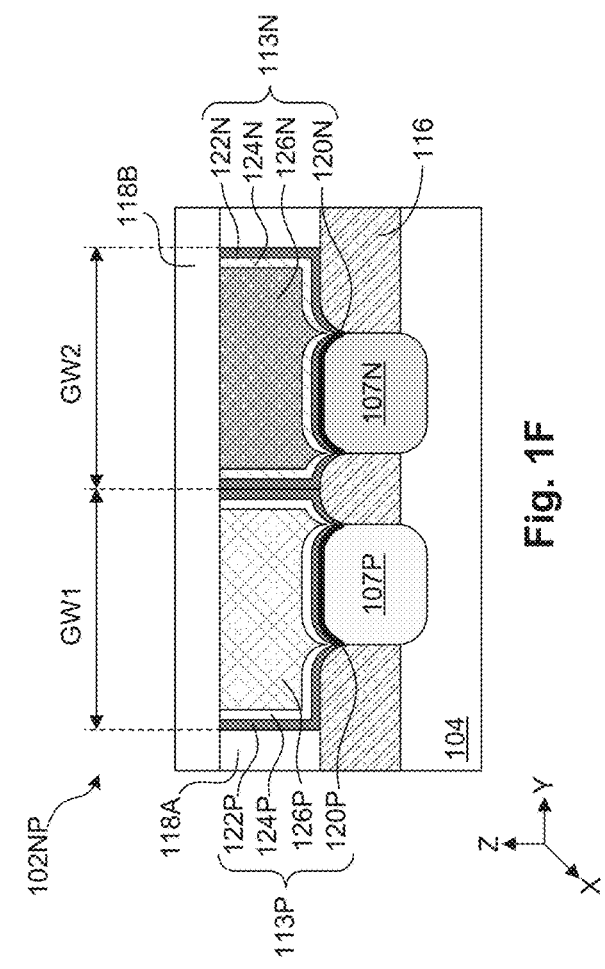

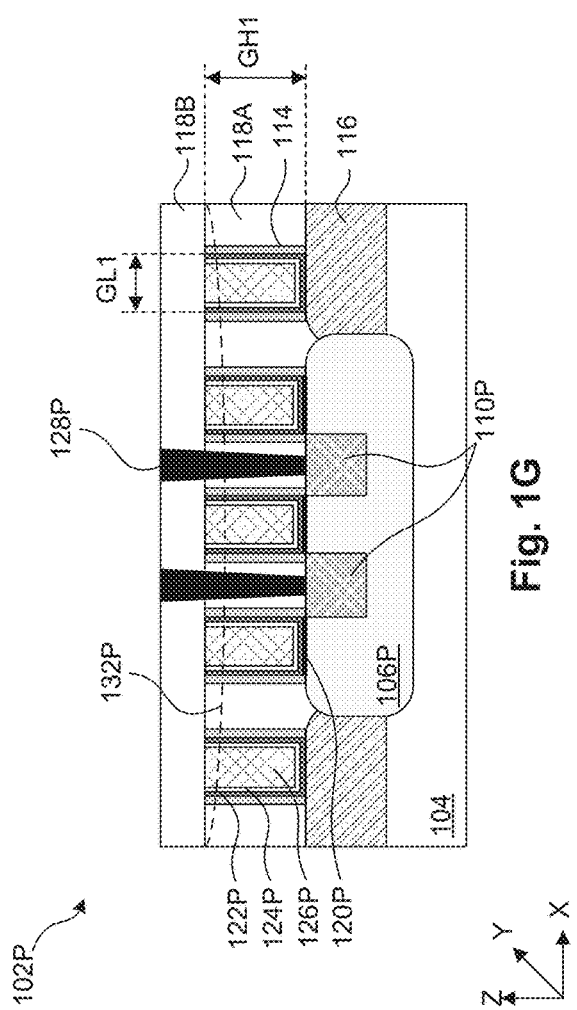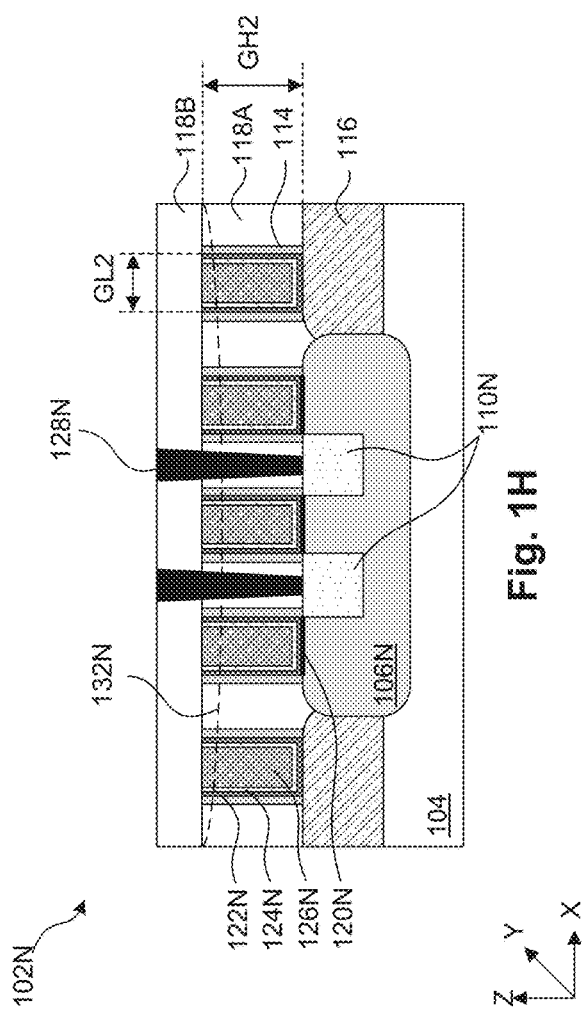

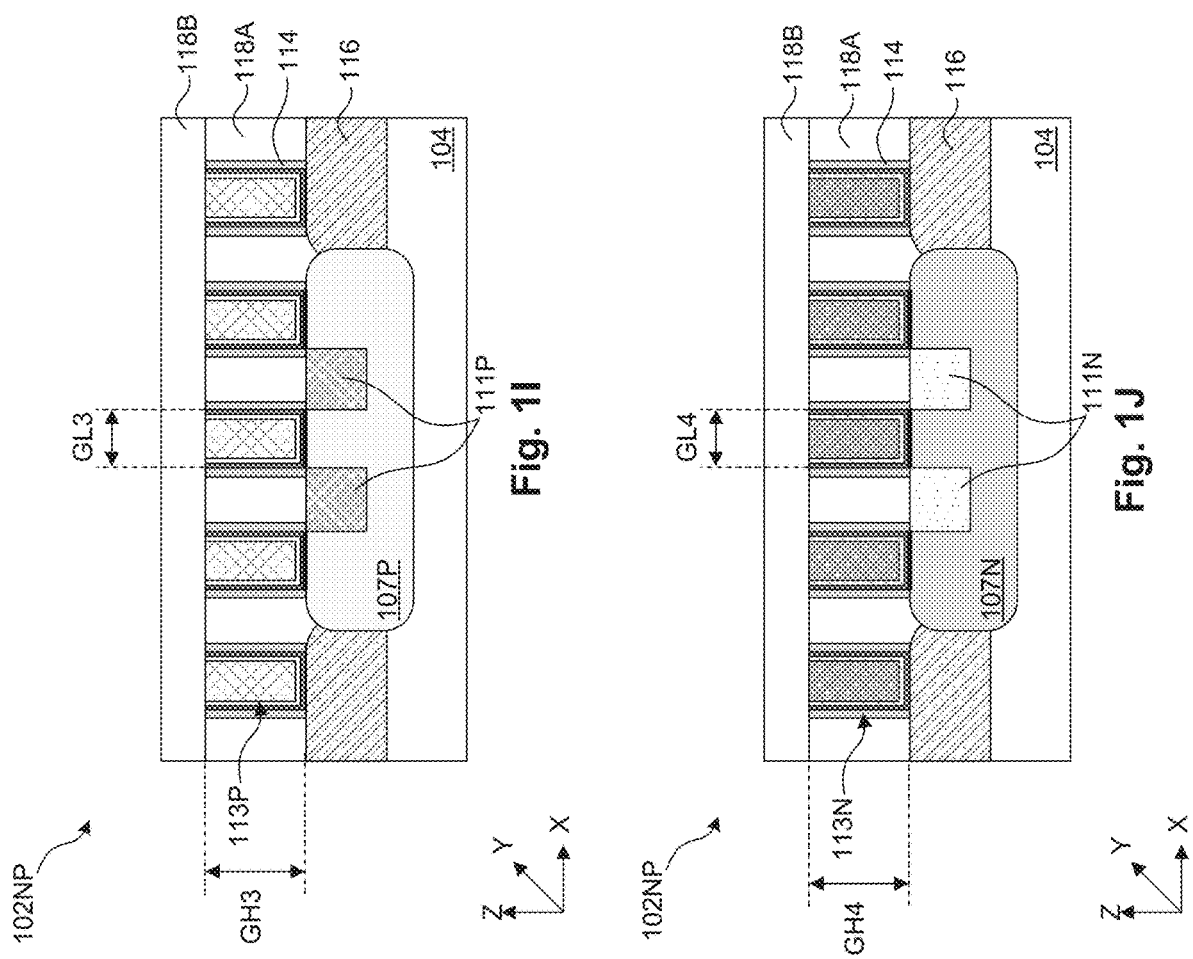

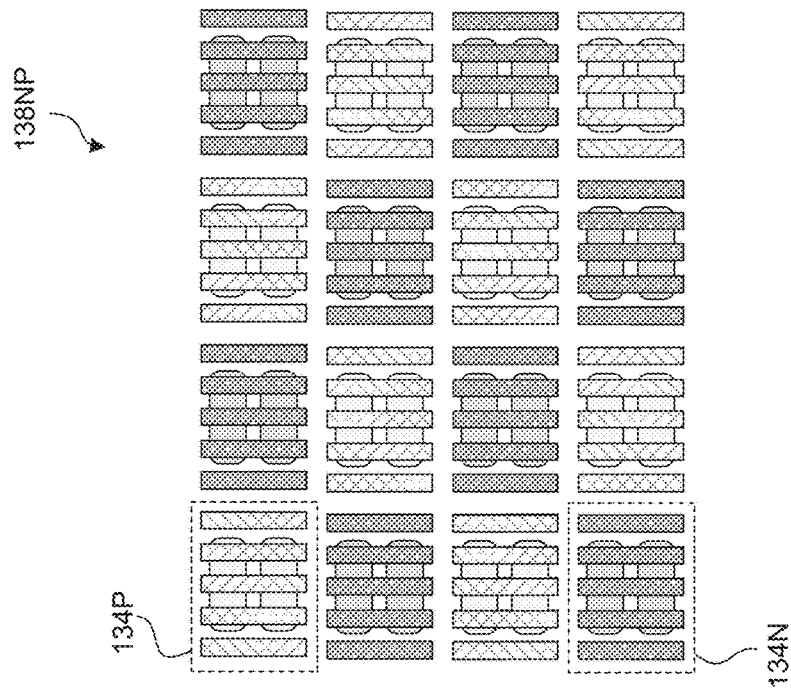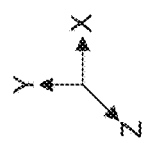
Fig. 1O
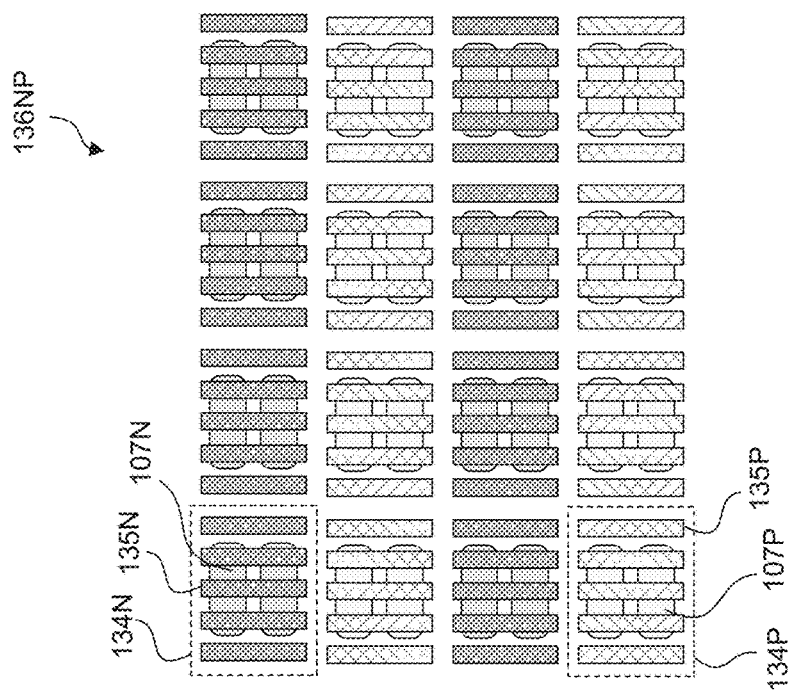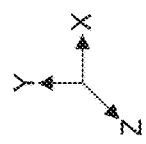
Fig. 1N

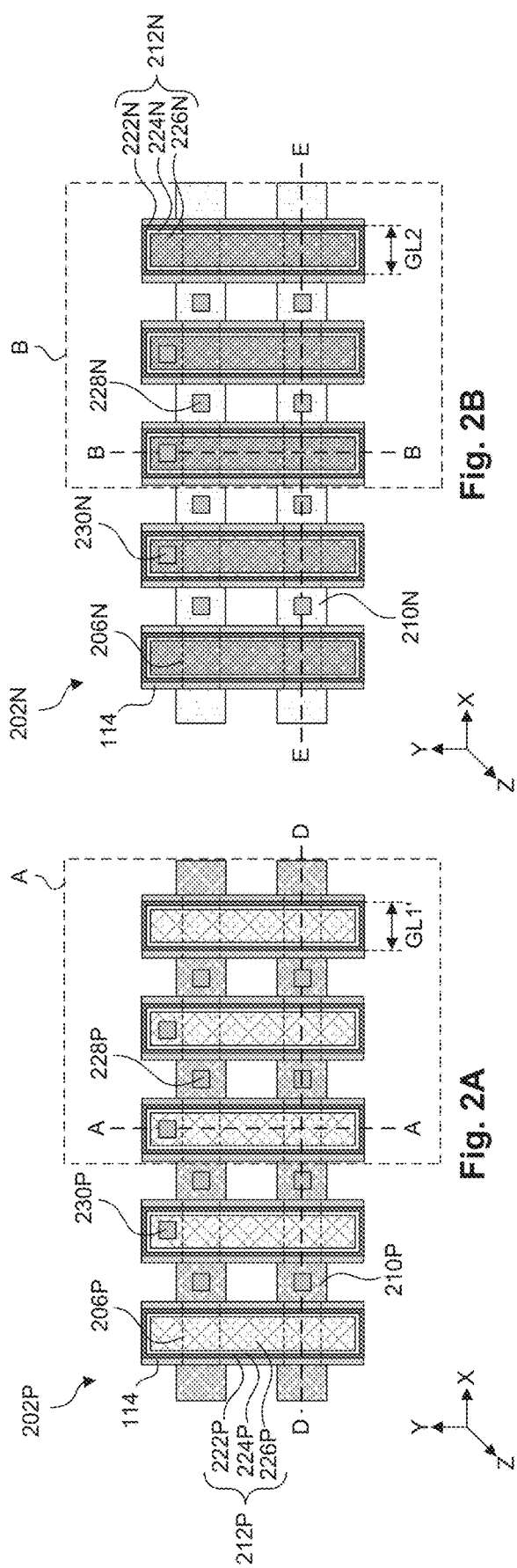
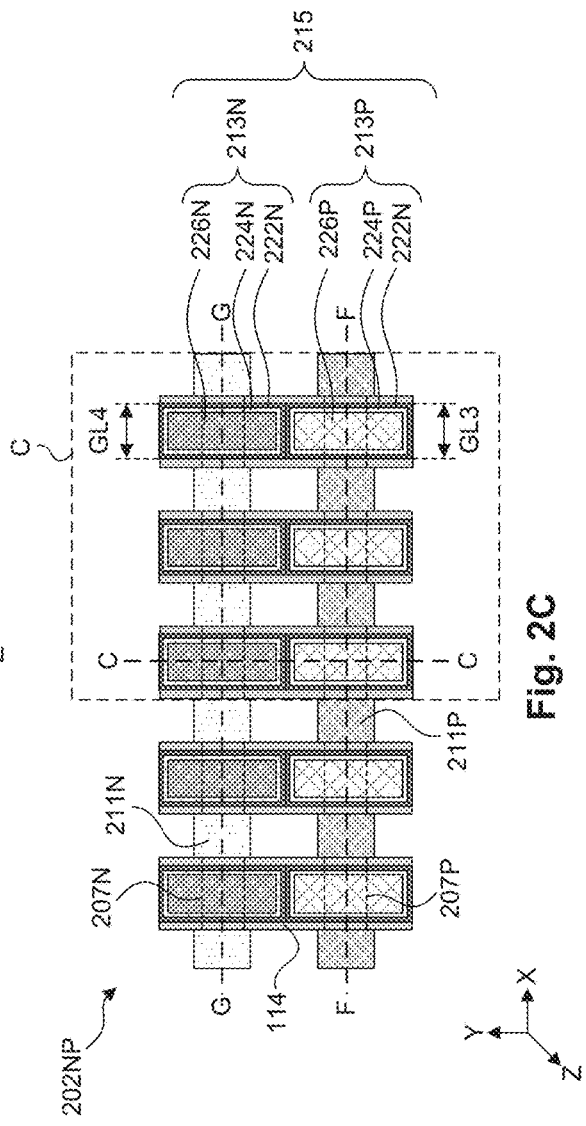
Fig. 2A
Fig. 2B
Fig. 2C

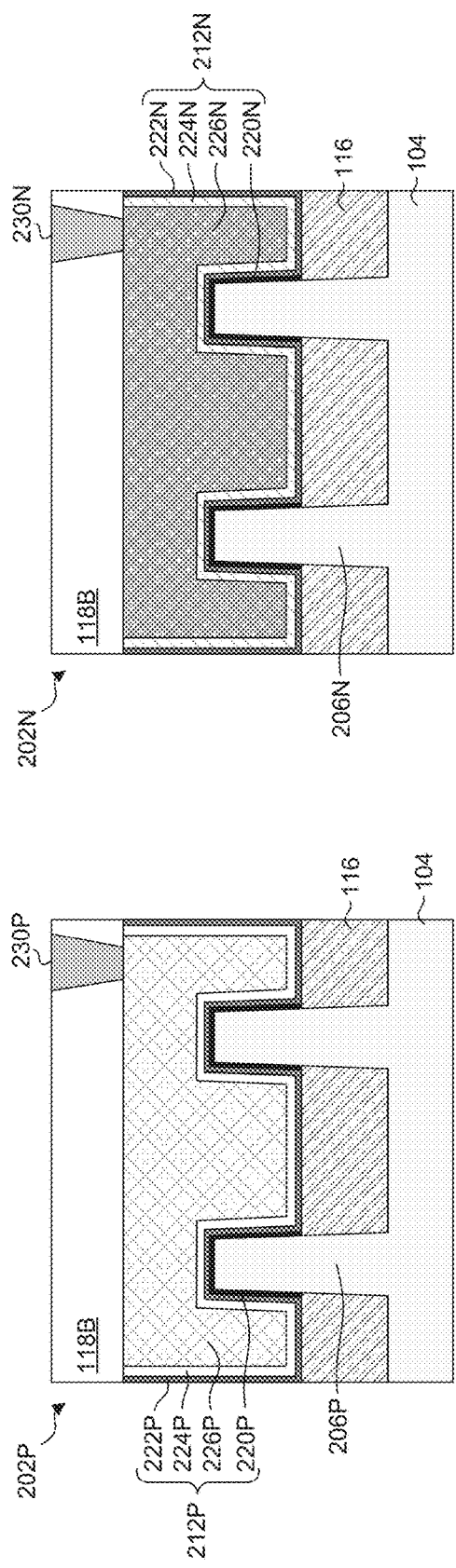
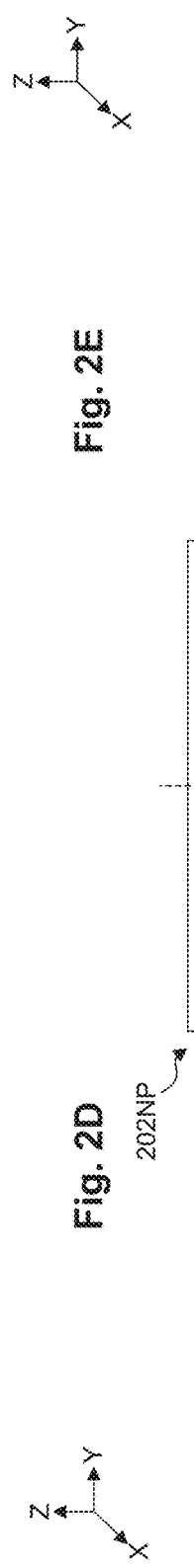
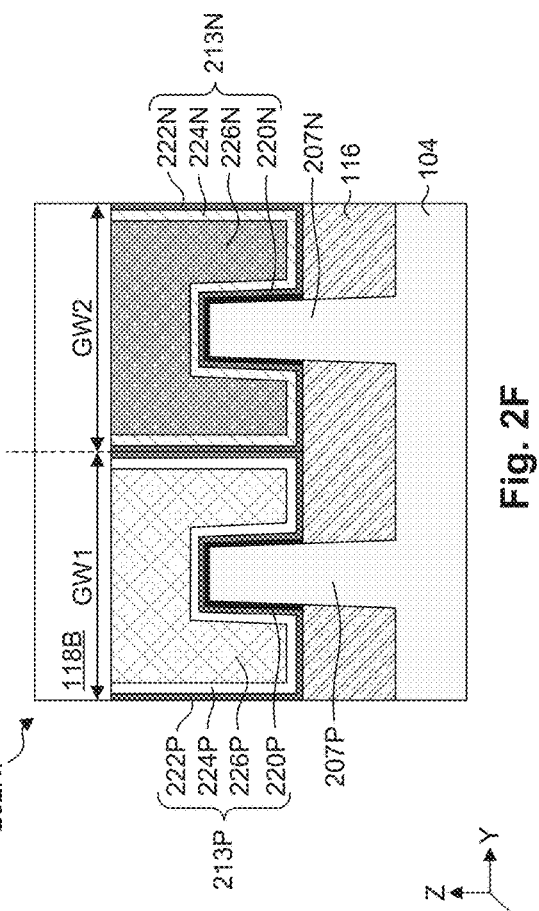
Fig. 2D
Fig. 2E
Fig. 2F

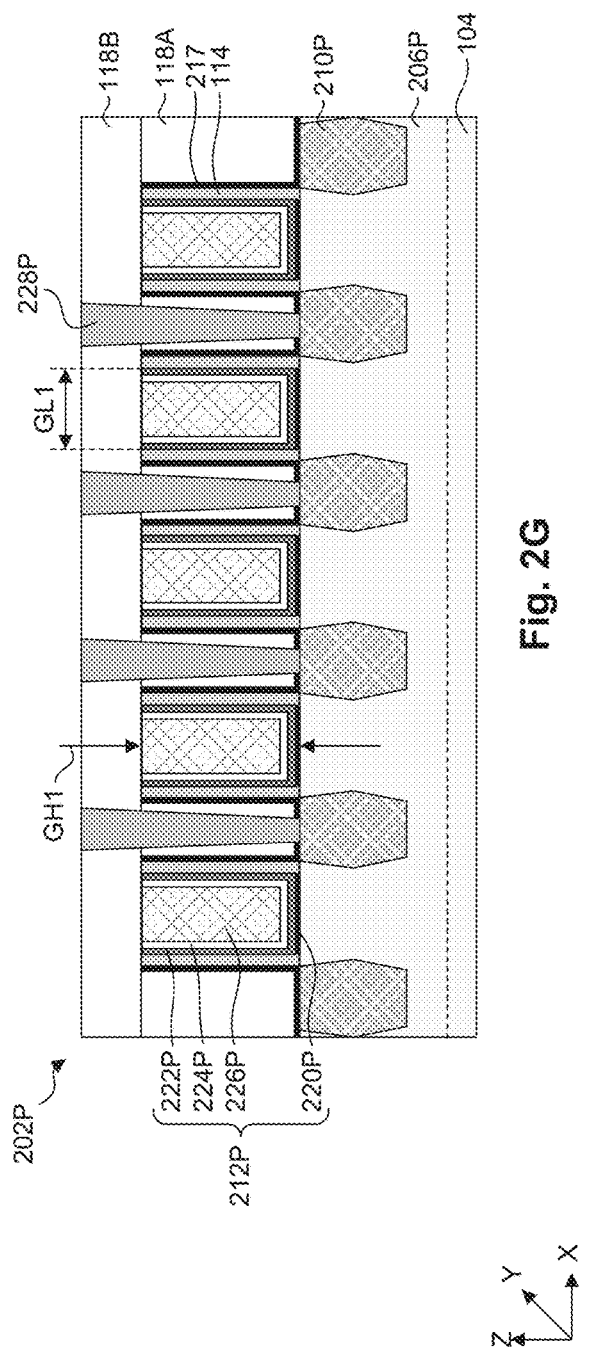
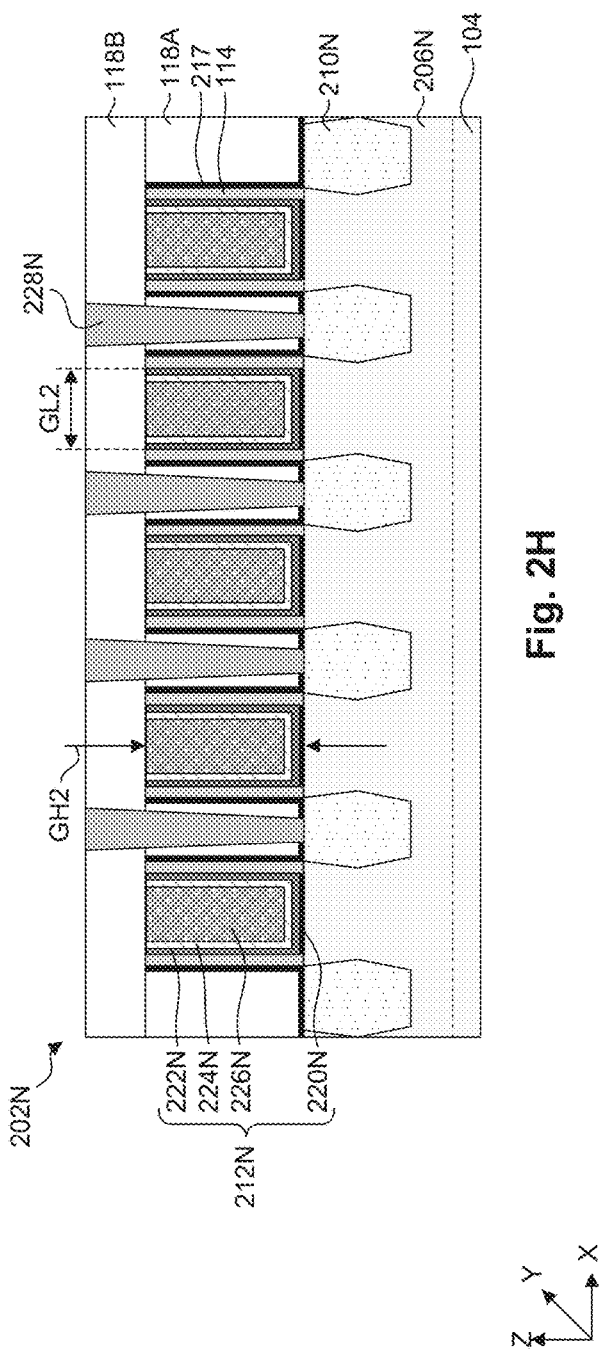

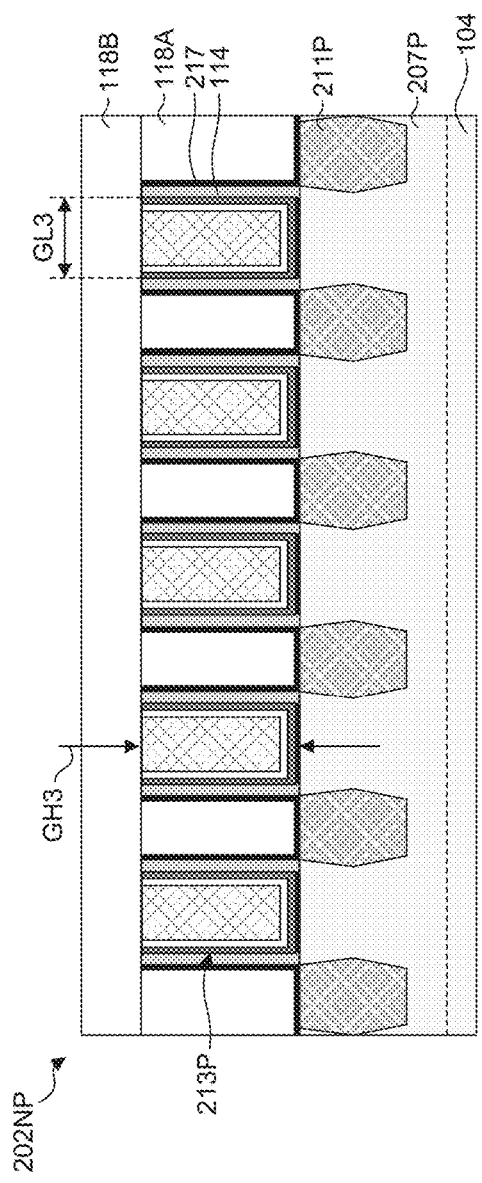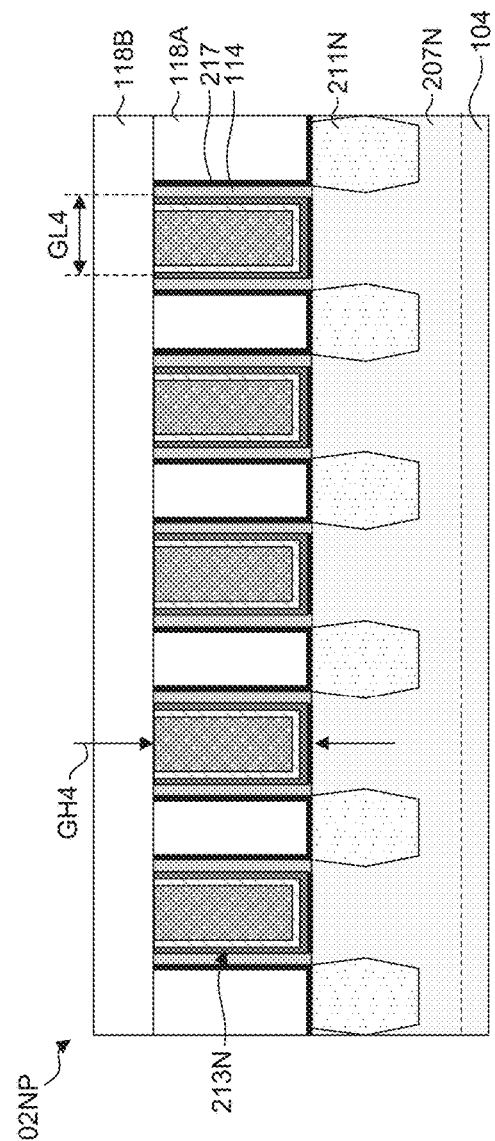
Fig. 2I
Fig. 2J

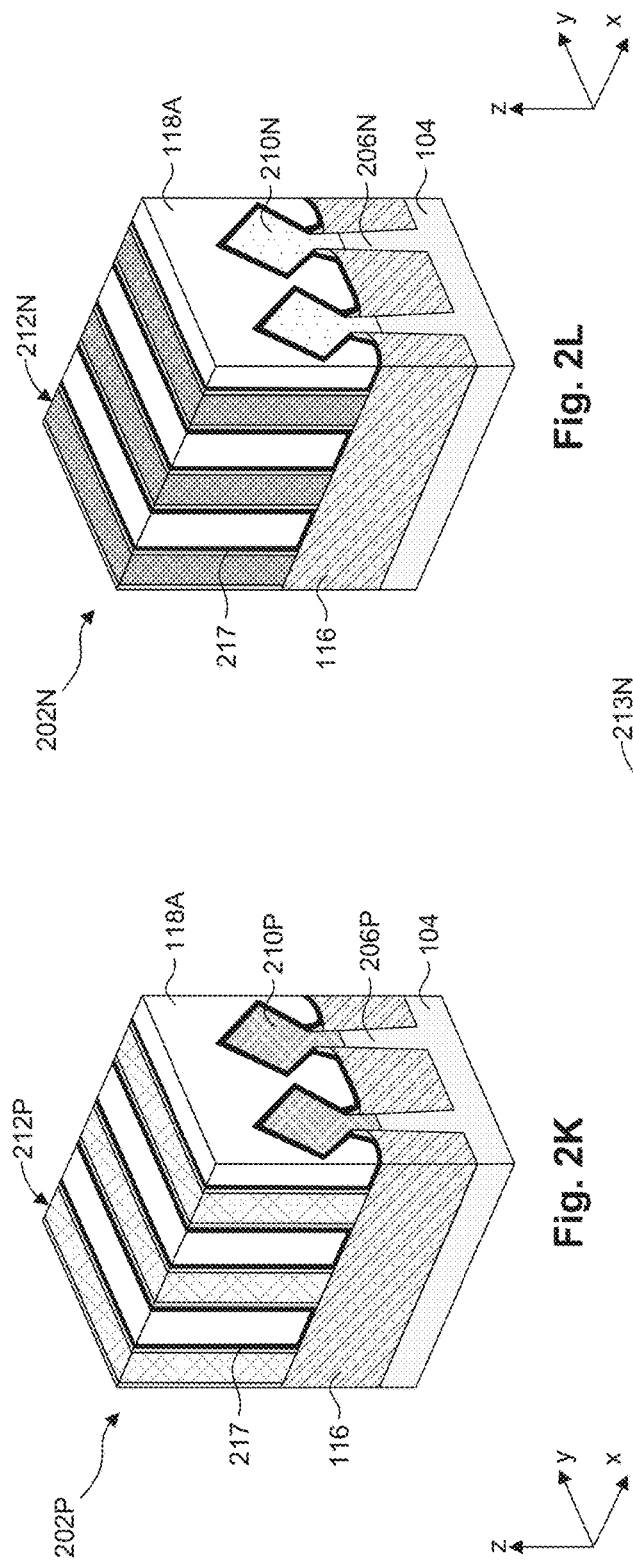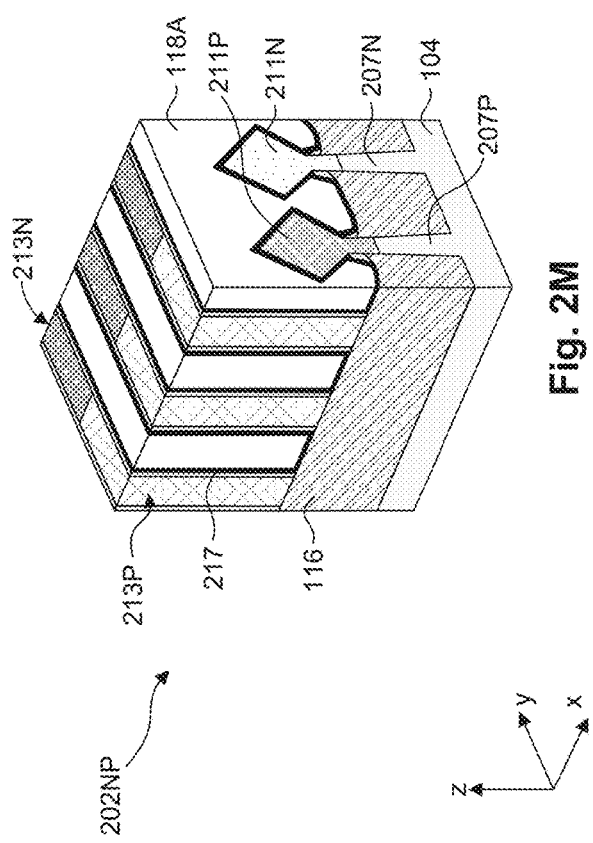
Fig. 2K
Fig. 2L
Fig. 2M

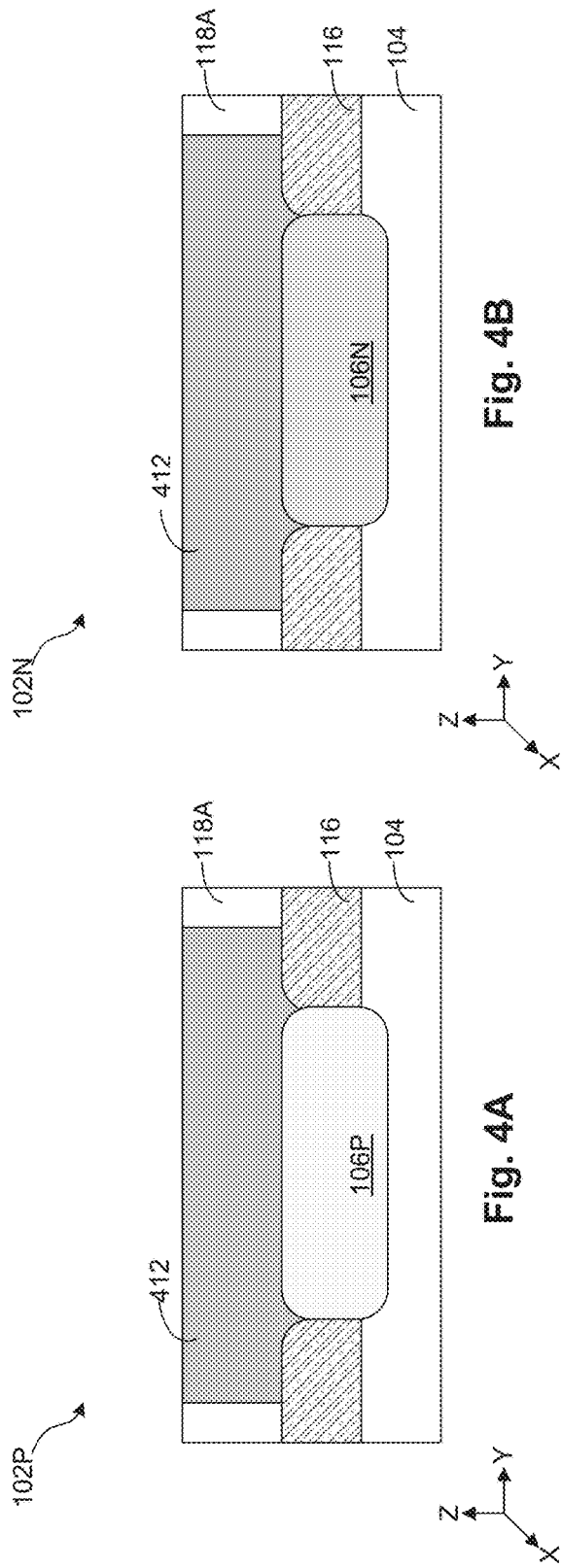

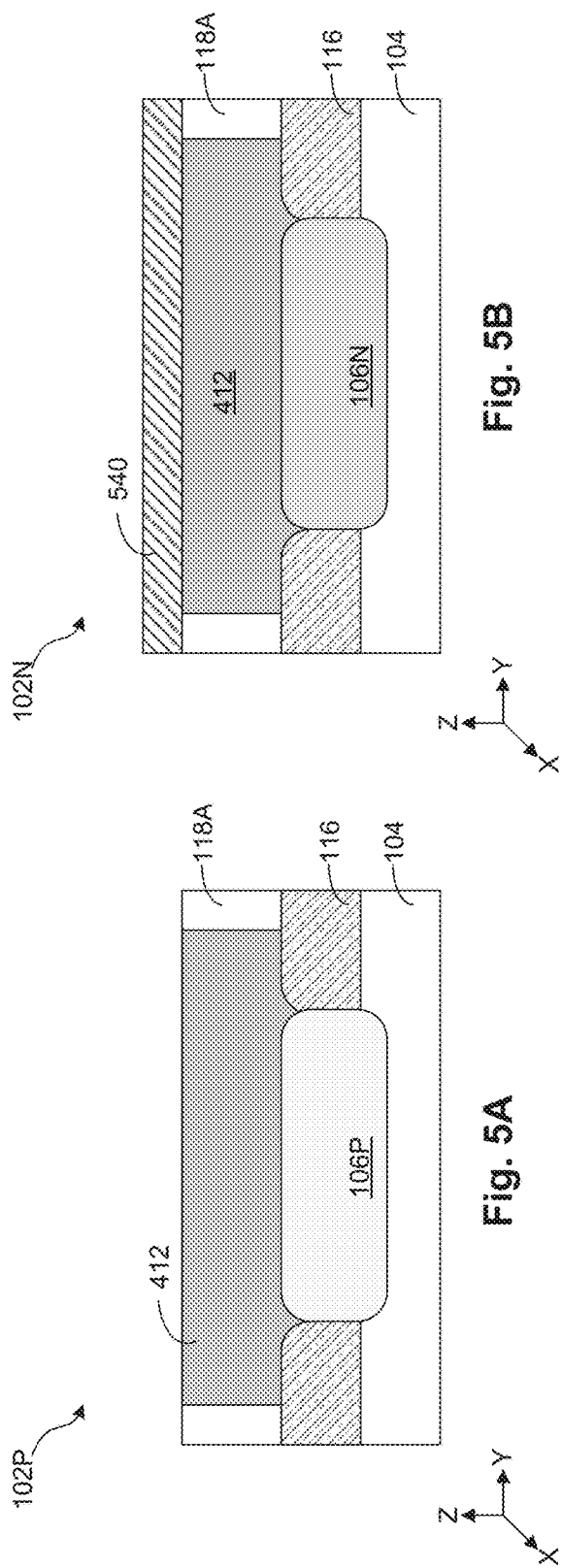

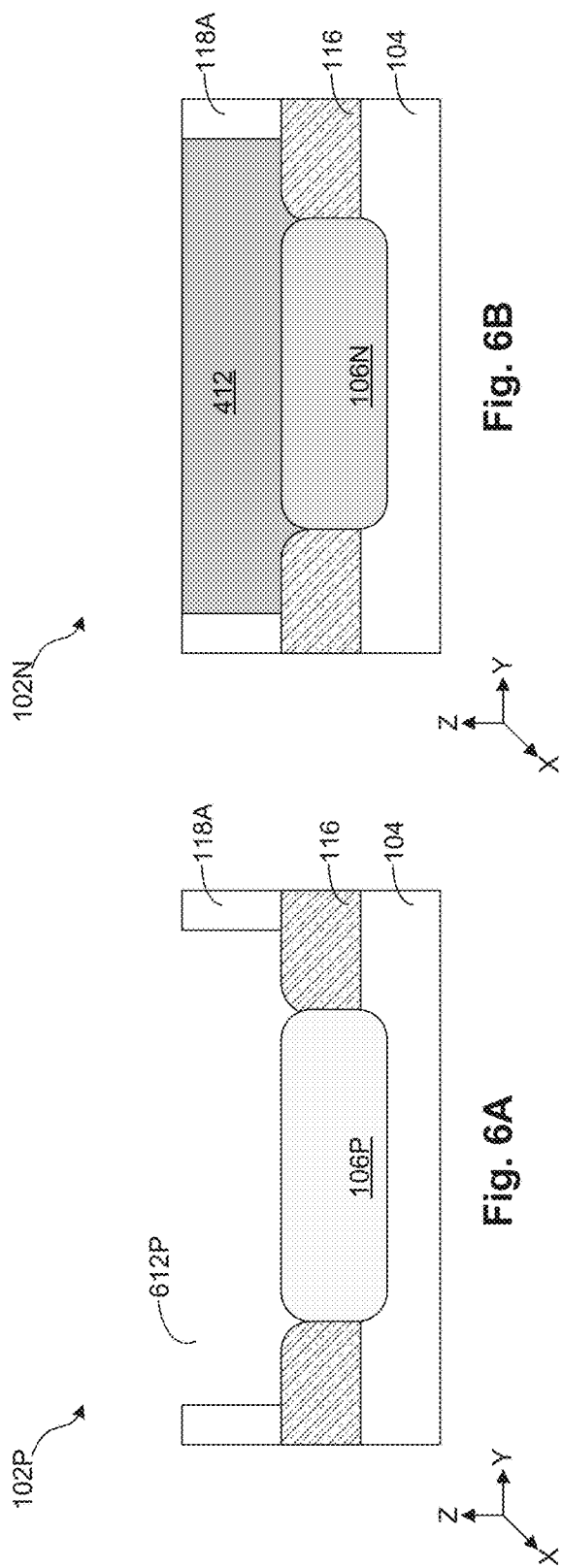

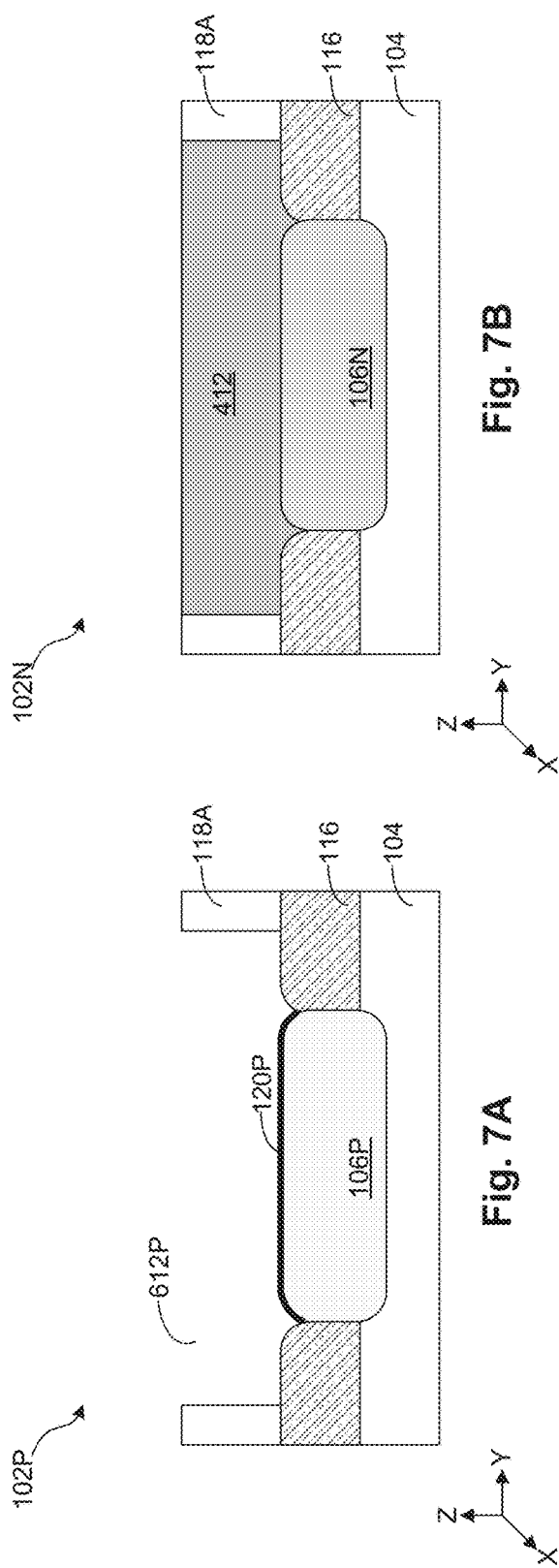

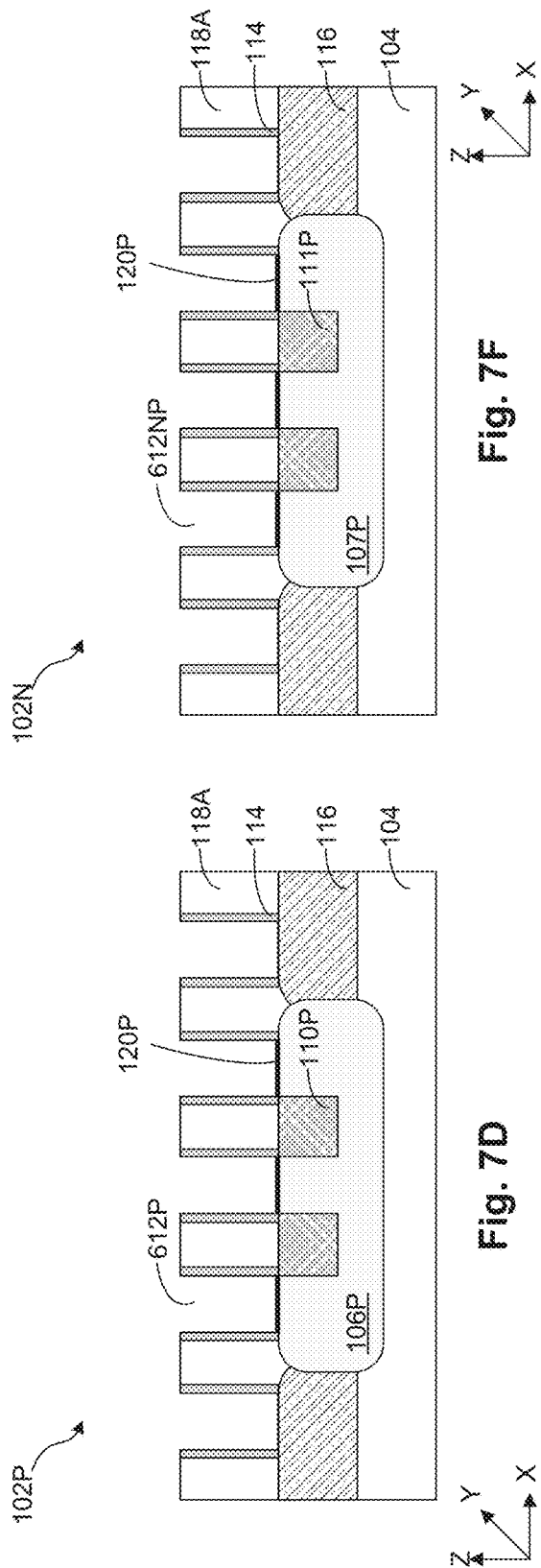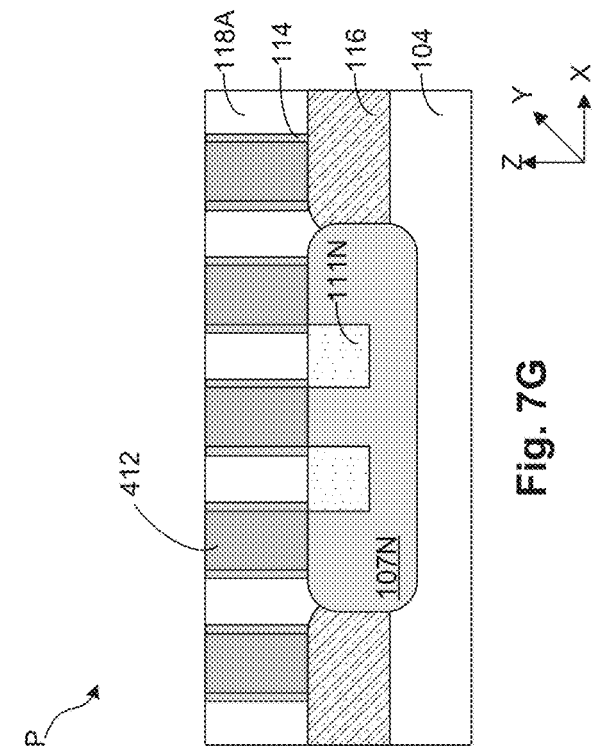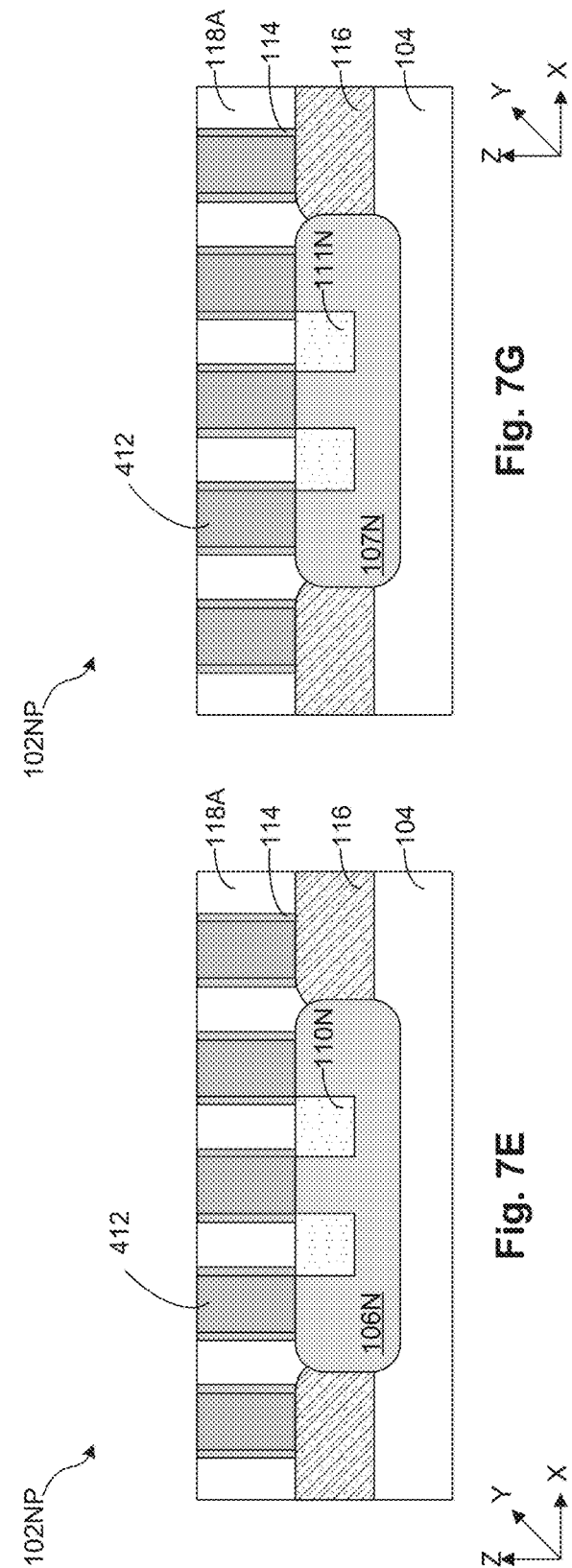

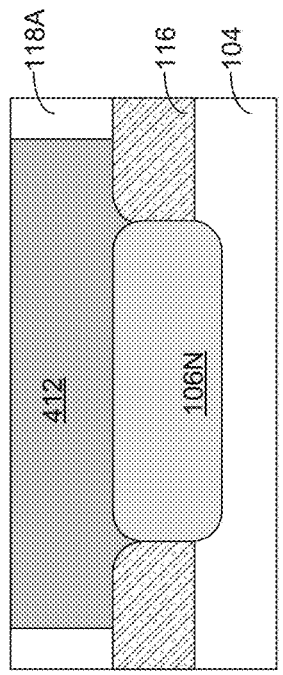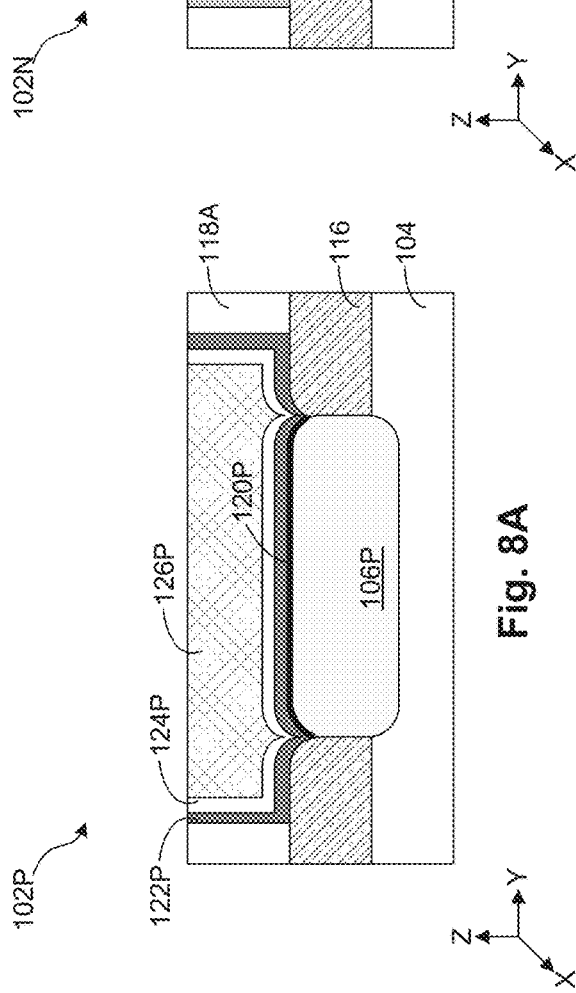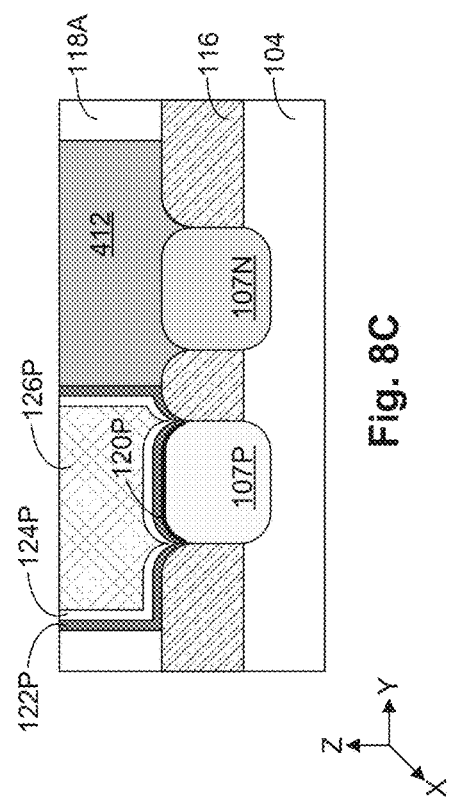

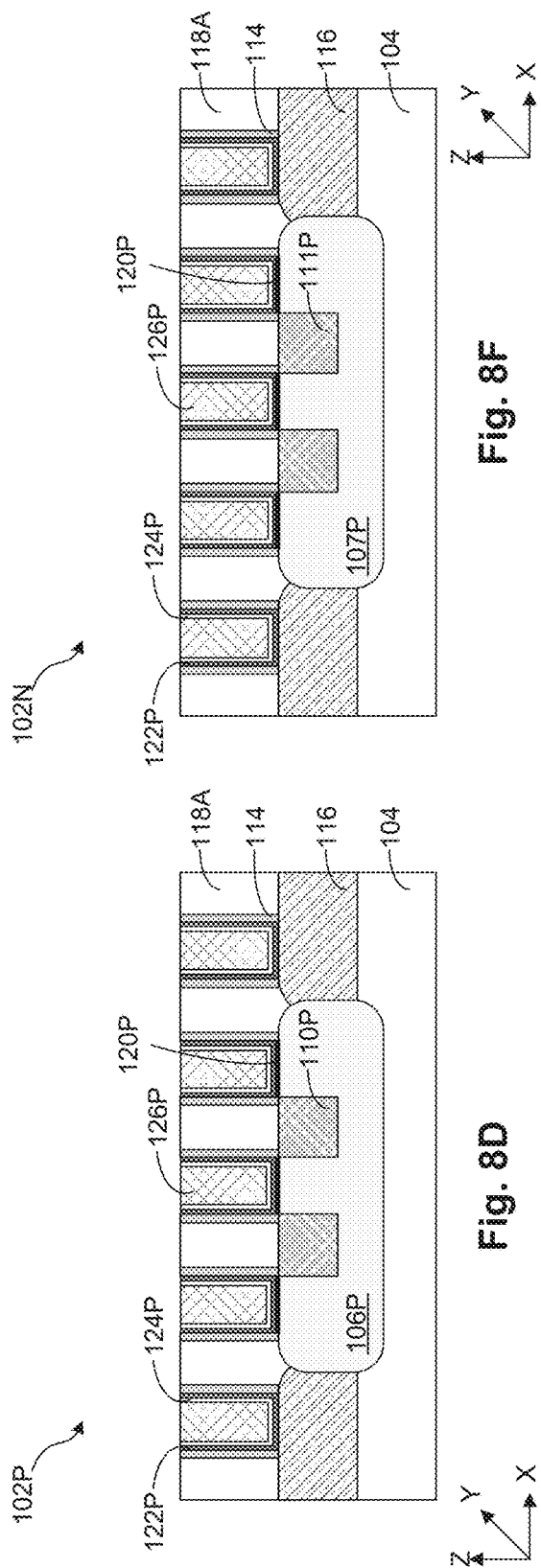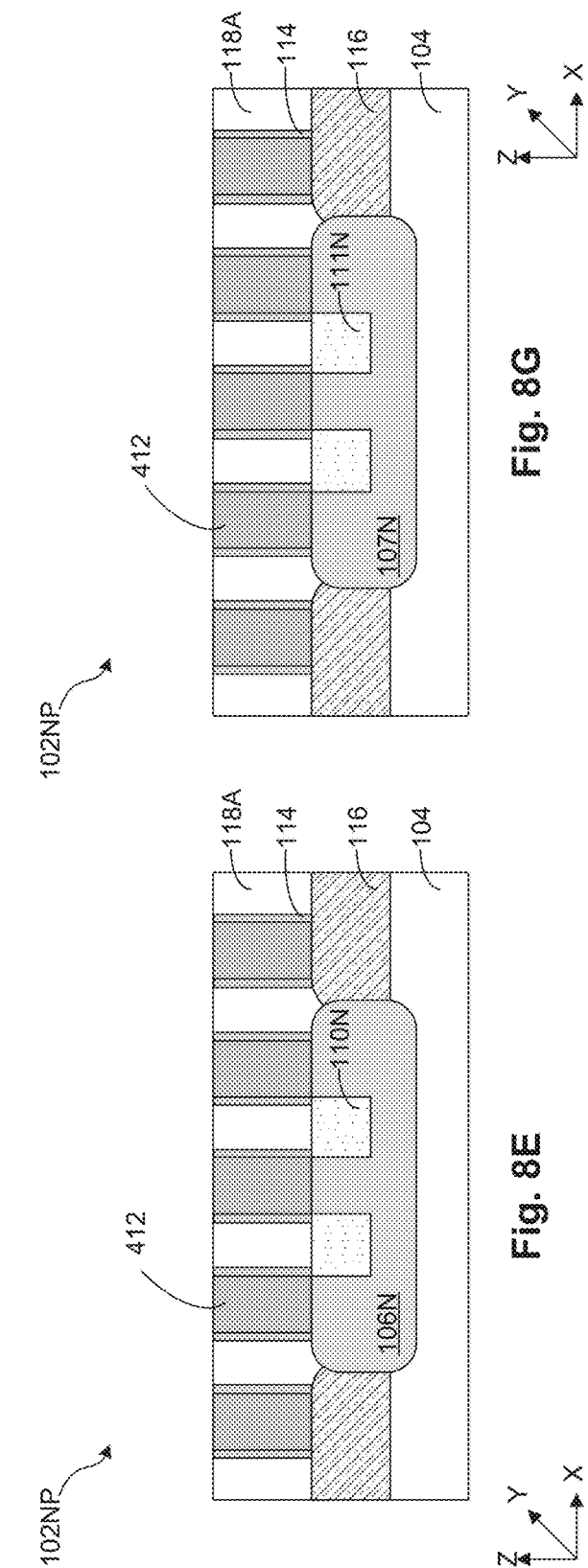

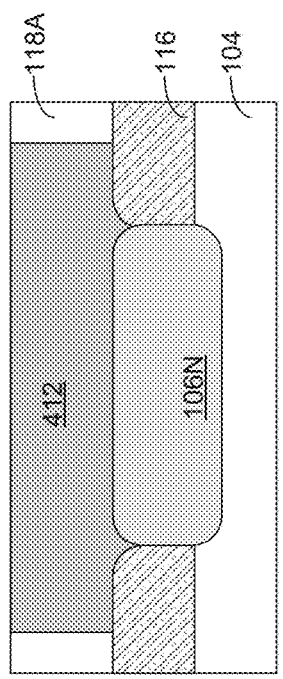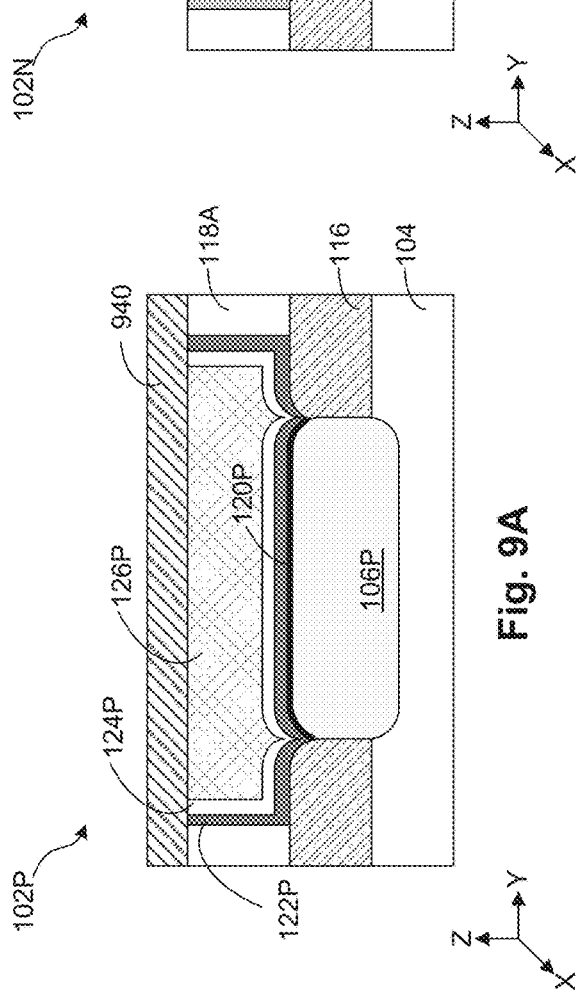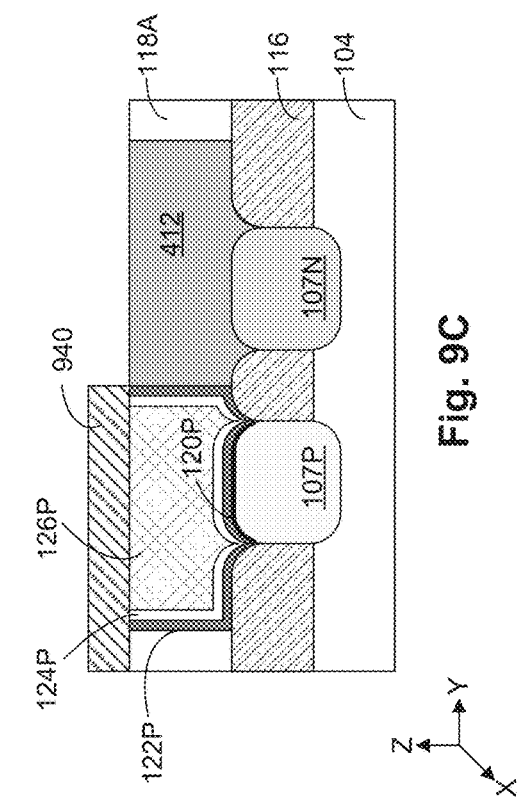
Fig. 9A
Fig. 9B
Fig. 9C

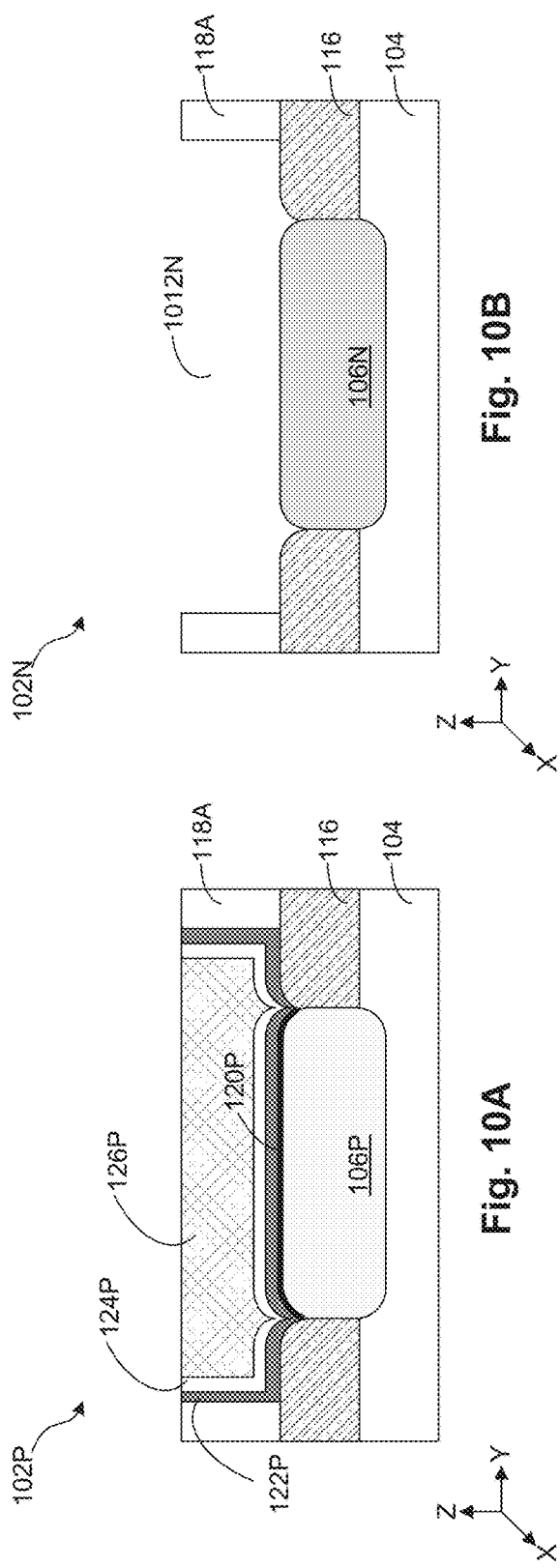

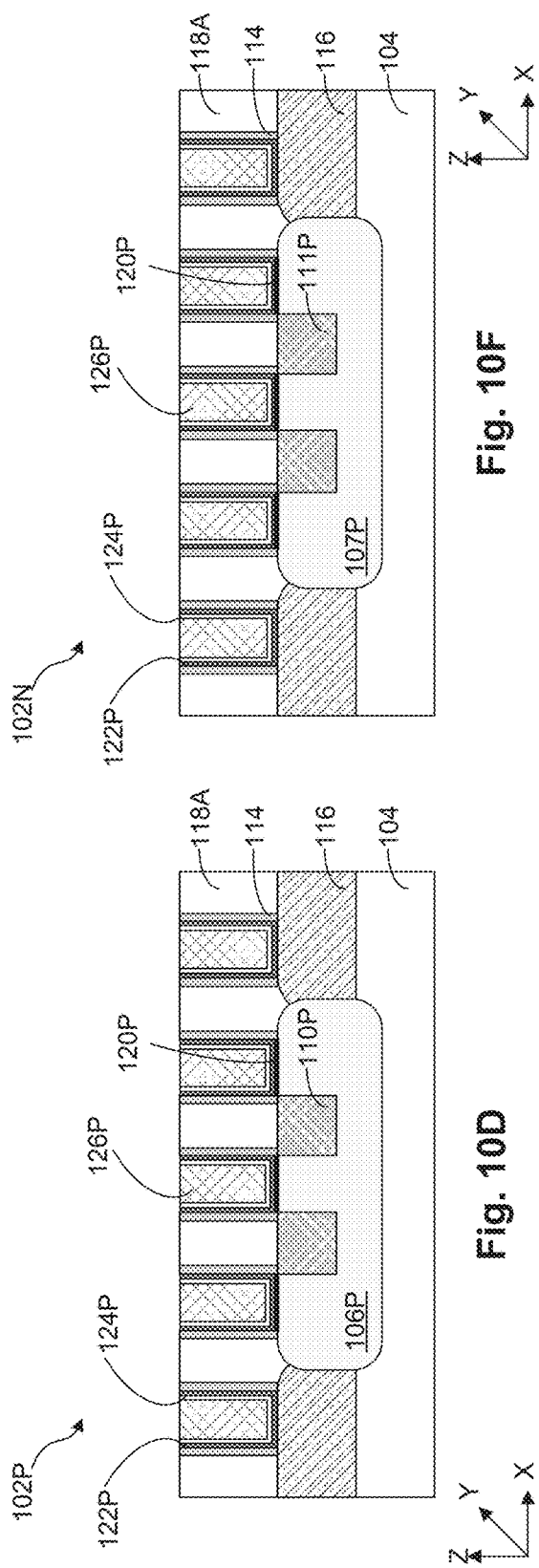
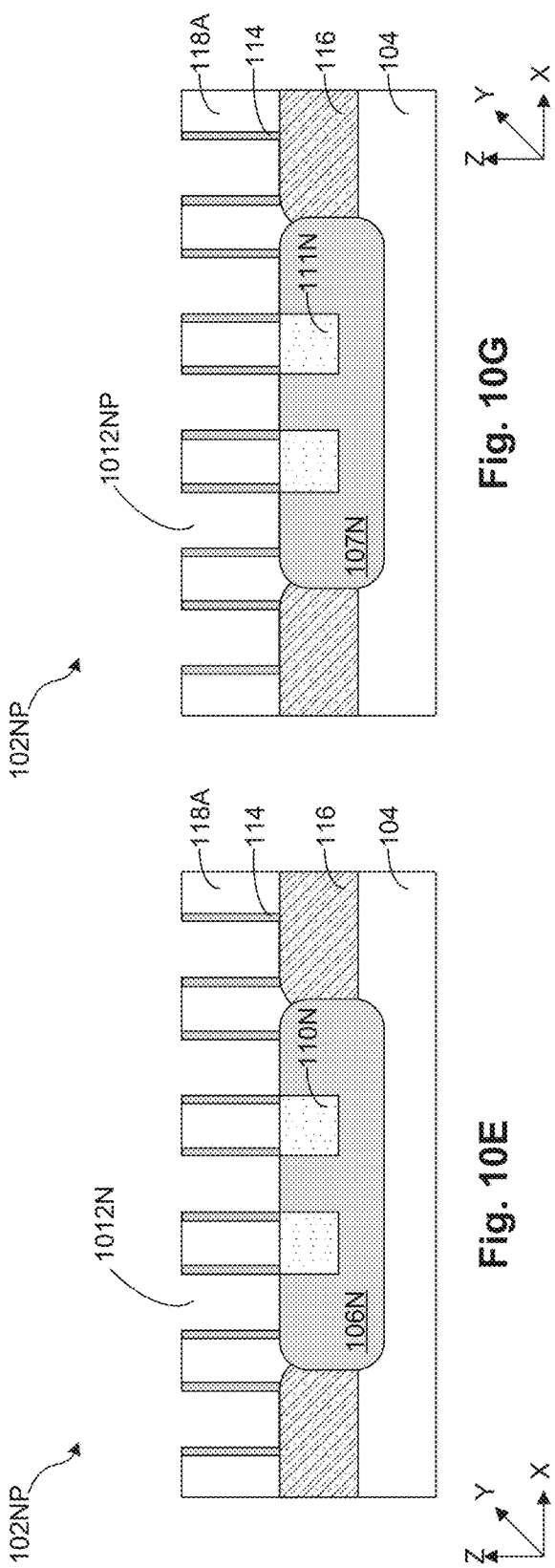

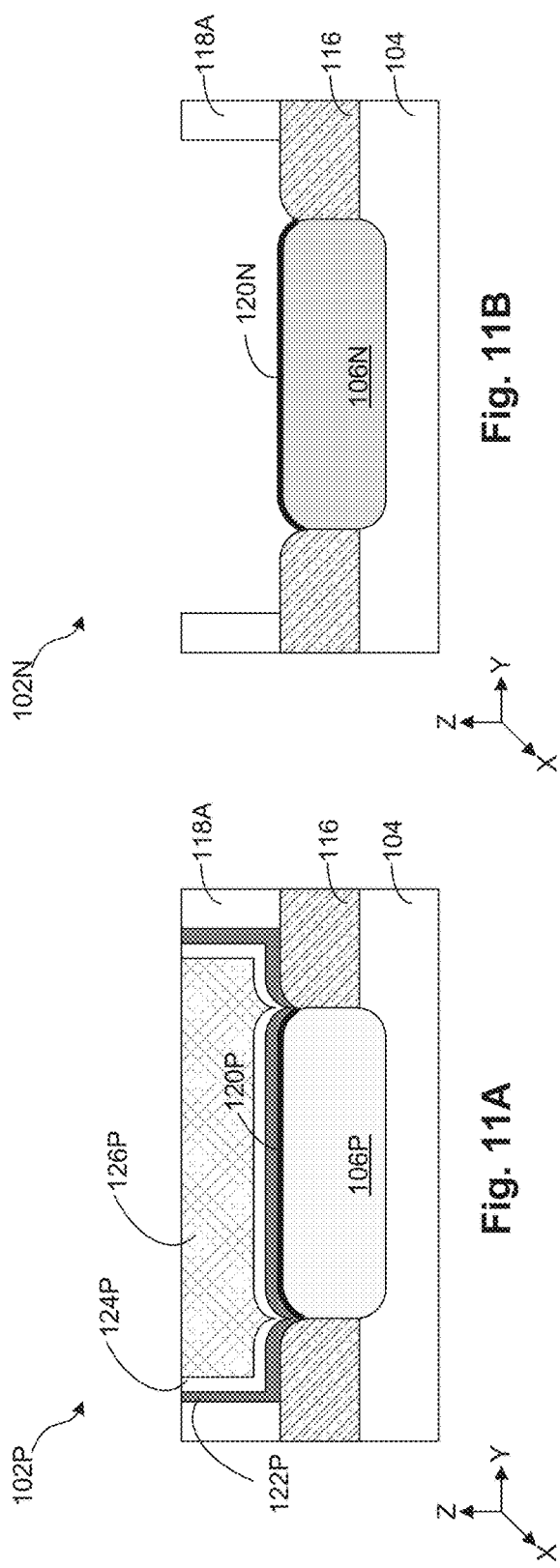

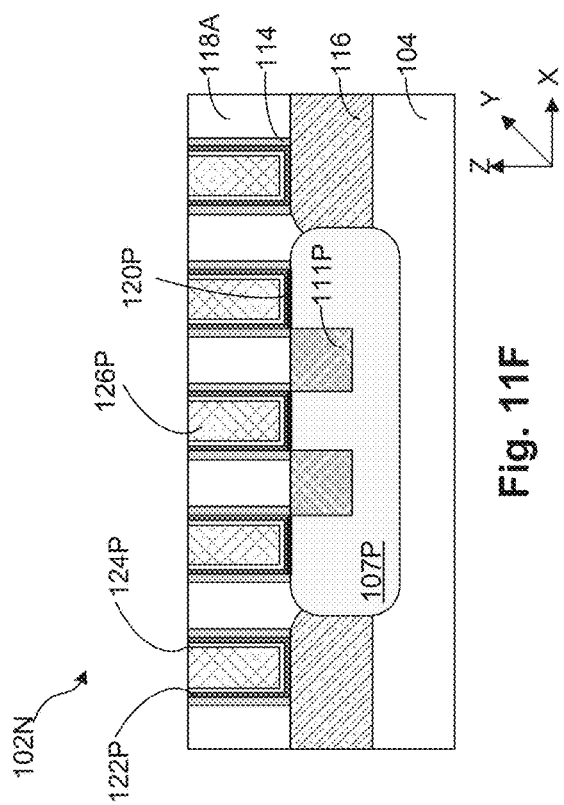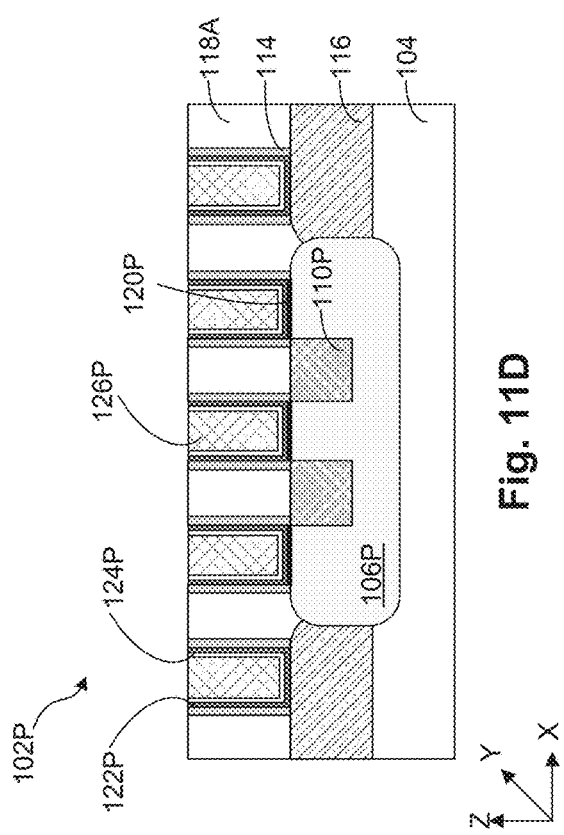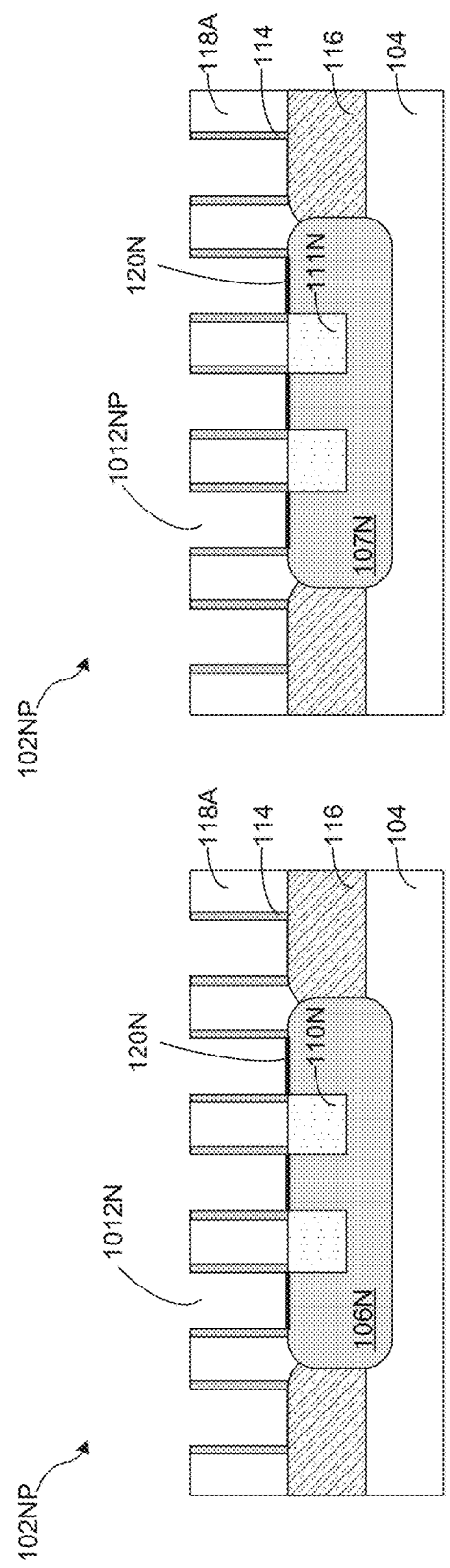
Fig. 11D  Fig. 11F  Fig. 11E  Fig. 11G

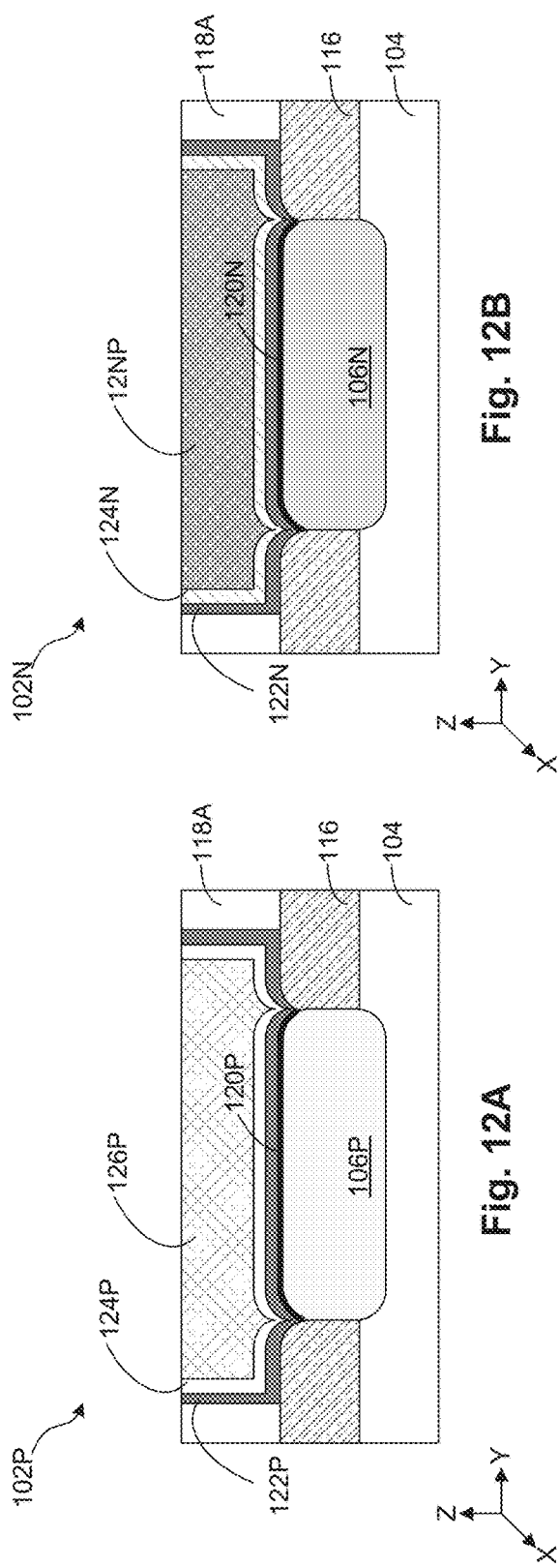

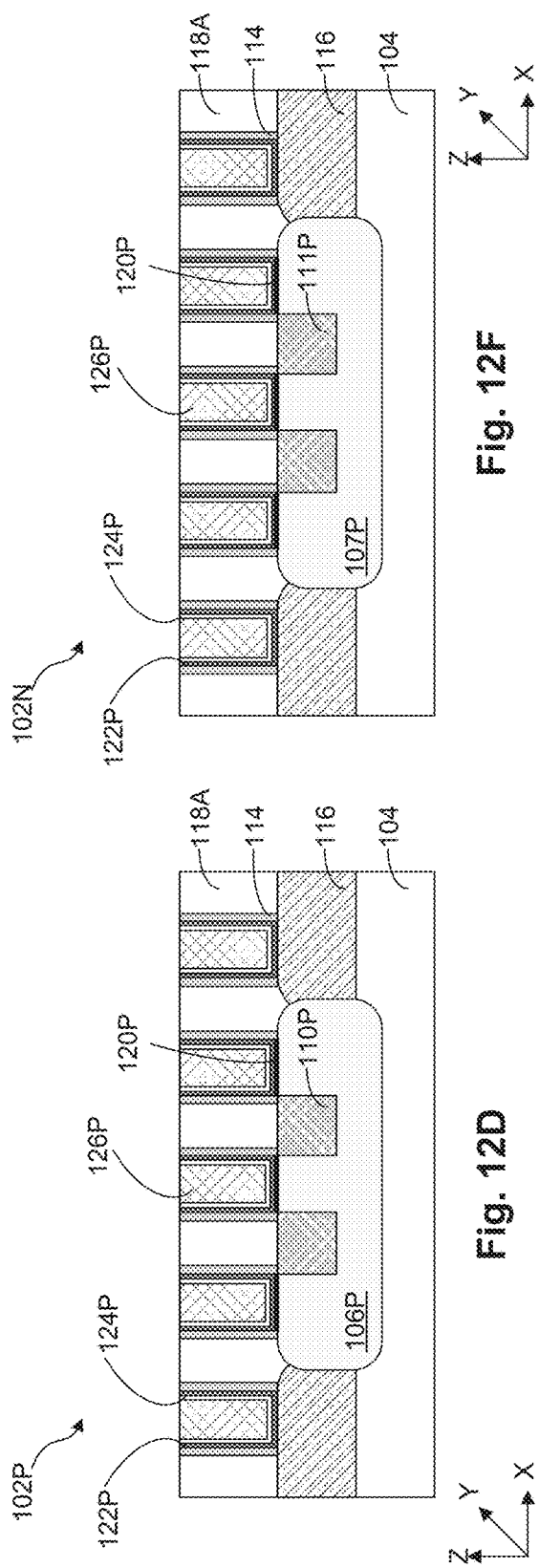
Fig. 12D
Fig. 12F
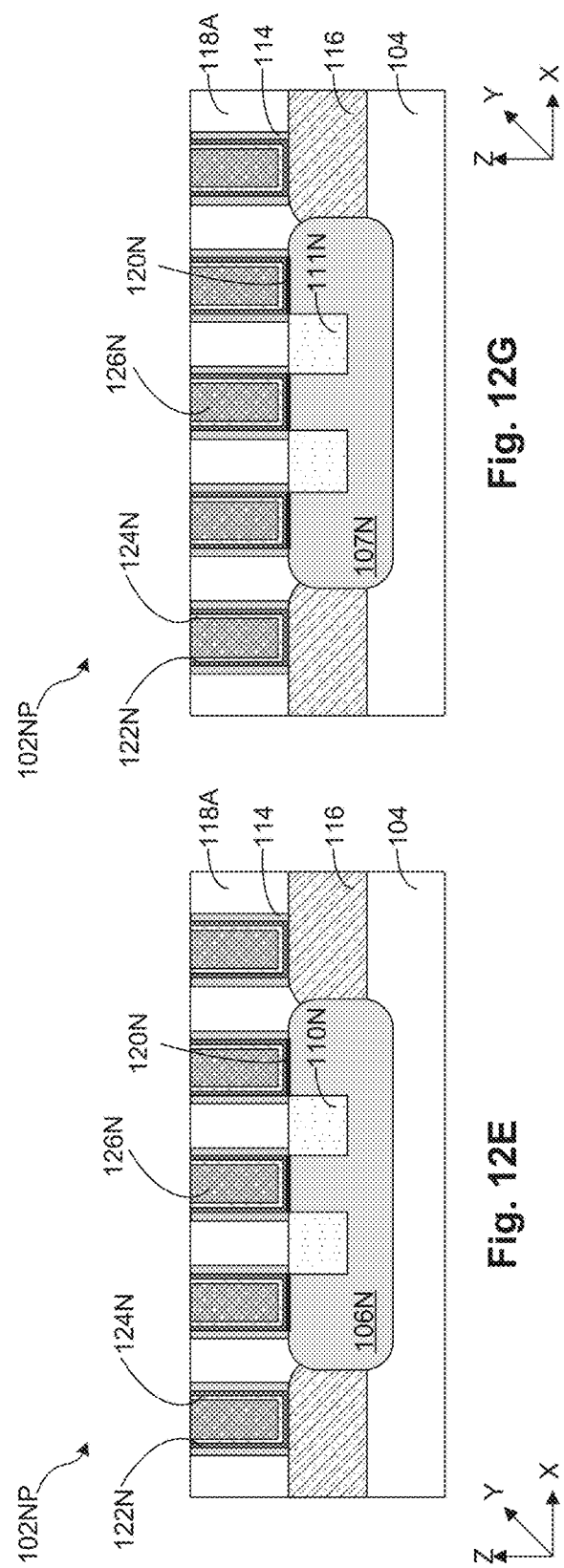
Fig. 12E
Fig. 12G

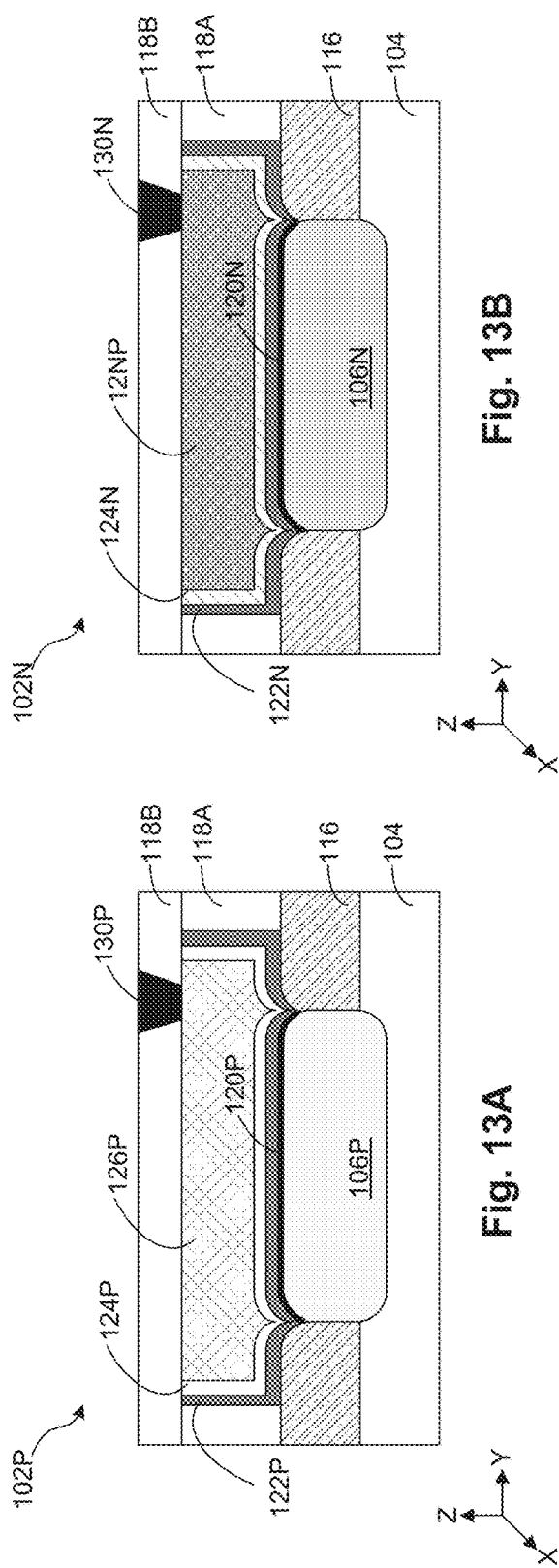

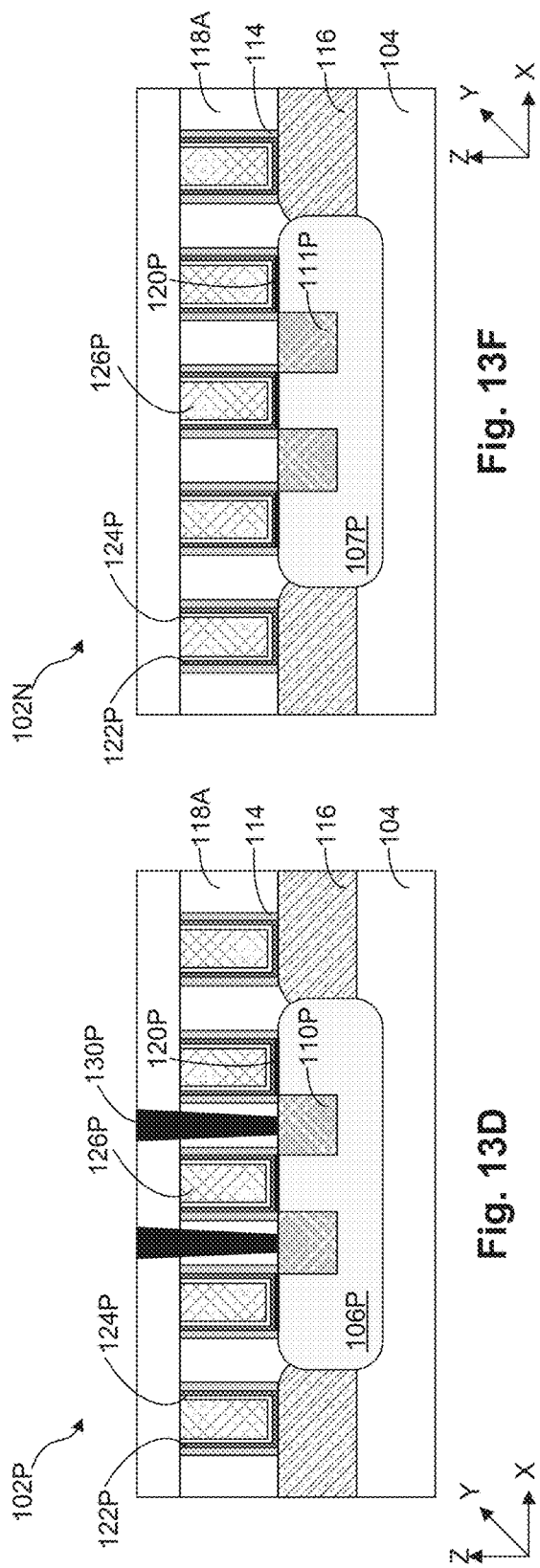
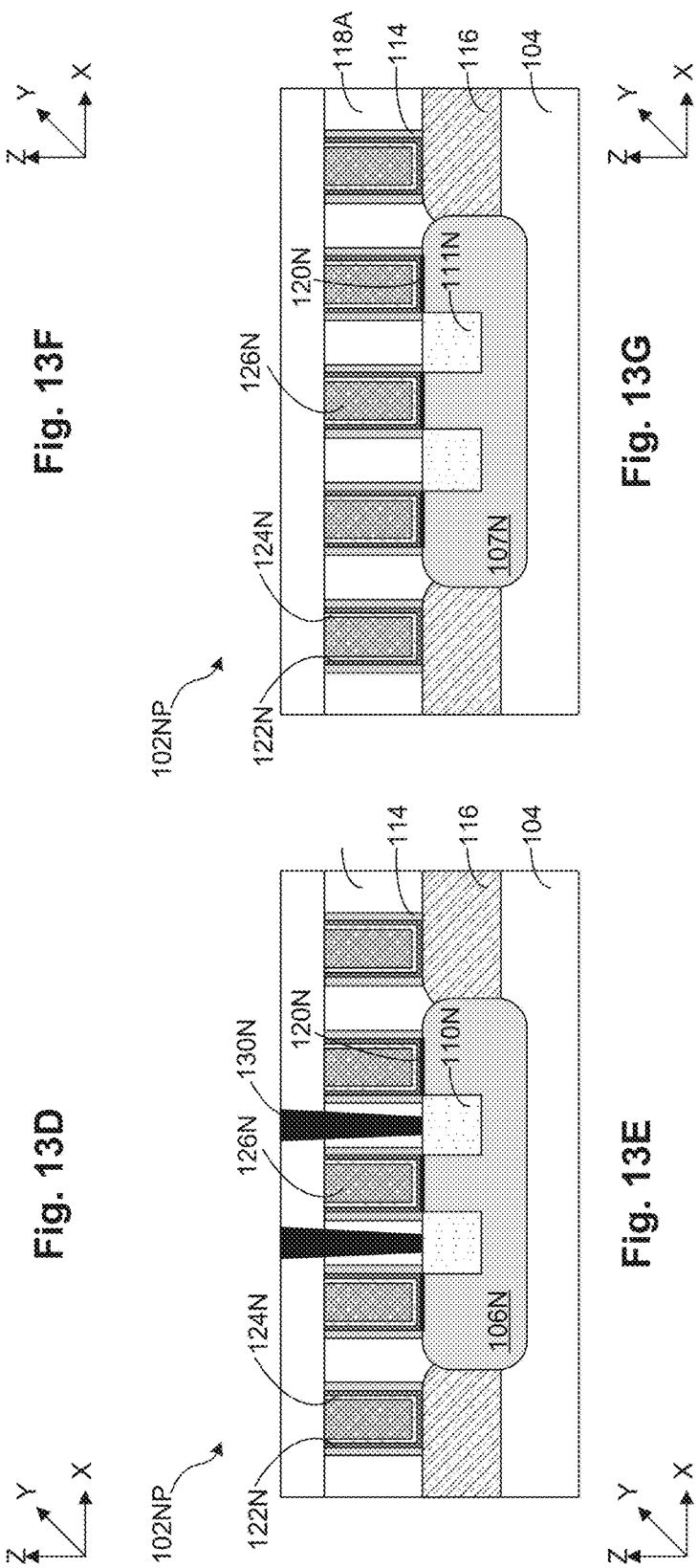
Fig. 13D
Fig. 13E
Fig. 13F
Fig. 13G

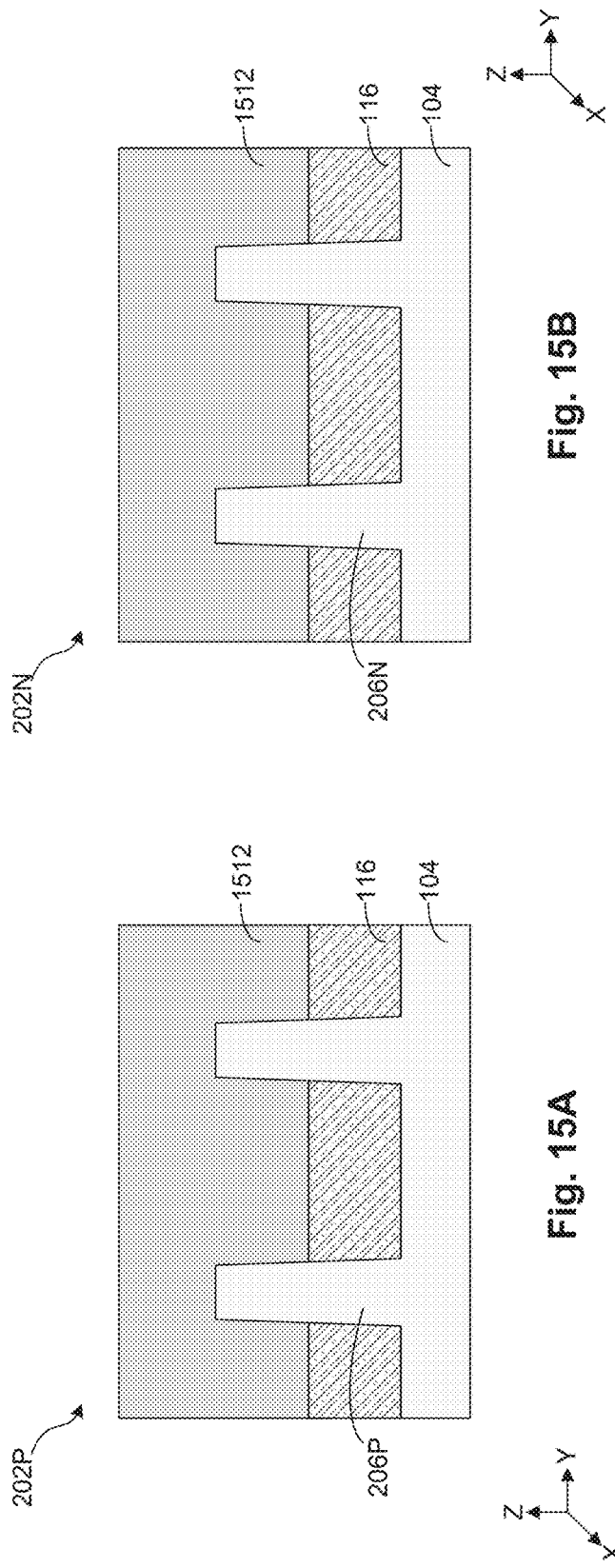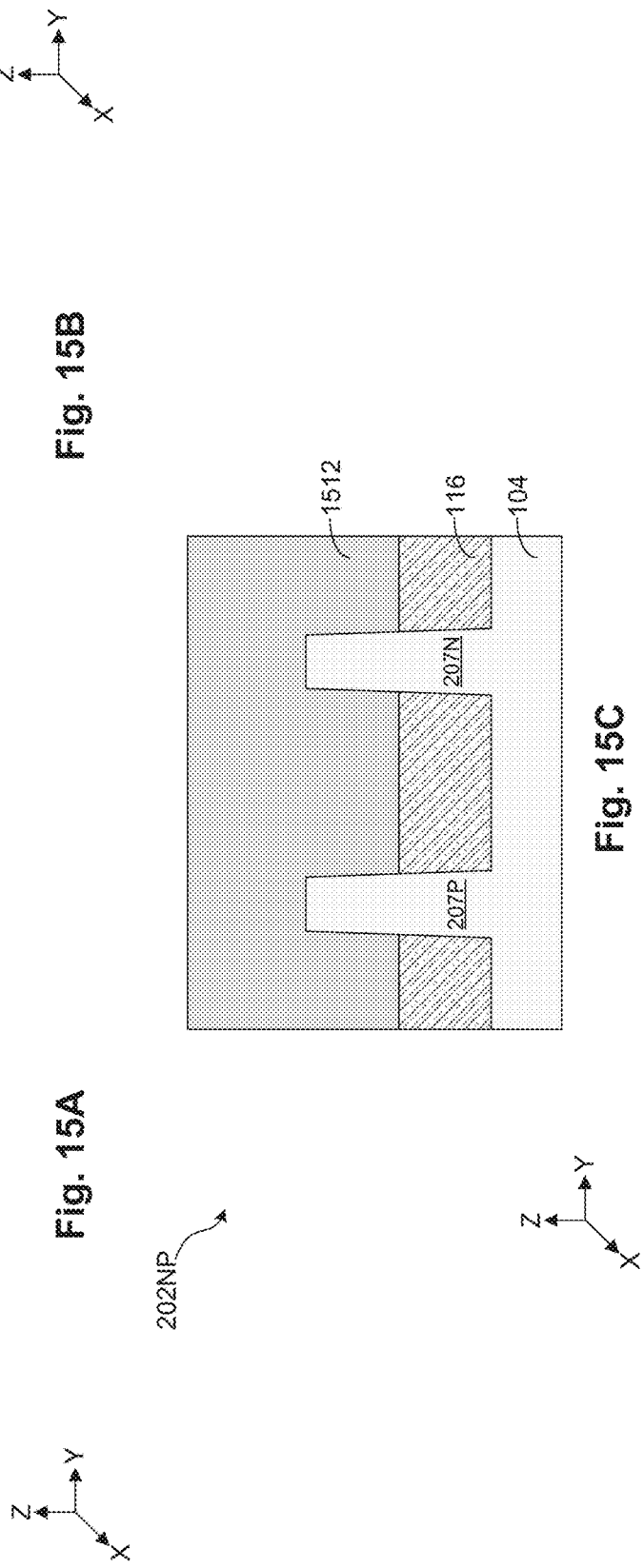

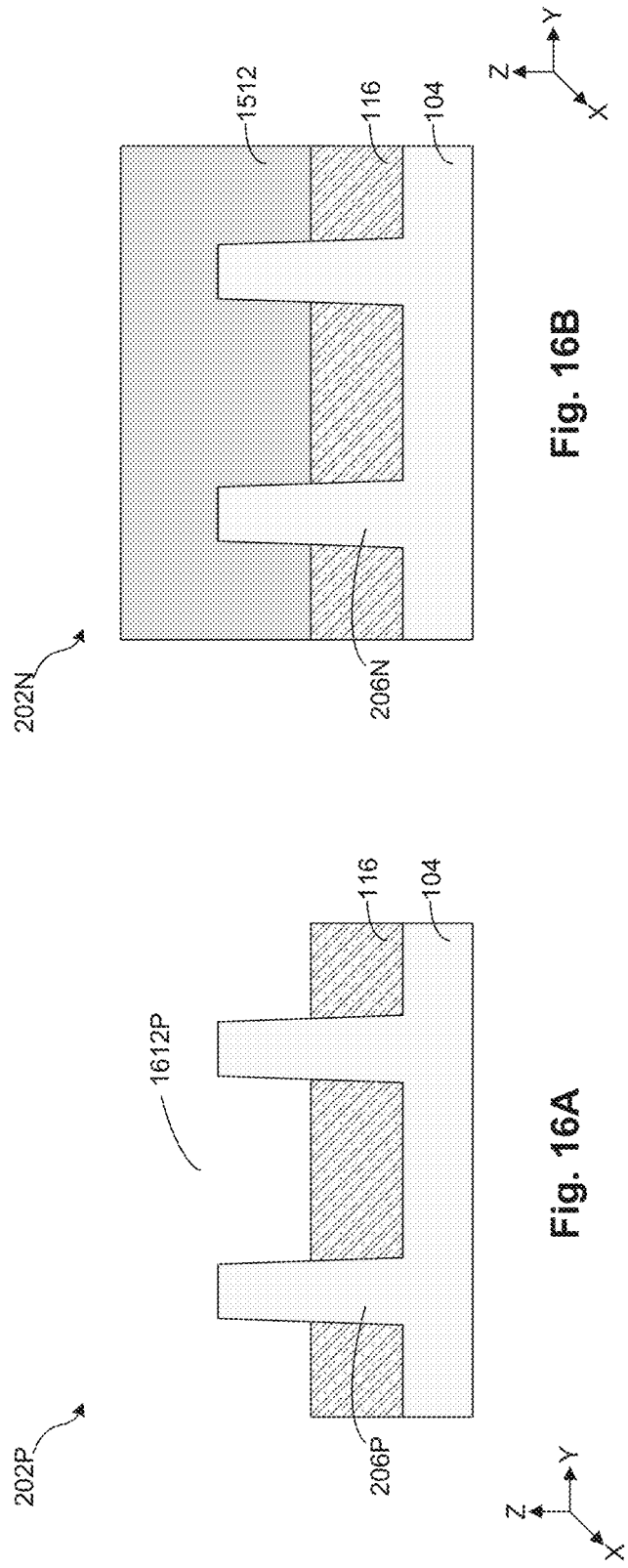

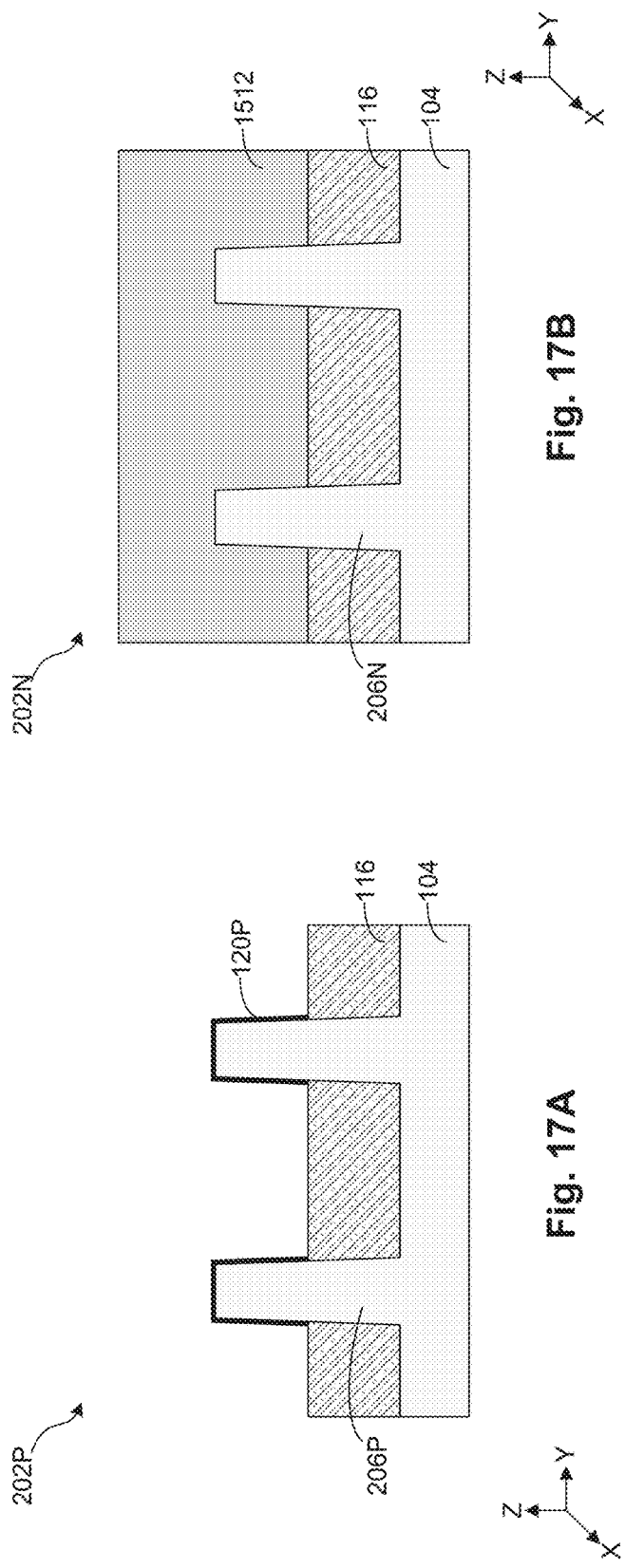

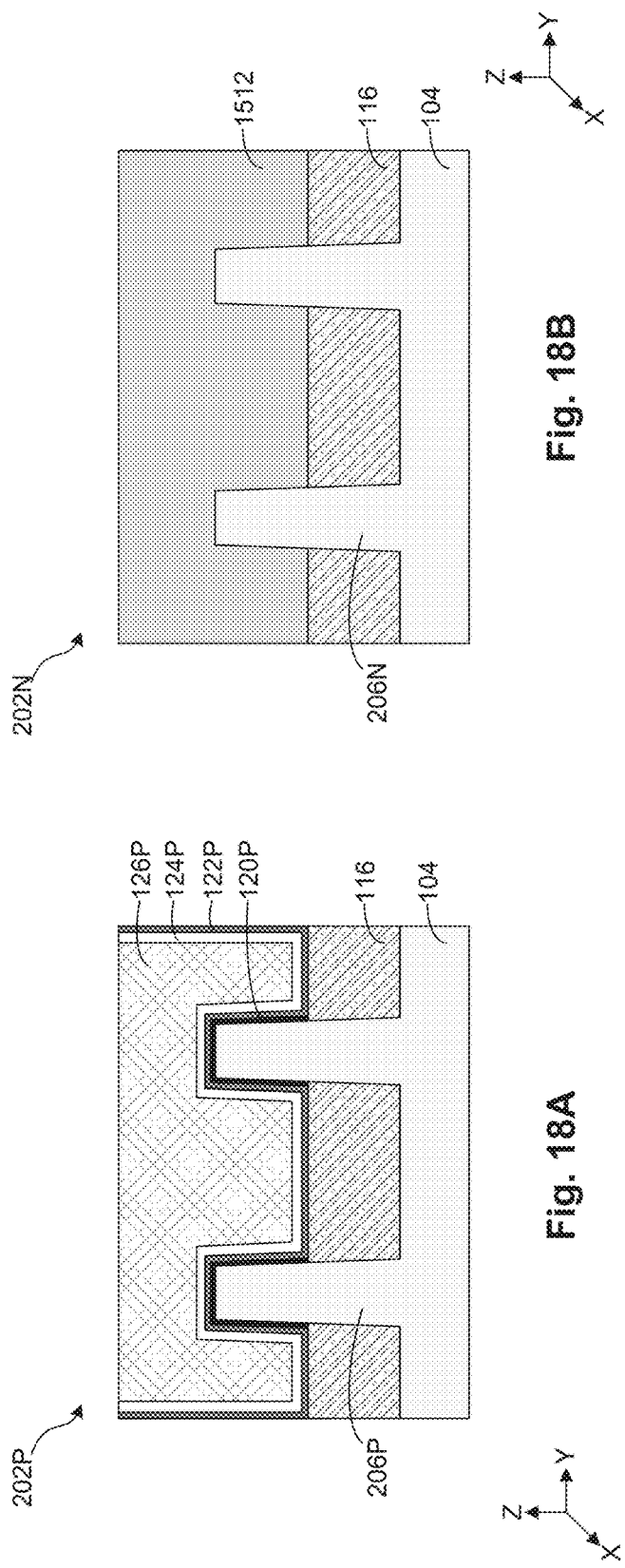

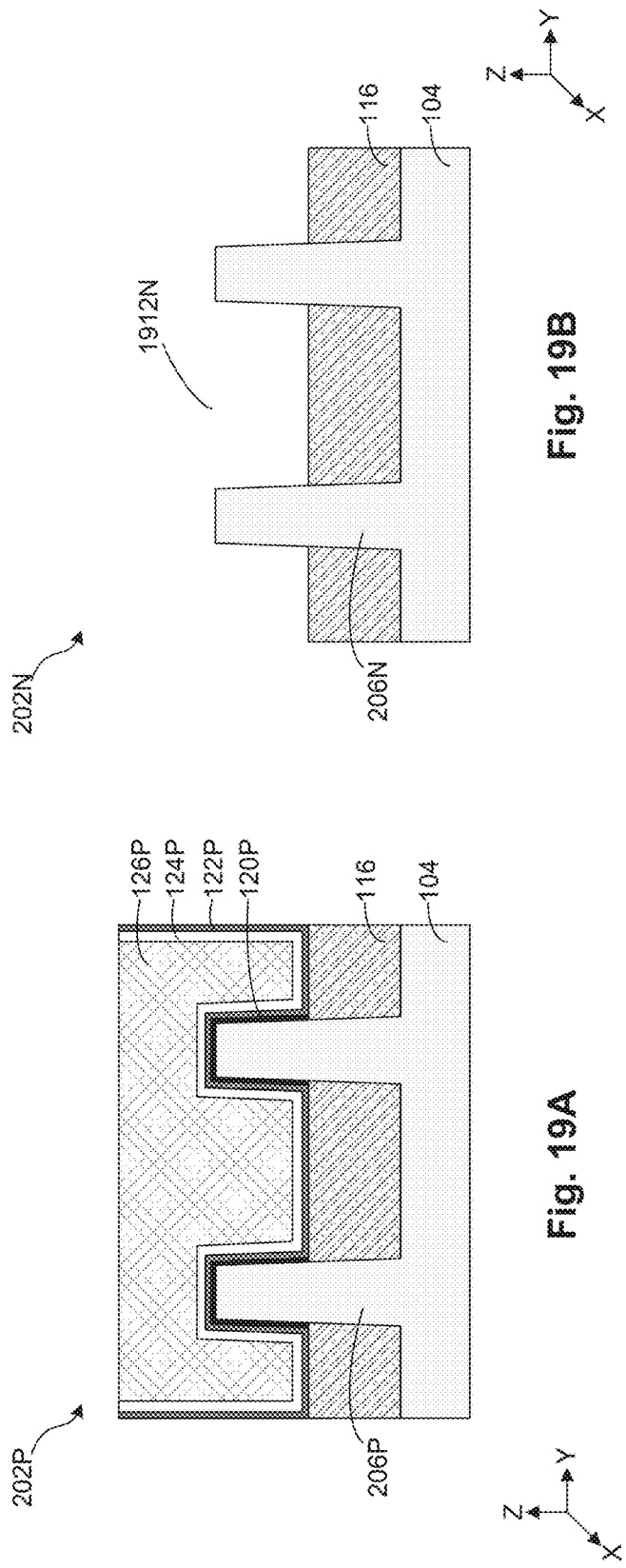
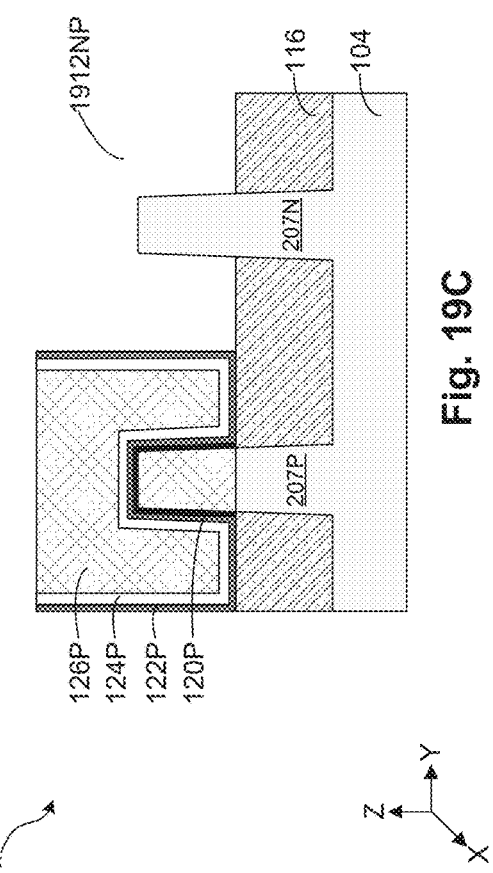

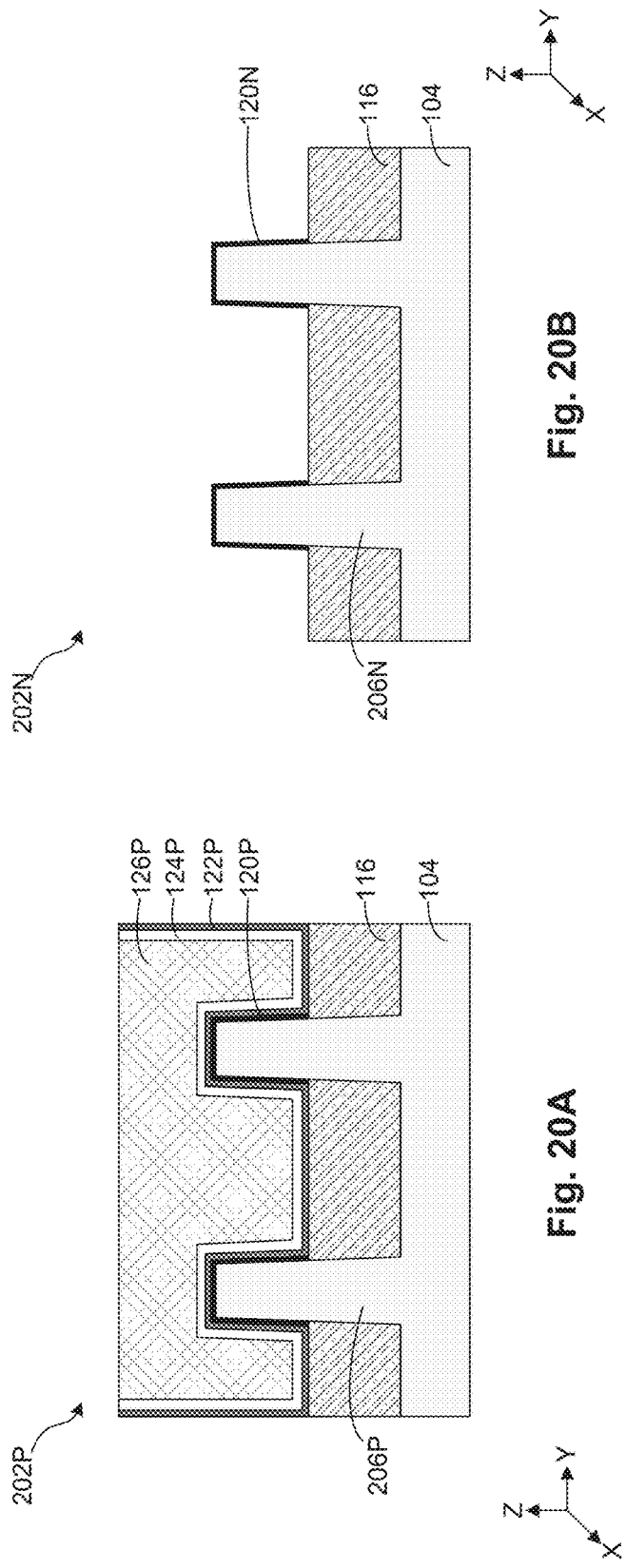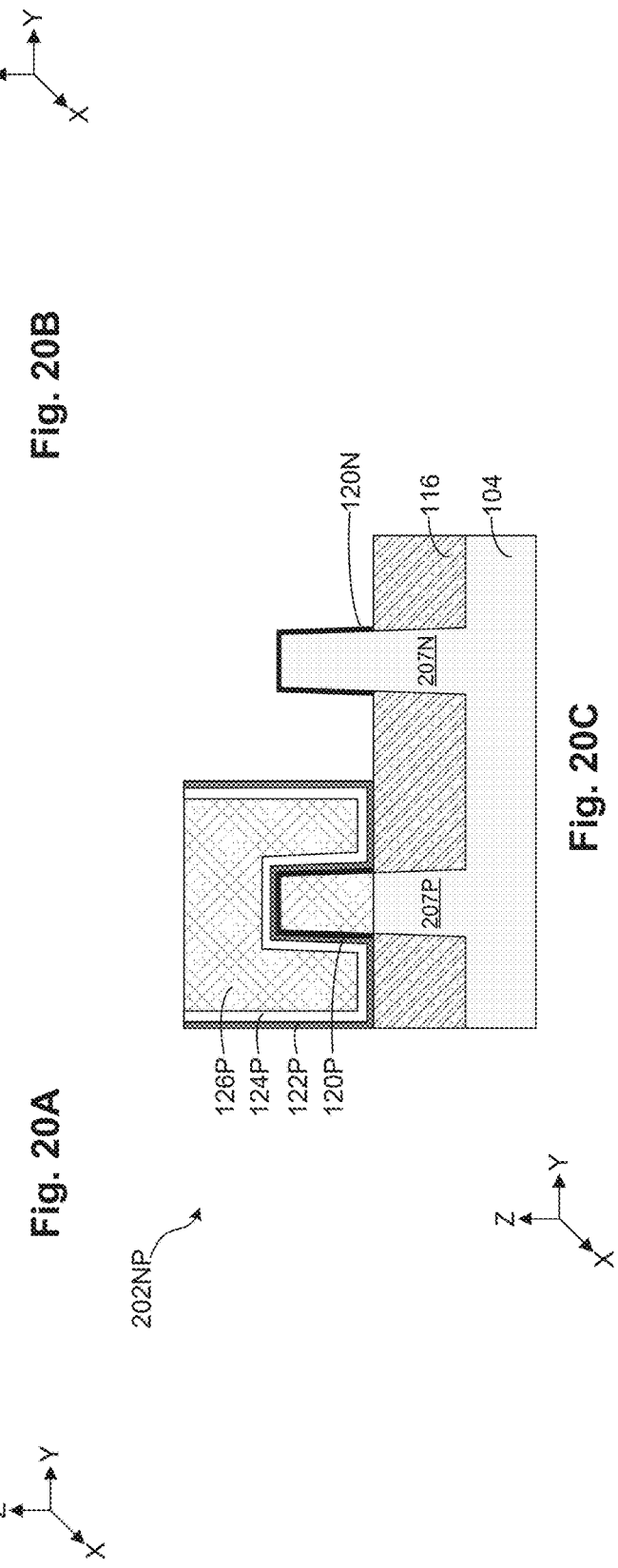

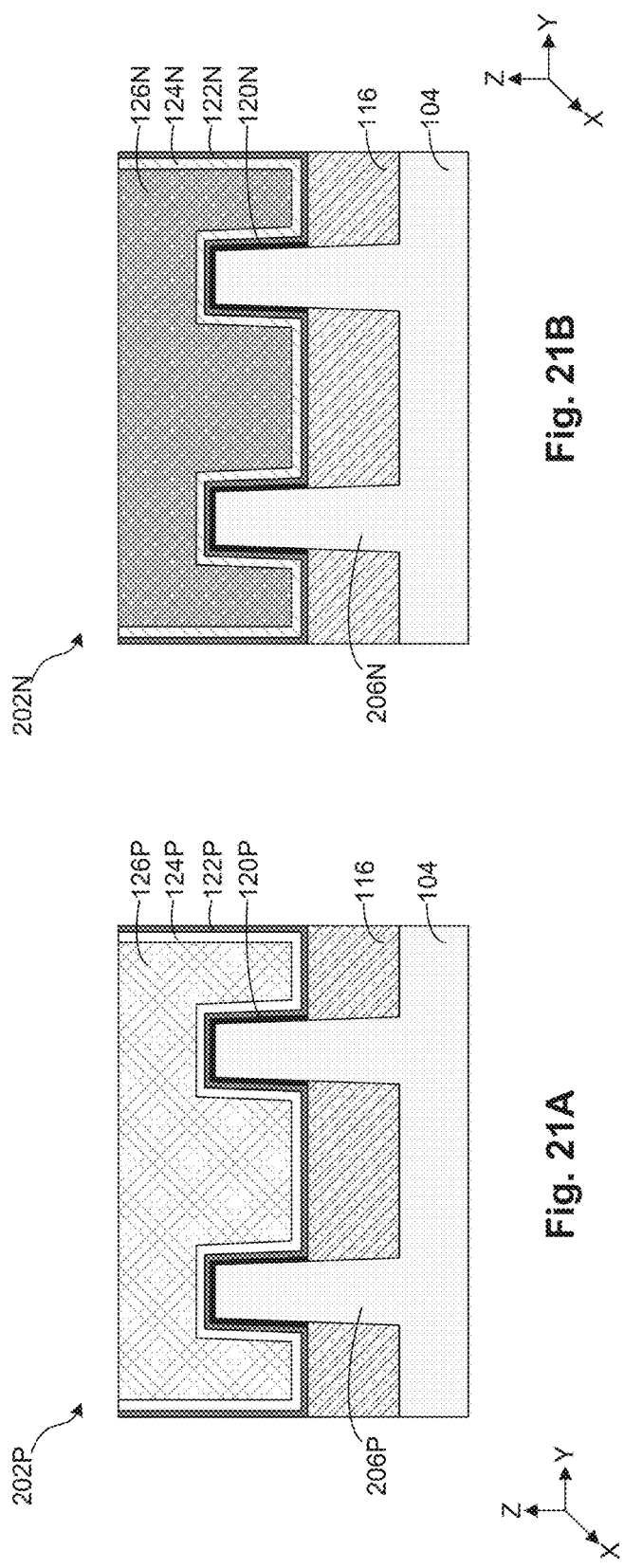

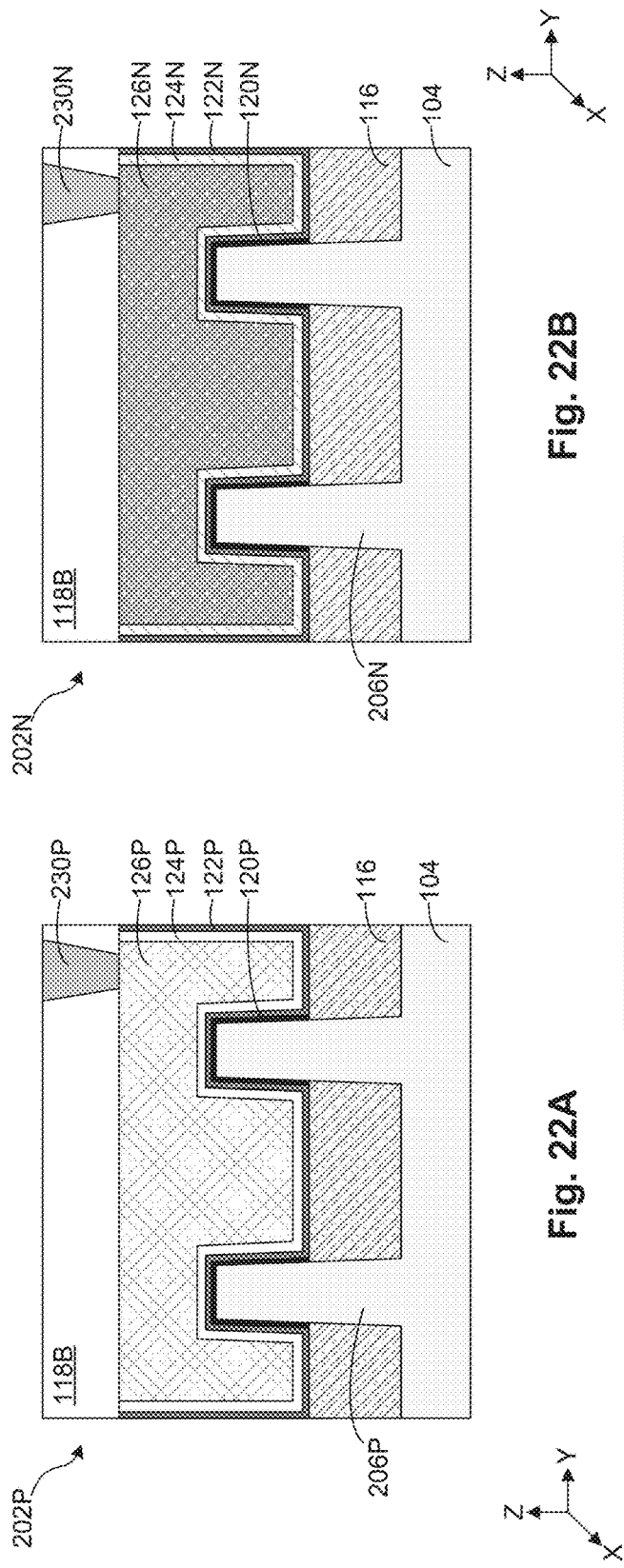

PROFILE CONTROL OF GATE STRUCTURES IN SEMICONDUCTOR DEVICES

CROSS-REFERENCE TO RELATED APPLICATIONS

This application claims the benefit of U.S. Provisional Patent Application No. 63/136,972, titled "Gate Layout for NMOS and PMOS and the Method for Forming the Same," filed Jan. 13, 2021, the disclosure of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

FIGS. 1A-1J illustrate top-down and cross-sectional views of active and dummy cells of an integrated circuit, in accordance with some embodiments.

FIGS. 1K-1O illustrate top-down and cross-sectional views of active and dummy cell arrays of an integrated circuit, in accordance with some embodiments.

FIGS. 2A-2J illustrate top-down and cross-sectional views of active and dummy cells of an integrated circuit, in accordance with some embodiments.

FIGS. 2K-2M illustrate isometric views of active and dummy cells of an integrated circuit, in accordance with some embodiments.

FIGS. 4A-13G illustrate cross-sectional views of active and dummy cells of an integrated circuit at various stages of their fabrication process, in accordance with some embodiments.

FIGS. 15A-22C illustrate cross-sectional views of active and dummy cells of another integrated circuit at various stages of their fabrication process, in accordance with some embodiments.

Figure 1K:
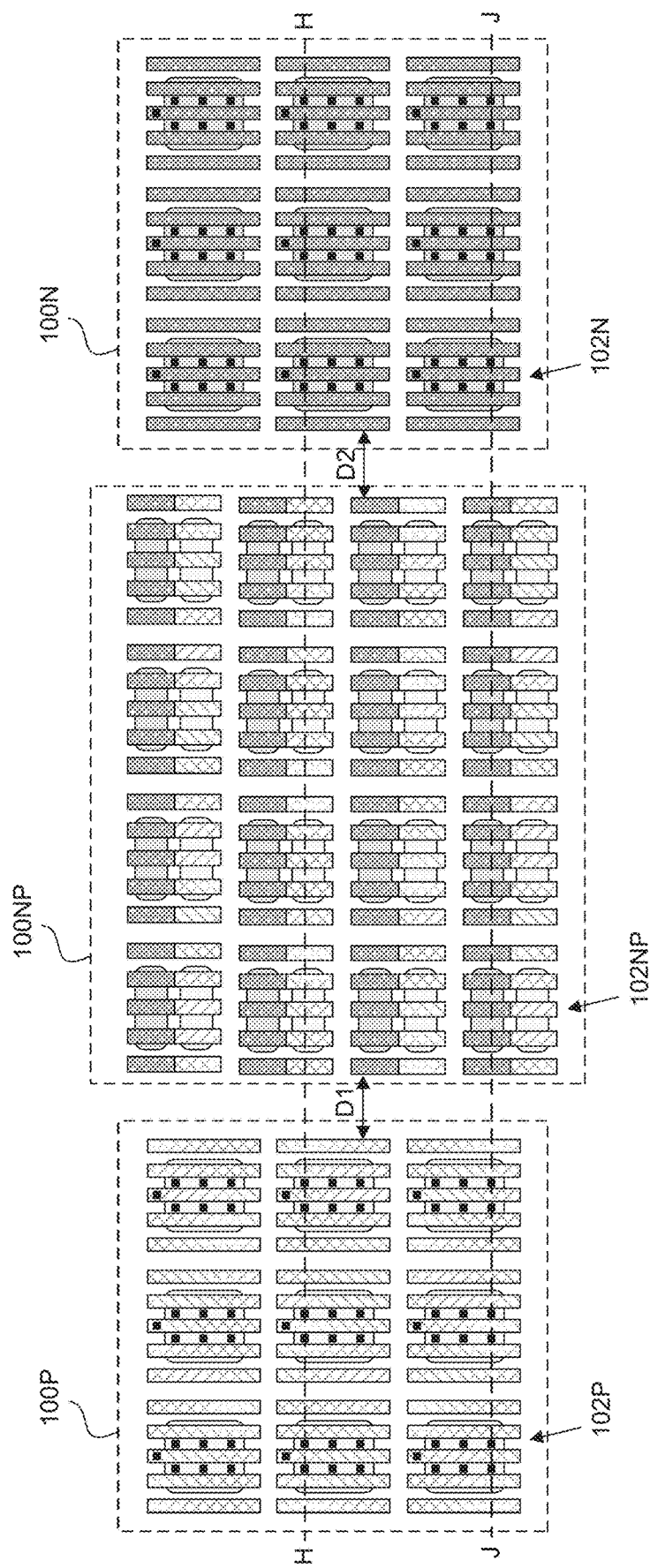

Illustrative embodiments will now be described with reference to the accompanying drawings. In the drawings, like reference numerals generally indicate identical, functionally similar, and/or structurally similar elements. The discussion of elements with the same annotations applies to each other, unless mentioned otherwise.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example integrated circuits (ICs) with active and dummy device cell arrays in respective active and dummy device areas, and example methods of fabricating the same. The example IC can include n- and/or p-type active device cell arrays. The n-type active device cell arrays can include arrays of active n-type cells (N-cells). Each of the active N-cells can include one or more electrically active n-type FETs (NFETs; e.g., NMOS-FETs, N-finFETs, or gate-all-around (GAA) NFETs) and/or n-type structures, such as n-type source/drain (S/D) regions and n-type metal gate (NMG) structures with n-type gate metal fill (e.g., n-type work function metal (nWFM)).

The p-type active device cell arrays can include arrays of active p-type cells (P-cells). Each of the active P-cells can include one or more electrically active p-type FETs (PFETs; e.g., PMOSFETs, P-finFETs, or gate-all-around (GAA) PFETs) and/or p-type structures, such as p-type S/D regions and p-type metal gate (PMG) structures with p-type gate metal fill (e.g., p-type WFM (nWFM)). The active N-cells and P-cells can further include contact structures disposed on one or more S/D regions and gate structures. The contact structures can electrically couple the one or more S/D regions and gate structures to power supplies.

The term "N-cell" (also referred to as "N-device cell") is used herein to refer to a cell that includes NFET(s) and/or NMG structure(s) and does not include PFET(s) and/or PMG structure(s). The term "P-cell" (also referred to as "P-device cell") is used herein to refer to a cell that includes PFET(s) and/or PMG structure(s) and does not include NFET(s) and/or NMG structure(s). The term "NP-cell" (also referred to as "NP-device cell") is used herein to refer to a cell that includes both NFET and PFET and/or both NMG and PMG structures.

The dummy device cell arrays can be disposed adjacent to or surrounding the active device cell arrays and can include electrically inactive ("dummy") N-cells and P-cells, and/or NP-cells. Unlike the active N-cells and P-cells, the dummy N-cells, P-cells, and NP-cells do not include contact structures and/or contact landing pads or regions on the S/D regions and/or gate structures. In some embodiments, the dummy N-cells and P-cells can have gate structures similar to that of the respective active N-cells and P-cells.

The dummy device cell arrays can be formed and arranged in a manner to achieve a substantially uniform surface profile across the gate structures in both types of active device cell arrays. A non-uniform surface profile across the gate structures can result in a gate height mismatch between the gate structures in the active device cell arrays, and consequently degrade the IC performance. To achieve the substantially uniform surface profile in both types of active device cell arrays, each dummy device cell array can be formed with a gate surface area ratio of about 1:1 between the total top surface area of the dummy NMG structures and the total top surface area of the dummy PMG structures in the dummy device cell array. Such balanced gate surface area ratio between the dummy NMG and PMG structures can prevent or minimize the "dishing" caused by the chemical mechanical polishing (CMP) processes during the formation of the active NMG and PMG structures in the active device cell arrays. The dishing effect can be due to the different polishing rates between the gate structures in the dummy and active device cell arrays when the dummy device cell arrays have one type of gate structures, such as polysilicon gate structures, NMG structures, and PMG structures. The polishing rates can be different for the different materials of polysilicon gate structures, NMG structures, and PMG structures. Thus, a balanced distribution of the two types of gate structures in the dummy device cell arrays provide matching polishing rates for each type of gate structures in the active device cell arrays, and consequently prevent or minimize the CMP process-related dishing effects.

In some embodiments, each of the dummy device cell arrays can be formed with an equal number of dummy N-cells and P-cells to achieve the balanced gate surface area ratio. In some embodiments, the dummy N-cells and P-cells can be arranged in an array configuration or in an alternating configuration with respect to each other. The dummy N-cells can have dummy NMG structures that are equal in number to the dummy PMG structures of the dummy P-cells. In some embodiments, the dummy NMG and PMG structures can have gate dimensions (e.g., gate length, gate width, and gate height) that are substantially equal to each other. In some embodiments, the dummy NMG structures can have a total top surface area that is substantially equal to the total top surface area of the dummy PMG structures. In some embodiments, each of the dummy device cell arrays can be formed with arrays of NP-cells having an equal number of dummy NFETs and PFETs and/or an equal number of dummy NMG and PMG structures to achieve the balanced gate surface area ratio. In some embodiments, adjacent dummy NMG structures can be separated by an n-type S/D region and adjacent dummy PMG structures can be separated by a p-type S/D region. In some embodiments, adjacent dummy NMG structures and adjacent dummy PMG structures can be separated by the same conductivity type (e.g., n- or p-type) S/D region.

FIGS. 1A-1C illustrate top-down views of an active P-cell 102P, an active N-cell 102N, and a dummy NP-cell 102NP, respectively, of an IC (not shown), according to some embodiments. FIGS. 1D-1F illustrate cross-sectional views of active P-cell 102P, active N-cell 102N, and dummy NP-cell 102NP along lines A-A, B-B, and C-C of FIGS. 1A-1C, according to some embodiments. FIGS. 1G-1J illustrate cross-sectional views of active P-cell 102P, active N-cell 102N, and dummy NP-cell 102NP along lines D-D, E-E, F-F, and G-G of FIGS. 1A-1C, according to some embodiments. FIGS. 1D-1J illustrate cross-sectional views with additional structures that are not shown in FIGS. 1A-1C for simplicity. The discussion of elements in FIGS. 1A-1J with the same annotations applies to each other, unless mentioned otherwise.

Referring to FIGS. 1A-1J, active P-cell 102P, active N-cell 102N, and dummy NP-cell 102NP can be disposed on different regions of a substrate 104 of the IC. Active P-cell 102P and active N-cell 102N can be disposed in active device areas of the IC and dummy NP-cell 102NP can be disposed in a dummy device area of the IC. In some embodiments, active P-cell 102P, active N-cell 102N, and dummy NP-cell 102NP can be arranged in a row or column on substrate 104, and dummy NP-cell 102NP can be disposed between active P-cell 102P and active N-cell 102N. Unlike active P-cell 102P and active N-cell 102N, dummy NP-cell 102NP is not electrically coupled to any power supply and is electrically isolated from other structures of the IC. In some embodiments, the IC can include any number of active P-cell 102P, active N-cell 102N, and dummy NP-cell 102NP. In some embodiments, dummy NP-cells, such as dummy NP-cell 102NP, can be disposed surrounding one or more of active P-cell 102P and/or active N-cell 102N.

Substrate 104 can be a semiconductor material, such as silicon, germanium (Ge), silicon germanium (SiGe), a silicon-on-insulator (SOI) structure, other suitable semiconductor materials, and a combination thereof. Further, substrate 104 can be doped with p-type dopants (e.g., boron, indium, aluminum, gallium, or other suitable p-type dopants) or n-type dopants (e.g., phosphorus, arsenic, or other suitable n-type dopants).

Referring to FIGS. 1A, 1D, and 1G, in some embodiments, active P-cell 102P can include (i) a well region 106P disposed within substrate 104, (ii) an array of S/D regions 110P disposed within well region 106P, (iii) an array of PMG structures 112P, (iv) gate spacers 114 disposed along gate sidewalls of PMG structures 112P, (v) shallow isolation trench (STI) regions 116 disposed on substrate 104, (vi) interlayer dielectric (ILD) layers 118A-118B, (vii) S/D contact structures 128P disposed on S/D regions 110P, and (viii) a gate contact structure 130P disposed on one of PMG structures 112P.

In some embodiments, well region 106P can represent an n-type well region and can include n-type dopants, such as phosphorus, arsenic, and other suitable n-type dopants. S/D regions 110P can include p-type dopants, such as boron, indium, aluminum, gallium, and other suitable p-type dopants with a doping concentration higher than the doping concentration of well region 106P. In some embodiments, S/D regions 110P and PMG structure 112P interposed between S/D regions 110P can form a p-type MOSFET. In some embodiments, active P-cell 102P can have any number of p-type MOSFETs.

In some embodiments, PMG structure 112P can include (i) an interfacial oxide (IO) layer 120P disposed on well region 106P, (ii) a high-k (HK) gate dielectric layer 122P disposed on IO layer 120P, (iii) a pWFM layer 124P disposed on HK gate dielectric layer 122P, and (iv) a gate metal fill layer 126P disposed on pWFM layer 124P. In some embodiments, IO layer 120P can include silicon oxide ($SiO_x$), silicon germanium oxide (SiGeOx), germanium oxide (GeOx), or other suitable oxide materials. In some embodiments, HK gate dielectric layer 122P can include (i) a high-k dielectric material, such as hafnium oxide (HfO2), titanium oxide (TiO2), hafnium zirconium oxide (HfZrO), tantalum oxide (Ta2O3), hafnium silicate (HfSiO4), zirconium oxide (ZrO2), and zirconium silicate (ZrSiO2), and (ii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), (iii) other suitable high-k dielectric materials, and (iii) a combination thereof. As used herein, the term "high-k" refers to a high dielectric constant. In the field of semiconductor device structures and manufacturing processes, high-k refers to a dielectric constant that is greater than the dielectric constant of SiO2 (e.g., greater than 3.9).

In some embodiments, pWFM layer 124P can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, tantalum copper (Ta—Cu), other suitable substantially Al-free conductive materials, and a combination thereof. In some embodiments, gate metal fill layer 126P can include a suitable conductive material, such as tungsten (W), titanium (Ti), silver (Ag), ruthenium (Ru), molybdenum (Mo), copper (Cu), cobalt (Co), aluminum (Al), iridium (Ir), nickel (Ni), other suitable conductive materials, and a combination thereof. In some embodiments, gate metal fill layer 126P can include a substantially fluorine-free metal layer (e.g., fluorine-free W). The substantially fluorine-free metal layer can include an amount of fluorine contaminants less than about 5 atomic percent in the form of ions, atoms, and/or molecules.

In some embodiments, S/D contact structures 128P and gate contact structure 130P can include conductive materials with low resistivity (e.g., resistivity about 50 µΩ-cm, about 40 µΩ-cm, about 30 µΩ-cm, about 20 µΩ-cm, or about 10 µΩ-cm), such as cobalt (Co), tungsten (W), ruthenium (Ru), iridium (Ir), nickel (Ni), Osmium (Os), rhodium (Rh), aluminum (Al), molybdenum (Mo), other suitable conductive materials with low resistivity, and a combination thereof. In some embodiments, gate spacers 114, STI regions 116, and ILD layers 118A-118B can include an insulating material, such as silicon oxide, silicon nitride (SiN), silicon carbon nitride (SiCN), silicon oxycarbon nitride (SiOCN), silicon germanium oxide, and other suitable insulating materials.

Referring to FIGS. 1B, 1E, and 1H, in some embodiments, active N-cell 102N can include (i) a well region 106N disposed within substrate 104, (ii) an array of S/D regions 110N disposed within well region 106N, (iii) an array of NMG structures 112N, (iv) gate spacers 114 disposed along gate sidewalls of NMG structures 112N, (v) STI regions 116 disposed on substrate 104, (vi) ILD layers 118A-118B, (vii) S/D contact structures 128N disposed on S/D regions 110N, and (viii) a gate contact structure 130N disposed on one of NMG structures 112N.

In some embodiments, well region 106N can include p-type dopants, such as boron, indium, aluminum, gallium, and other suitable p-type dopants. S/D regions 110N can include n-type dopants, such as phosphorus, arsenic, and other suitable n-type dopants with a doping concentration higher than the doping concentration of well region 106N. In some embodiments, S/D regions 110N and NMG structure 112N interposed between S/D regions 110N can form an n-type MOSFET. In some embodiments, active N-cell 102N can have any number of n-type MOSFETs.

In some embodiments, NMG structure 112N can include (i) an IO layer 120N disposed on well region 106N, (ii) a HK gate dielectric layer 122N disposed on IO layer 120N, (iii) a nWFM layer 124N disposed on HK gate dielectric layer 122N, and (iv) a gate metal fill layer 126N disposed on nWFM layer 124N. In some embodiments, nWFM layer 124N can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, other suitable Al-based conductive materials, and a combination thereof. The discussion of IO layer 120P, HK gate dielectric layer 122P, and gate metal fill layer 126P applies to IO layer 120N, HK gate dielectric layer 122N, and gate metal fill layer 126N, unless mentioned otherwise. In some embodiments, pWFM layer 124P and gate metal fill layer 126P are different from nWFM layer 124N and gate metal fill layer 126N. As a result, PMG structures 112P and NMG structures 112N can be formed sequentially, and not simultaneously, according to some embodiments.

Referring to FIGS. 1C, 1F, and 1I-1J, in some embodiments, dummy NP-cell 102NP can include (i) an array of well regions 107P-107N disposed within substrate 104, (ii) arrays of S/D regions 111P-111N disposed within respective well regions 107P-107N, (iii) an array of dual gate structures 115, (iv) gate spacers 114 disposed along gate sidewalls of dual gate structures 115, (v) STI regions 116 disposed on substrate 104, and (vi) ILD layers 118A-118B. Unlike active P-cell 102P and active N-cell 102N, dummy NP-cell 102NP does not have S/D contact structures and gate contact structures. The discussion of well regions 106P-106N and S/D regions 110P-110N applies to well regions 107P-107N and S/D regions 111P-111N, respectively, unless mentioned otherwise. In some embodiments, instead of well regions 107P and 107N of different conductivity types, dummy NP-cell 102NP can have well regions 107P and 107N of the same conductivity type or can have a well region similar to well region 106P or 106N. Similarly, in some embodiments, instead of S/D regions 111P and 111N of different conductivity types, dummy NP-cell 102NP can have S/D regions of the same conductivity type or can have an array of S/D regions similar to S/D regions 110P or 110N. In some embodiments, dummy NP-cell 102NP does not include well regions 107P-107N and/or S/D regions 111P-111N.

In some embodiments, each of dual gate structures 115 can include a dummy PMG structure 113P and a dummy NMG structure 113N with a gate end surface abutting a gate end surface of dummy PMG structure 113P. The term "gate end surface" is used herein to refer to a side surface of a gate structure along a gate length (e.g., along an X-axis) of the gate structure. The term "gate sidewall" is used herein to refer to a side surface of a gate structure along a gate width (e.g., along a Y-axis) of the gate structure. The discussion of PMG structures 112P and NMG structures 112N applies to respective dummy PMG structures 113P and dummy NMG structures 113N, unless mentioned otherwise. In some embodiments, gate lengths GL1, GL2, GL3, and GL4 of respective PMG structures 112P, NMG structures 112N, dummy PMG structures 113P, and dummy NMG structures 113N are substantially equal to each other. In some embodiments, gate lengths GL3 and GL4 are substantially equal to each other, and different from respective gate lengths GL1 and GL2. In some embodiments, gate widths GW1 and GW2 are substantially equal to each other. In some embodiments, the cell area, along an XY-plane, of dummy NP-cell 102NP can be substantially equal to or different from the cell area, along an XY-plane of active P-cell 102P and/or active N-cell 102N. In some embodiments, the cell area, along an XY-plane, of dummy NP-cell 102NP can range from about 1 µm² to about 9 µm² or other suitable dimensions. In some embodiments, S/D regions 111P and PMG structure 113P interposed between S/D regions 111P can form a p-type MOSFET. In some embodiments, S/D regions 111N and NMG structure 113N interposed between S/D regions 111N can form an n-type MOSFET.

In some embodiments, a gate top surface area, along an XY-plane, of each dummy PMG structure 113P is substantially equal to a gate top surface area, along an XY-plane, of each dummy NMG structure 113N. Thus, dummy NP-cell 102NP has a gate top surface area ratio of about 1:1 between the total gate top surface area of dummy PMG structures 113P and the total gate top surface area of dummy NMG structures 113N. Such balanced gate top surface area ratio between dummy PMG and NMG structures 113P-113N can prevent or minimize the CMP process-related dishing effects in both the arrays of PMG and NMG structures 112P-112N to achieve substantially uniform gate top surface profiles in both active P-cell 102P and active N-cell 102N. The dishing effects can cause non-uniform gate top surface profile (e.g., concave shaped profiles 132P-132N shown in FIGS. 1G-1H), which results in a mismatch between gate heights GH1 of PMG structures 112P and between gate heights GH2 of NMG structures 112N, and degrades the IC performance.

If the gate top surface area ratio is unbalanced between dummy PMG and NMG structures 113P-113N, the CMP process-related dishing effects may not be prevented or minimized in both or either of the arrays of PMG and NMG structures 112P-112N. For example, if dummy NP-cell 102NP has polysilicon structures or only NMG structures instead of dual gate structures 115, the CMP process-related dishing effects can occur in active P-cell 102P due to a polishing rate mismatch between the materials of PMG structures 112P and the materials of polysilicon structures or NMG structures during the fabrication of active P-cell 102P. In addition, the CMP process-related dishing effects can occur in active N-cell 102N due to a polishing rate mismatch between the materials of NMG structures 112N and the materials of polysilicon structures during the fabrication of active N-cell 102N.

Similarly, if dummy NP-cell 102NP has polysilicon structures or only PMG structures instead of dual gate structures 115, the CMP process-related dishing effects can occur in active N-cell 102N due to a polishing rate mismatch between the materials of NMG structures 112N and the materials of polysilicon structures or PMG structures, and in active P-cell 102N due to a polishing rate mismatch between the materials of PMG structures 112P and the materials of polysilicon structures. Thus, a balanced distribution of dummy PMG and NMG structures 113P-113N can provide matching polishing rates for both PMG and NMG structures 112P-112N for substantially uniform polishing of the gate top surfaces during the fabrication of active P-cell 102P and active N-cell 102N. As a result, substantially equal gate heights GH1, GH2, GH3, and GH4 of respective PMG structures 112P, NMG structures 112N, dummy PMG structures 113P, and dummy NMG structures 113N can be achieved.

In some embodiments, to achieve the substantially uniform gate top surface profile in active P-cell 102P, the total gate top surface area of dummy PMG structures 113P is smaller than the total gate top surface area of PMG structures 112P. Similar, in some embodiments, to achieve the substantially uniform gate top surface profile in active N-cell 102N, the total gate top surface area of dummy NMG structures 113N is smaller than the total gate top surface area of NMG structures 112N.

The number of well regions, S/D regions, and gate structures shown in FIGS. 1A-1I is illustrative. Active P-cell 102P, active N-cell 102N, and dummy NP-cell 102NP can have any number of well regions, S/D regions, and gate structures.

Figure 1L:
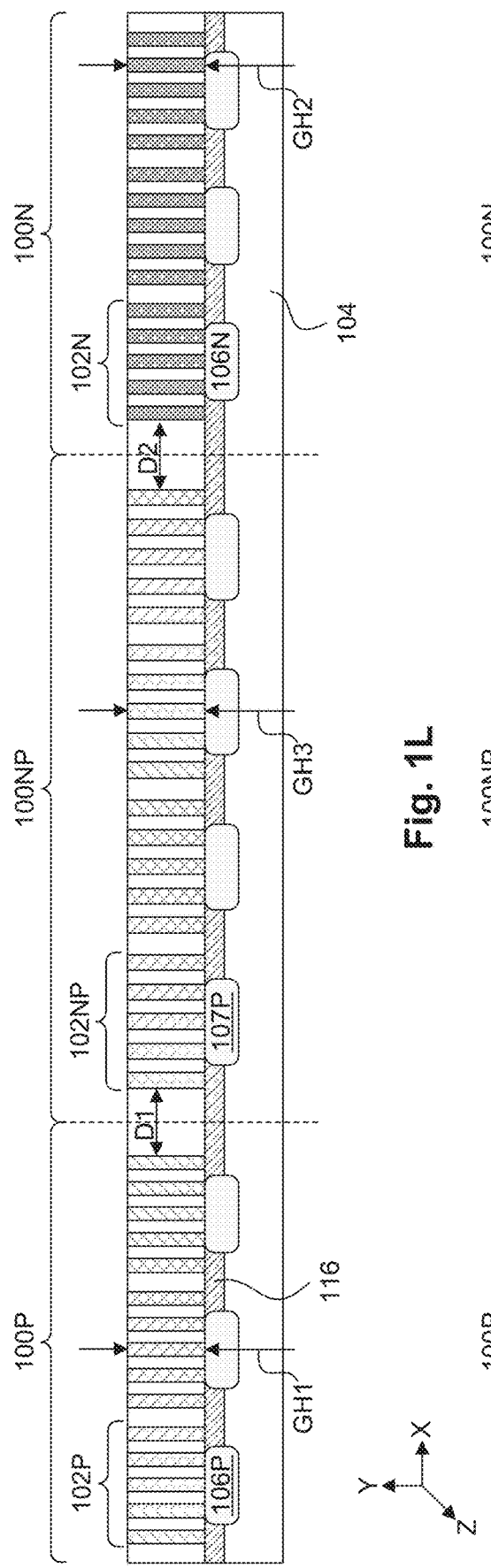
Figure 1M:
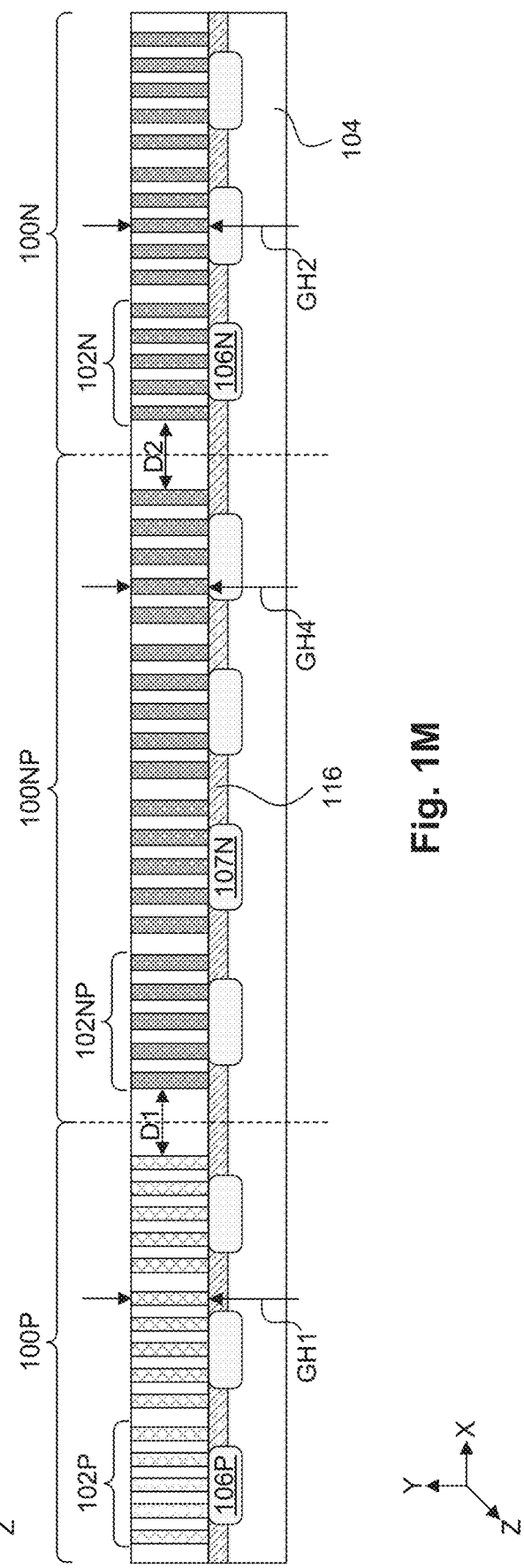

Referring to FIGS. 1K-1L, in some embodiments, the IC can include a plurality of active P-cells 102P forming an active P-cell array 100P and a plurality of active N-cells 102N forming an active N-cell array 100N in the active device areas on substrate 104, and can include dummy NP-cells 102NP forming a dummy NP-cell array 100NP in the dummy device area on substrate 104. FIG. 1K illustrates top-down views of active P-cell array 100P, active N-cell array 100N, and dummy NP-cell array 100NP, according to some embodiments. FIGS. 1L-1M illustrate cross-sectional views of active P-cell array 100P, active N-cell array 100N, and dummy NP-cell array 100NP along lines H-H and J-J of FIG. 1K, according to some embodiments. Some of the elements of active P-cell 102P, active N-cell 102N, and dummy NP-cell 102NP are not shown in FIGS. 1K-1M for simplicity. Though the array sizes of active P-cell array 100P and active N-cell array 100N are shown to be equal to each other and different from the array size of dummy NP-cell array 100NP, the array sizes of active P-cell array 100P, active N-cell array 100N, and dummy NP-cell array 100NP can be equal to or different from each other. The IC can include any number of active P-cell array 100P, active N-cell array 100N, and dummy NP-cell array 100NP. In some embodiments, distance D1 between active P-cell array 100P and dummy NP-cell array 100NP and distance D2 between active N-cell array 100N and dummy NP-cell array 100NP can be equal to or different from each other, and can range from about 100 nm to about 1000 nm or other suitable dimensions. FIGS. 1L-1M illustrates that the balanced gate top surface area ratio between PMG and NMG structures 113P-113N in dummy NP-cell array 100NP results in substantially uniform surface profiles and substantially equal gate heights GH1 and GH2 across PMG and NMG structures 112P-112N.

In some embodiments, instead of dummy NP-cell array 100NP, the balanced gate top surface area ratio of about 1:1 between dummy PMG and NMG structures can be achieved with dummy NP-cell array 136NP shown in FIG. 1N or dummy NP-cell array 138NP shown in FIG. 1O. Each of dummy NP-cell arrays 136NP and 138NP can include an equal number of dummy P-cells 134P with dummy PMG structures 135P and dummy N-cells 134N with dummy NMG structures 135N arranged in different configurations. Thus, each of dummy NP-cell arrays 136NP and 138NP has a gate top surface area ratio of about 1:1 between the total gate top surface area of dummy PMG structures 135P and the total gate top surface area of dummy NMG structures 135N. In some embodiments, dummy P-cells 134P can be similar to dummy NP-cell 102NP, except dummy P-cells 134P include PMG structures 135P instead of dual gate structure 115. In some embodiments, dummy N-cells 134N can be similar to dummy NP-cell 102NP, except dummy N-cells 134N include NMG structures 135N instead of dual gate structure 115. The discussion of PMG and NMG structures 134P-134N applies to PMG and NMG structures 112P-112N, unless mentioned otherwise.

FIGS. 2A-2C illustrate top-down views of an active P-cell 202P, an active N-cell 202N, and a dummy NP-cell 202NP, respectively, of the IC (not shown), according to some embodiments. FIGS. 2D-2F illustrate cross-sectional views of active P-cell 202P, active N-cell 202N, and dummy NP-cell 202NP along lines A-A, B-B, and C-C of FIGS. 2A-2C, according to some embodiments. FIGS. 2G-2J illustrate cross-sectional views of active P-cell 202P, active N-cell 202N, and dummy NP-cell 202NP along lines D-D, E-E, F-F, and G-G of FIGS. 2A-2C, according to some embodiments. FIGS. 2K-2M illustrate isometric views of regions A-C of respective FIGS. 2A-2C, according to some embodiments. FIGS. 2D-2M illustrate cross-sectional and isometric views with additional structures that are not shown in FIGS. 2A-2C for simplicity. The discussion of elements in FIGS. 1A-1M and 2A-2M with the same annotations applies to each other, unless mentioned otherwise.

Referring to FIGS. 2A-2M, active P-cell 202P, active N-cell 202N, and dummy NP-cell 202NP can be disposed on different regions of substrate 104 of the IC. Active P-cell 202P and active N-cell 202N can be disposed in the active device areas of the IC and dummy NP-cell 202NP can be disposed in the dummy device area of the IC. In some embodiments, active P-cell 202P, active N-cell 202N, and dummy NP-cell 202NP can be arranged in a row or column on substrate 204, and dummy NP-cell 202NP can be disposed between active P-cell 202P and active N-cell 202N. Unlike active P-cell 202P and active N-cell 202N, dummy NP-cell 202NP is not electrically coupled to a power supply and is electrically isolated from other structures of the IC. In some embodiments, the IC can include any number of active P-cell 202P, active N-cell 202N, and dummy NP-cell 202NP. In some embodiments, dummy NP-cells, such as dummy NP-cell 202NP, can be disposed surrounding one or more of active P-cell 202P and/or active N-cell 202N.

Referring to FIGS. 2A-2B, 2D-2E, 2G-2H, and 2K-2I, in some embodiments, active P-cell 202P and active N-cell 202N can include (i) fin structures 206P and 206N disposed on substrate 104, (ii) an array of S/D regions 210P and 210N disposed on respective fin structures 206P and 206N, (iii) an array of PMG structures 212P and NMG structures 212N disposed on the portions of fin structures 206P and 206N that do not have S/D regions 210P and 210N, (iv) gate spacers 114 disposed along gate sidewalls of PMG structures 212P and NMG structures 212N, (v) STI regions 116 disposed on substrate 104, (vi) ILD layers 118A-118B, (vii) etch stop layer 217, (viii) S/D contact structures 228P and 228N disposed on respective S/D regions 210P and 210N, and (ix) gate contact structures 230P and 230N disposed on respective PMG structures 212P and NMG structures 212N.

In some embodiments, fin structures 206P-206N can include a material similar to substrate 104 and extend along an X-axis. In some embodiments, S/D regions 210P can include an epitaxially-grown semiconductor material, such as Si and SiGe, and can include p-type dopants, such as boron, indium, aluminum, gallium, and other suitable p-type dopants. In some embodiments, S/D regions 210N can include an epitaxially-grown semiconductor material, such as Si, and can include n-type dopants, such as phosphorus, arsenic, and other suitable n-type dopants. In some embodiments, S/D regions 210P and PMG structures 212P interposed between S/D regions 210P can form p-type finFETs. In some embodiments, S/D regions 210N and NMG structures 212N interposed between S/D regions 210N can form n-type finFETs. The discussion of PMG and NMG structures 112P-112N, S/D contact structures 128P-128N, and gate contact structures 130P-130N applies to PMG and NMG structures 212P-212N, S/D contact structures 228P-228N, and gate contact structures 230P-230N, unless mentioned otherwise. In some embodiments, ESL 217 can include an insulating material, such as silicon oxide, silicon nitride (SiN), silicon carbon nitride (SiCN), silicon oxycarbon nitride (SiOCN), silicon germanium oxide, and other suitable insulating materials.

Referring to FIGS. 2C, 2F, 2I-2J, and 2M, in some embodiments, dummy NP-cell 202NP can include (i) fin structures 207P and 207N disposed on substrate 104, (ii) arrays of S/D regions 211P-211N disposed on respective fin structures 207P-207N, (iii) an array of dual gate structures 215, (iv) gate spacers 114 disposed along gate sidewalls of dual gate structures 215, (v) STI regions 116 disposed on substrate 104, (vi) ILD layers 118A-118B, and (vii) etch stop layer 217. Unlike active P-cell 202P and active N-cell 202N, dummy NP-cell 202NP does not have S/D contact structures and gate contact structures. The discussion of fin structures 206P-206N and S/D regions 210P-210N applies to fin structures 207P-207N and S/D regions 211P-211N, respectively, unless mentioned otherwise. In some embodiments, dummy NP-cell 202NP can have S/D regions of the same conductivity type. The discussion of dual gate structures 115 applies to dual gate structures 215, unless mentioned otherwise.

In some embodiments, each of dual gate structures 215 can include a dummy PMG structure 213P and a dummy NMG structure 213N with a gate end surface abutting a gate end surface of dummy PMG structure 213P. In some embodiments, S/D regions 211P and PMG structures 213P interposed between S/D regions 211P can form p-type finFETs. In some embodiments, S/D regions 211N and NMG structures 213N interposed between S/D regions 211N can form n-type finFETs. The discussion of dummy PMG structures 113P and dummy NMG structures 113N applies to respective dummy PMG structures 213P and dummy NMG structures 213N, unless mentioned otherwise. Similar to dummy NP-cell 102NP, dummy NP-cell 202NP has a gate top surface area ratio of about 1:1 between the total gate top surface area of dummy PMG structures 213P and the total gate top surface area of dummy NMG structures 213N. As a result, substantially uniform gate top surface profiles in both active P-cell 202P and active N-cell 202N, and substantially equal gate heights GH1 and GH2 of respective PMG structures 212P and NMG structures 212N can be achieved.

In some embodiments, to achieve the substantially uniform gate top surface profile in active P-cell 202P, the total gate top surface area of dummy PMG structures 213P is smaller than the total gate top surface area of PMG structures 212P. Similar, in some embodiments, to achieve the substantially uniform gate top surface profile in active N-cell 202N, the total gate top surface area of dummy NMG structures 213N is smaller than the total gate top surface area of NMG structures 212N. The number of fin structures, S/D regions, and gate structures shown in FIGS. 2A-2M is illustrative. Active P-cell 202P, active N-cell 202N, and dummy NP-cell 202NP can have any number of fin structures, S/D regions, and gate structures. In some embodiments, a plurality of active P-cells 202P, active N-cells 202N, and dummy NP-cells 202NP can form arrays similar to active P-cell array 100P, active N-cell array 100N, and dummy NP-cell array 100NP.

Figure 3:
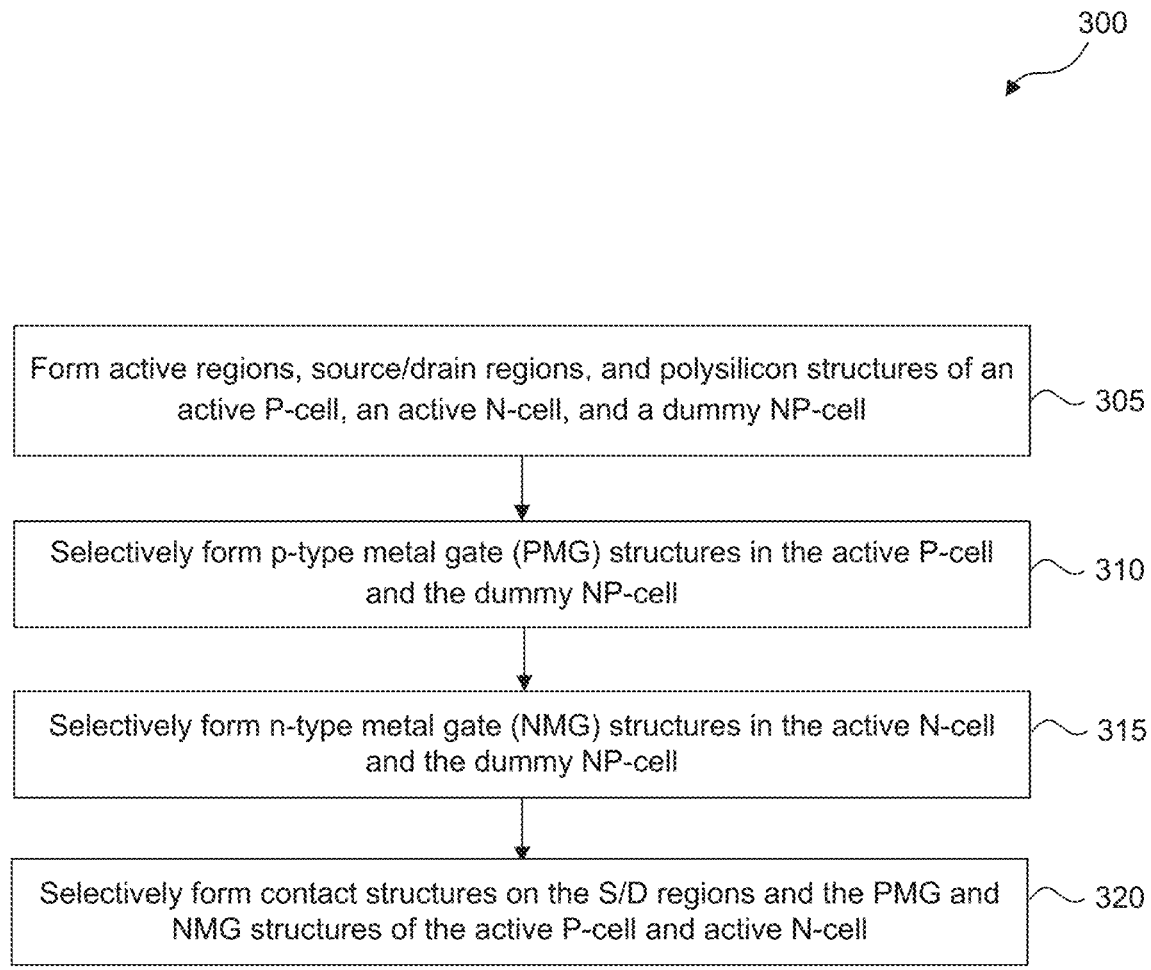
FIG. 3 is a flow diagram of a method for fabricating active and dummy cells of an integrated circuit, in accordance with some embodiments.
Figure 4D:
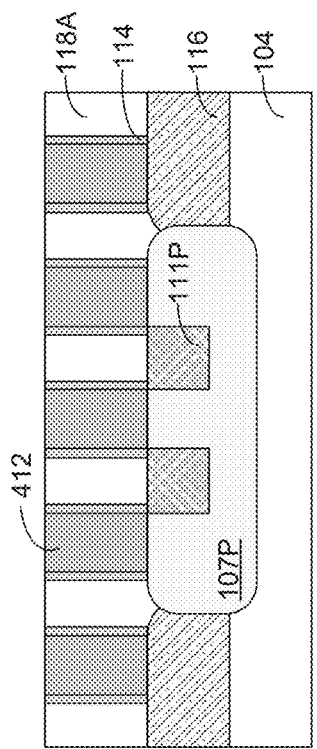
Figure 4F:
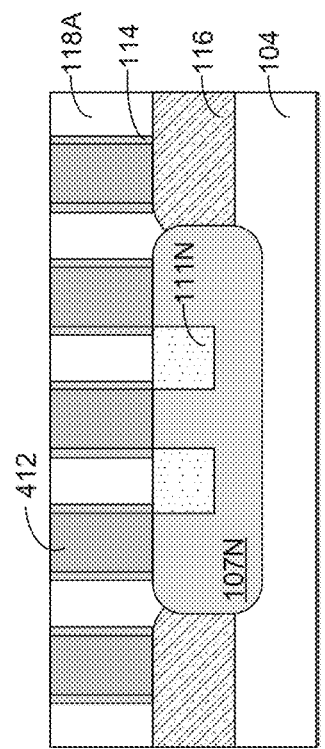
Figure 4E:
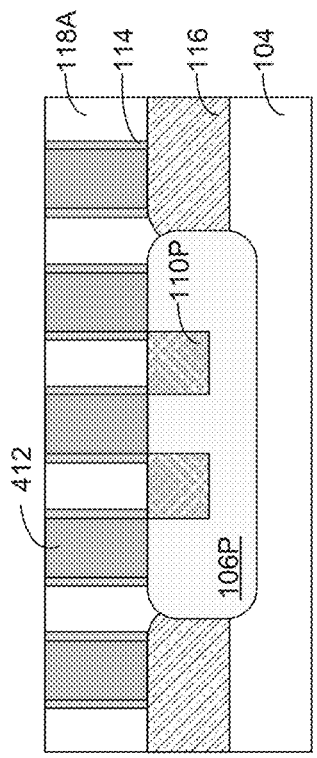
Figure 4G:
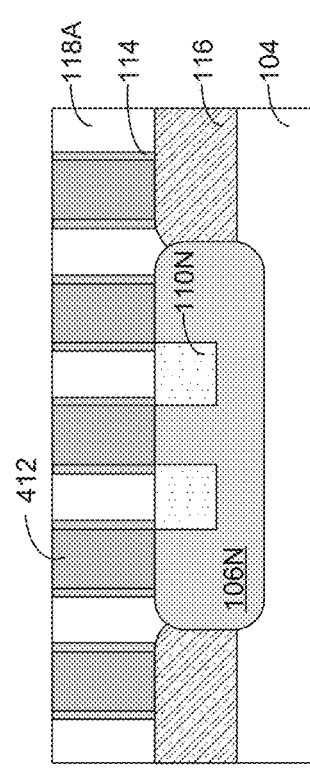

FIG. 3 is a flow diagram of an example method 300 for fabricating active P-cell 102P, active N-cell 102N, and dummy cell 102NP on substrate 104, according to some embodiments. For illustrative purposes, the operations illustrated in FIG. 3 will be described with reference to the example fabrication process for fabricating active P-cell 102P, active N-cell 102N, and dummy cell 102NP as illustrated in FIGS. 4A-13G. FIGS. 4A-13G are cross-sectional views of active P-cell 102P, active N-cell 102N, and dummy NP-cell 102NP along lines A-A, B-B, C-C, D-D, E-E, F-F, and G-G of FIGS. 1A-1C, according to some embodiments. Operations can be performed in a different order or not performed depending on specific applications. It should be noted that method 300 may not produce a complete active P-cell 102P, active N-cell 102N, and dummy cell 102NP of the IC. Accordingly, it is understood that additional processes can be provided before, during, and after method 300, and that some other processes may only be briefly described herein. Elements in FIGS. 4A-13G with the same annotations as elements in FIGS. 1A-1J are described above.

In operation 305, well regions, S/D regions, and polysilicon structures of an active P-cell, an active N-cell, and a dummy NP-cell are formed. For example, as shown in FIGS. 4A-4G, well regions 106P, 106N, 107P, and 107N, polysilicon structures 412, and S/D regions 110P, 110N, 111P, and 111N are formed. The formation of polysilicon structures 412 can be followed by the formation of gate spacers 114, which can be followed by the formation of S/D regions 110P, 110N, 111P, and 111N. The formation of S/D regions 110P, 110N, 111P, and 111N can be followed by the formation of ILD layer 118A.

Figure 5D:
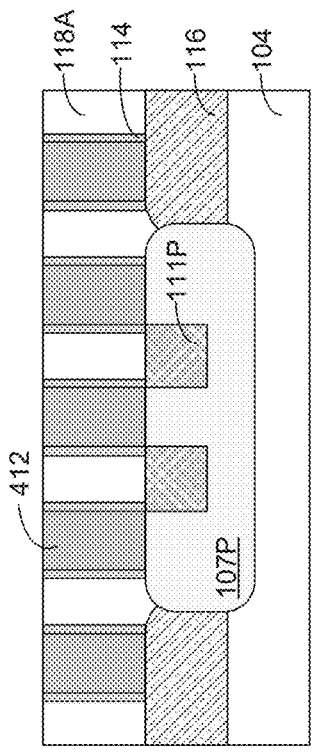
Figure 5F:
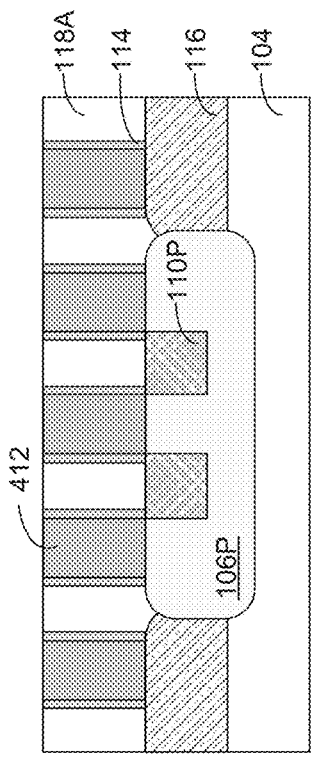
Figure 5E:
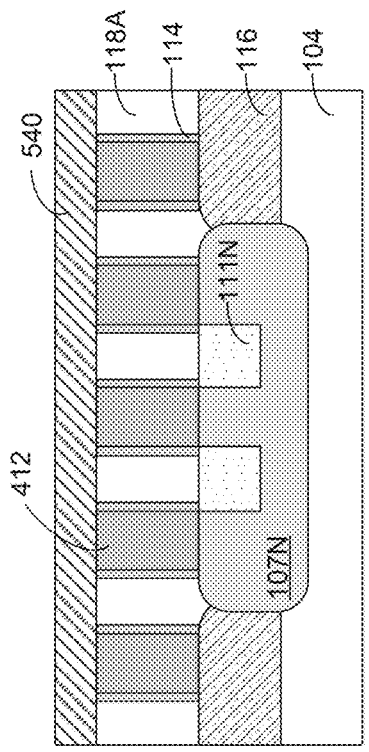
Figure 5G:
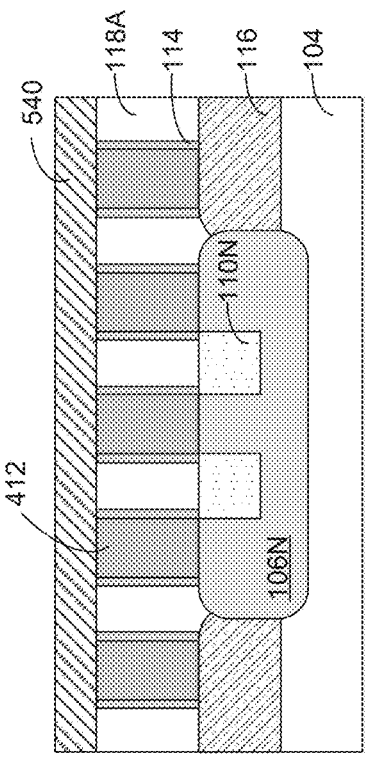
Figure 6D:
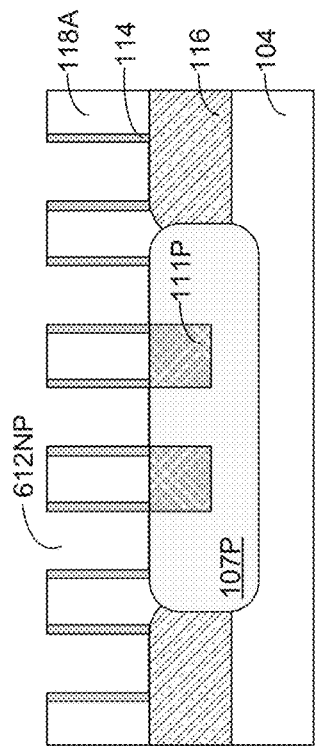
Figure 6E:
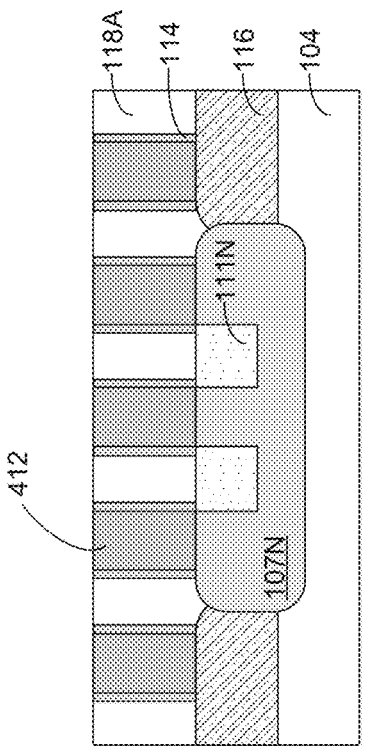
Figure 6F:
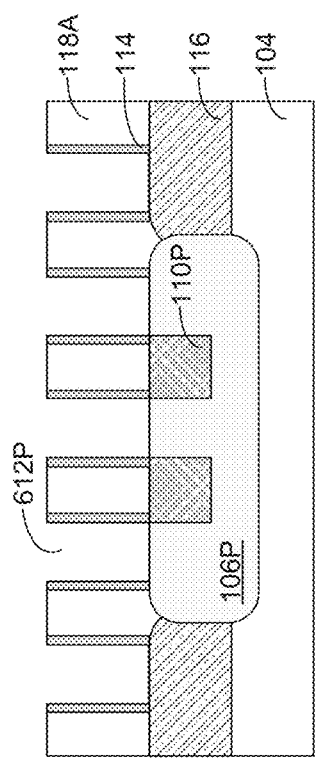
Figure 6G:
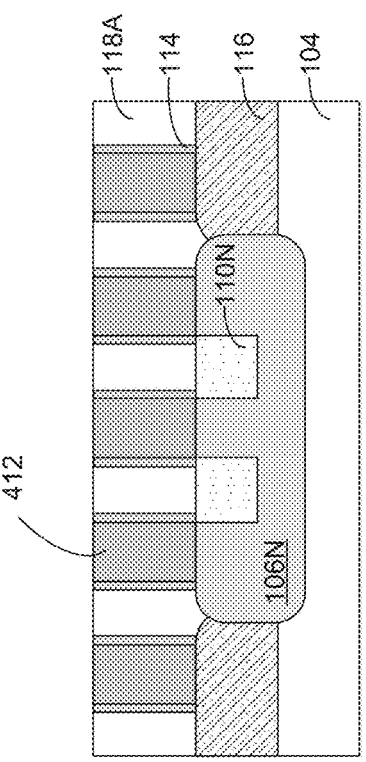
Figure 9D:
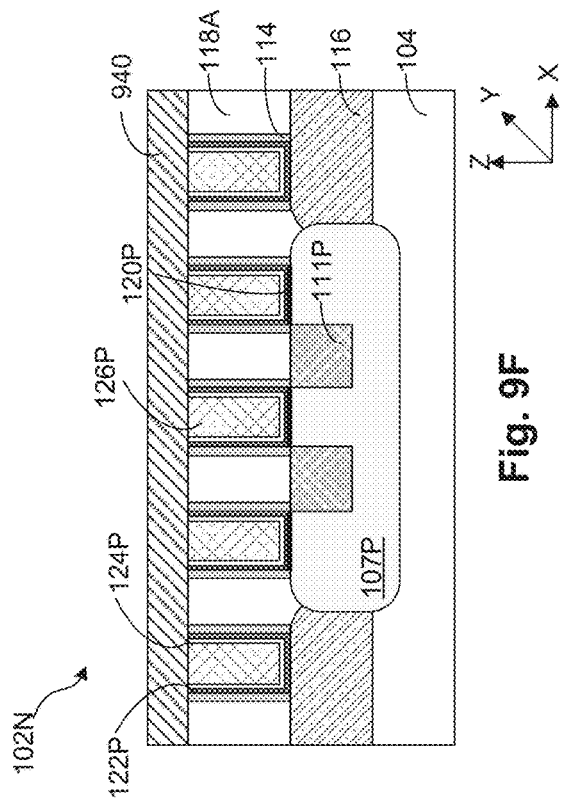
Figure 9F:
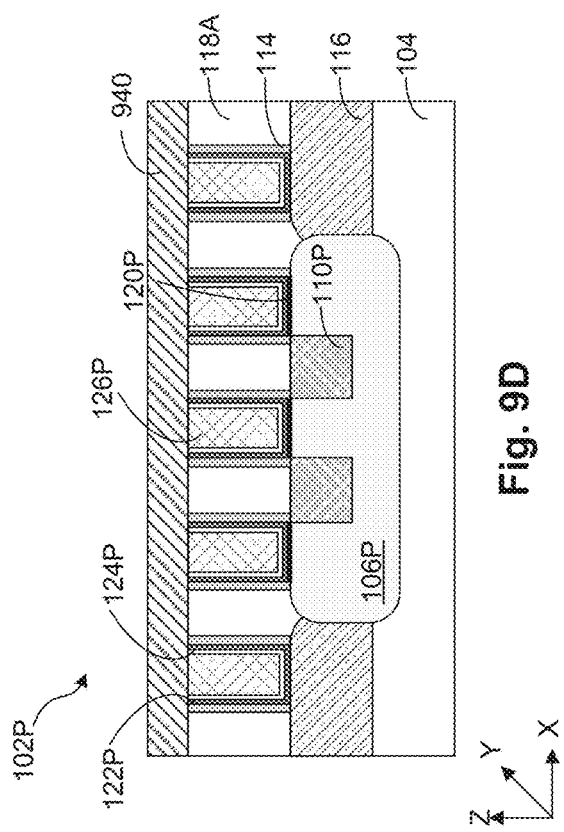
Figure 9E:
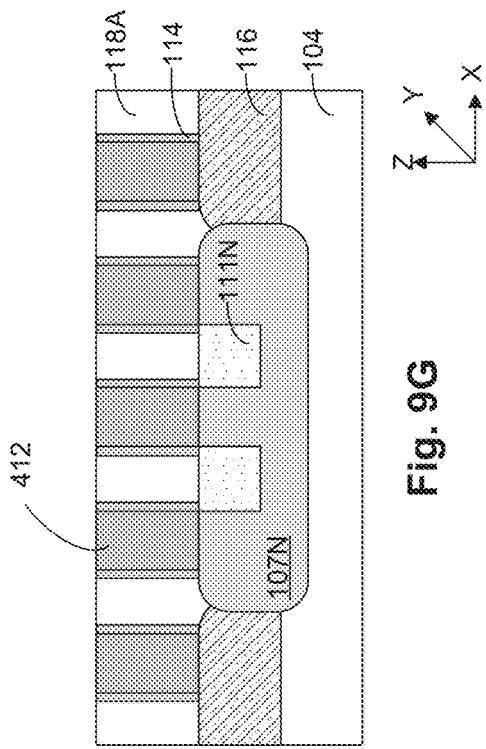
Figure 9G:
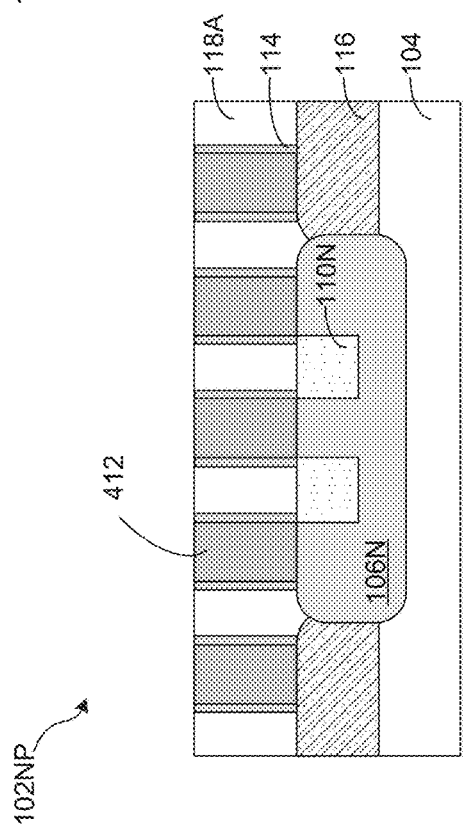

Referring to FIG. 3, in operation 310, PMG structures are selectively formed in the active P-cell and the dummy NP-cell. For example, as described with reference to FIGS. 5A-8G, PMG structures 112P and 113P are selectively formed in active P-cell 102P and dummy NP-cell 102NP. The formation of PMG structures 112P and 113P can include sequential operations of (i) forming a patterned masking layer 540 (e.g., a photoresist layer) on the structures of FIGS. 4B, 4C, 4E, and 4G to form the structures of FIGS. 5B, 5C, 5E, and 5G, (ii) forming gate openings 612P and 612NP (shown in FIGS. 6A, 6C, 6D, and 6F) substantially at the same time by etching polysilicon structures 412 from the structures of FIGS. 5A and 5D, and by etching the exposed portions of polysilicon structures 412 from the structures of FIGS. 5C and 5F, (iii) removing patterned masking layer 540, (iv) forming IO layers 120P on well regions 106P and 107P, as shown in FIGS. 7A, 7C, 7D, and 7F, (v) depositing HK gate dielectric layer 122P on the structures of FIGS. 7A-7G, (vi) depositing pWFM layer 124P on HK gate dielectric layer 122P, (vii) depositing gate metal fill layer 126P on pWFM layer 124P, and (viii) performing a CMP process on the deposited HK gate dielectric layer 122P, pWFM layer 124P, and gate metal fill layer 126P to form the structures of FIGS. 8A-8G. In some embodiments, the portion of patterned masking layer 540 on the structures of dummy NP-cell 102NP cover about 50% of the total top surface area of polysilicon structures 412, as shown in FIG. 5C.

Referring to FIG. 3, in operation 315, NMG structures are selectively formed in the active N-cell and the dummy NP-cell. For example, as described with reference to FIGS. 9A-12G, NMG structures 112N and 113N are selectively formed in active N-cell 102N and dummy NP-cell 102NP. The formation of NMG structures 112N and 113N can include sequential operations of (i) forming a patterned masking layer 940 (e.g., a photoresist layer) on the structures of FIGS. 8A, 8C, 8D, and 8F to form the structures of FIGS. 9A, 9C, 9D, and 9F, (ii) forming gate openings 1012N and 1012NP (shown in FIGS. 10B, 10C, 10E, and 10G) substantially at the same time by etching polysilicon structures 412 from the structures of FIGS. 9B and 9E, and by etching the exposed remaining portions of polysilicon structures 412 from the structures of FIGS. 9C and 9G, (iii) removing patterned masking layer 940, (iv) forming IO layers 120N on well regions 106N and 107N, as shown in FIGS. 11B, 11C, 11E, and 11G, (v) depositing HK gate dielectric layer 122N on the structures of FIGS. 11A-11G, (vi) depositing nWFM layer 124N on HK gate dielectric layer 122N, (vii) depositing gate metal fill layer 126N on nWFM layer 124N, and (viii) performing a CMP process on the deposited HK gate dielectric layer 122N, nWFM layer 124N, and gate metal fill layer 126N to form the structures of FIGS. 12A-12G.

Referring to FIG. 3, in operation 320, contact structures are selectively formed on the S/D regions and the PMG and NMG structures of the active P-cell and the active N-cell. For example, as shown in FIGS. 13A-13B and 13D-13E, S/D contact structures 128P-128N are formed on S/D regions 110P-110N and gate contact structures 130P-130N are formed on PMG and NMG structures 112P-112N.

In some embodiments, operations of method 300 can be performed to form a plurality of active P-cells 102P, active N-cells 102N, and dummy NP-cells 102NP to form the respective active P-cell array 100P, active N-cell array 100N, and dummy NP-cell array 100NP.

Figure 14:
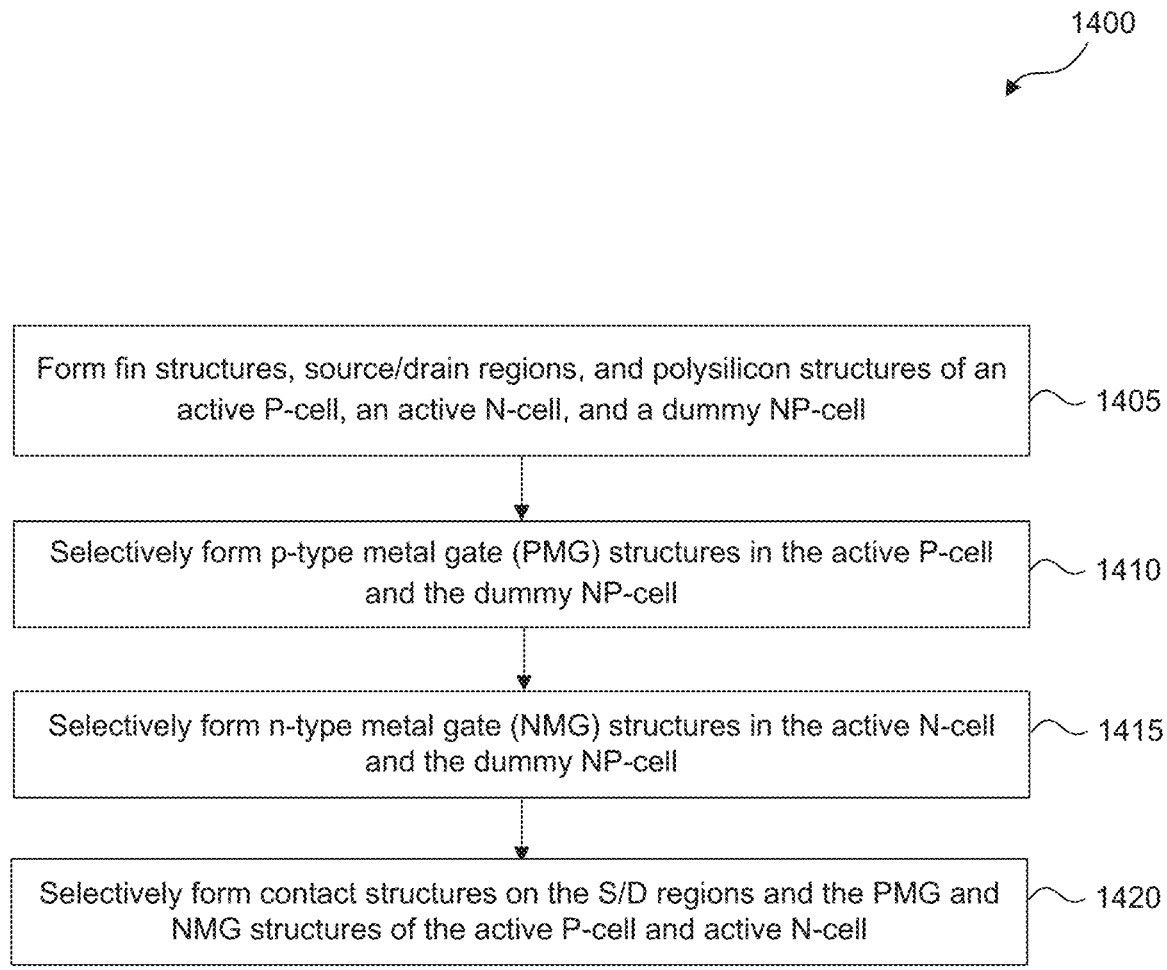
FIG. 14 is a flow diagram of another method for fabricating active and dummy cells of an integrated circuit, in accordance with some embodiments.

FIG. 14 is a flow diagram of an example method 1400 for fabricating active P-cell 202P, active N-cell 202N, and dummy cell 202NP on substrate 104, according to some embodiments. For illustrative purposes, the operations illustrated in FIG. 14 will be described with reference to the example fabrication process for fabricating active P-cell 202P, active N-cell 202N, and dummy cell 202NP as illustrated in FIGS. 15A-22C. FIGS. 15A-22C are cross-sectional views of active P-cell 202P, active N-cell 202N, and dummy NP-cell 202NP along lines A-A, B-B, and C-C of FIGS. 2A-2C, according to some embodiments. Operations can be performed in a different order or not performed depending on specific applications. It should be noted that method 1400 may not produce a complete active P-cell 202P, active N-cell 202N, and dummy cell 202NP of the IC. Accordingly, it is understood that additional processes can be provided before, during, and after method 1400, and that some other processes may only be briefly described herein. Elements in FIGS. 15A-22C with the same annotations as elements in FIGS. 2A-2M are described above.

In operation 1405, fin structures, S/D regions, and polysilicon structures of an active P-cell, an active N-cell, and a dummy NP-cell are formed. For example, as shown in FIGS. 15A-15C, fin structures 206P, 206N, 207P, and 207N and polysilicon structures 1512 are formed. In addition, S/D regions 210P, 210N, 211P, and 211N (not visible in the cross-sectional views of FIGS. 15A-15C) are epitaxially grown on the portions of fin structures 206P, 206N, 207P, and 207N that are not covered by polysilicon structures 1512. The formation of polysilicon structures 1512 can be followed by the formation of gate spacers 114, which can be followed by the formation of S/D regions 210P, 210N, 211P, and 211N. The formation of S/D regions 210P, 210N, 211P, and 211N can be followed by the formation of ILD layer 118A and ESL 217 (not visible in the cross-sectional views of FIGS. 15A-15C).

Referring to FIG. 14, in operation 1410, PMG structures are selectively formed in the active P-cell and the dummy NP-cell. For example, as described with reference to FIGS. 16A-18C, PMG structures 212P and 213P are selectively formed in active P-cell 202P and dummy NP-cell 202NP. The formation of PMG structures 212P and 213P can include sequential operations of (i) forming gate openings 1612P and 1612NP (shown in FIGS. 16A and 16C) substantially at the same time by etching polysilicon structures 1512 from the structure of FIG. 15A, and by etching the exposed portions of polysilicon structures 1512 from the structure of FIG. 15C, (ii) forming IO layers 120P on fin structures 206P and 207P, as shown in FIGS. 17A and 17C, (iii) depositing HK gate dielectric layer 122P on the structures of FIGS. 17A-17C, (vi) depositing pWFM layer 124P on HK gate dielectric layer 122P, (iv) depositing gate metal fill layer 126P on pWFM layer 124P, and (v) performing a CMP process on the deposited HK gate dielectric layer 122P, pWFM layer 124P, and gate metal fill layer 126P to form the structures of FIGS. 18A-18C.

Referring to FIG. 14, in operation 1415, NMG structures are selectively formed in the active N-cell and the dummy NP-cell. For example, as described with reference to FIGS. 19A-21C, NMG structures 212N and 213N are selectively formed in active N-cell 202N and dummy NP-cell 202NP. The formation of NMG structures 212N and 213N can include sequential operations of (i) forming gate openings 1912N and 1912NP (shown in FIGS. 19B and 19C) substantially at the same time by etching polysilicon structures 1512 from the structure of FIG. 19B, and by etching the exposed remaining portions of polysilicon structures 1512 from the structure of FIG. 19C, (ii) forming TO layers 120N on fin structures 206N and 207N, as shown in FIGS. 20B and 20C, (iii) depositing HK gate dielectric layer 122N on the structures of FIGS. 20A-20C, (vi) depositing nWFM layer 124N on HK gate dielectric layer 122N, (vii) depositing gate metal fill layer 126N on nWFM layer 124N, and (viii) performing a CMP process on the deposited HK gate dielectric layer 122N, nWFM layer 124N, and gate metal fill layer 126N to form the structures of FIGS. 21A-21C.

Referring to FIG. 14, in operation 1420, contact structures are selectively formed on the S/D regions and the PMG and NMG structures of the active P-cell and the active N-cell. For example, as shown in FIGS. 22A-22B gate contact structures 230P-230N are formed on PMG and NMG structures 212P-212N. S/D contact structures 228P-228N (not visible in the cross-sectional views of FIGS. 22A-22C) are formed on S/D regions 210P-210N.

The present disclosure provides example integrated circuits (ICs) with active and dummy device cell arrays (e.g., active P-cell array 100P, active N-cell array 100N, and dummy NP-cell arrays 100NP, 136NP, and 138NP) in respective active and dummy device areas, and example methods (e.g., methods 300 and 1400) of fabricating the same. The example IC can include n- and/or p-type active device cell arrays. The n-type active device cell arrays can include arrays of active N-cells (e.g., active N-cells 102N and 202N). Each of the active N-cells can include one or more electrically active n-type FETs (e.g., NMOSFETs, N-finFETs, or gate-all-around (GAA) NFETs) and/or n-type structures, such as n-type S/D regions (e.g., S/D regions 110N and 210N) and NMG structures (e.g., NMG structures 112N and 212N). The p-type active device cell arrays can include arrays of active P-cells (e.g., active P-cells 102P and 202P). Each of the active P-cells can include one or more electrically active p-type FETs (e.g., PMOSFETs, P-finFETs, or gate-all-around (GAA) PFETs) and/or p-type structures, such as p-type S/D regions (e.g., S/D regions 110P and 210P) and PMG structures (e.g., PMG structures 112P and 212P). The active N-cells and P-cells can further include contact structures (e.g., S/D contact structures 128P-128N and 228P-228N, gate contact structures 130P-130N and 230P-230N) disposed on one or more S/D regions and gate structures.

The dummy device cell arrays can be disposed adjacent to or surrounding the active device cell arrays and can include dummy N-cells and P-cells, and/or NP-cells (e.g., dummy N-cells 134N, dummy P-cells 134P, and dummy NP cells 102NP-202NP). Unlike the active N-cells and P-cells, the dummy N-cells, P-cells, and NP-cells do not include contact structures and/or contact landing pads or regions on the S/D regions and/or gate structures. The dummy device cell arrays can be formed and arranged in a manner to achieve a substantially uniform surface profile across the gate structures in both active P- and N-cell arrays. Each dummy device cell array can be formed with a gate surface area ratio of about 1:1 between the total top surface area of the dummy NMG structures and the total top surface area of the dummy PMG structures to achieve the substantially uniform surface profile. Such balanced gate surface area ratio between the dummy NMG and PMG structures can prevent or minimize the CMP process-related dishing effects during the formation of the active NMG and PMG structures. The balanced distribution of the dummy NMG and PMG structures provide matching polishing rates for the active NMG and PMG structures, and consequently prevent or minimize the CMP process-related dishing effects.

In some embodiments, each of the dummy device cell arrays (e.g., dummy NP-cell array 136NP and 138NP) can be formed with an equal number of dummy N-cells (e.g., dummy N-cells 134N) and dummy P-cells (e.g., dummy P-cells 134P) to achieve the balanced gate surface area ratio. In some embodiments, the dummy N-cells and P-cells can be arranged in an array configuration or in an alternating configuration with respect to each other. The dummy N-cells can have dummy NMG structures (e.g., dummy NMG structures 135N) that are equal in number to the dummy PMG structures (e.g., dummy PMG structures 135P) of the dummy P-cells. In some embodiments, the dummy NMG and PMG structures can have gate dimensions (e.g., gate length, gate width, and gate height) that are substantially equal to each other. In some embodiments, the dummy NMG structures can have a total top surface area that is substantially equal to the total top surface area of the dummy PMG structures. In some embodiments, each of the dummy device cell arrays (e.g., dummy NP-cell array 100NP) can be formed with arrays of dummy NP-cells (e.g., dummy NP-cells 102NP) having an equal number of dummy NMG and PMG structures (e.g., dummy NMG and PMG structures 113N-113P) to achieve the balanced gate surface area ratio.

In some embodiments, an integrated circuit includes a substrate, an active device cell, and a dummy device cell. The active device cell includes an array of source/drain (S/D) regions of a first conductivity type disposed on or within the substrate and an array of gate structures with a first gate fill material disposed on the substrate. The dummy device cell includes a first array of S/D regions of the first conductivity type disposed on or within the substrate, a second array of S/D regions of a second conductivity type disposed on or within the substrate, and an array of dual gate structures disposed on the substrate. Each of the dual gate structures includes the first gate fill material and a second gate fill material that is different from the first gate fill material.

In some embodiments, an integrated circuit includes a substrate, first and second active source/drain (S/D) regions disposed on or within the substrate, an active gate structure with a gate fill layer disposed on the substrate, first and second dummy S/D regions disposed on or within the substrate, and a dummy gate structure disposed on the substrate. The dummy gate structure includes a first gate fill layer and a second gate fill layer that is different from the first gate fill layer. The first gate fill layer has a first top surface area and the second gate fill layer has a second top surface area that is substantially equal to the first top surface area.

In some embodiments, a method includes forming first and second fin structures on a substrate, forming first and second source/drain (S/D) regions on the first and second fin structures, respectively, forming first and second polysilicon structures on the first and second fin structures, respectively, replacing the first polysilicon structure and a first portion of the second polysilicon structure with a first metal layer, polishing the first metal layer at a first polishing rate, replacing a second portion of the second polysilicon structure with a second metal layer that is different from the first metal layer, and polishing the second metal layer at a second polishing rate that is different from the first polishing rate.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a substrate;
   an active device cell comprising:
      an array of source/drain (S/D) regions of a first conductivity type disposed on or within the substrate; and
      an array of gate structures with a first gate fill material disposed on the substrate; and
   a dummy device cell comprising:
      a first array of S/D regions of the first conductivity type disposed on or within the substrate;
      a second array of S/D regions of a second conductivity type disposed on or within the substrate; and
      an array of dual gate structures disposed on the substrate, wherein each of the dual gate structures comprises:
         a first gate structure comprising a first gate dielectric layer and the first gate fill material; and
         a second gate structure comprising a second gate dielectric layer and a second gate fill material that is different from the first gate fill material,
         wherein a vertical sidewall of the first gate dielectric layer is in contact with a vertical sidewall of the second dielectric layer.

2. The integrated circuit of claim 1, wherein the first gate structure has a first end surface and the second gate structure has a second end surface that abuts the first end surface.

3. The integrated circuit of claim 1, wherein the first gate structure has a first top surface area and the second gate structure has a second top surface area that is substantially equal to the first top surface area.

4. The integrated circuit of claim 1, wherein the first gate structure has a first top surface area and the second gate structure has a second top surface area; and
   wherein each of the gate structures comprises a top surface area that is greater than the first or second top surface area.

5. The integrated circuit of claim 1, wherein the first and second gate fill materials are work function metal layers.

6. The integrated circuit of claim 1, wherein the active device cell further comprises a contact structure disposed on at least one of the gate structures; and
   wherein the dummy device cell does not comprise a contact structure.

7. The integrated circuit of claim 1, wherein the first gate structure is disposed on a first well region of the first conductivity type and the second gate structure is disposed on a second well region of the second conductivity type that is different from the first conductivity type.

8. The integrated circuit of claim 1, wherein at least one of the gate structures is disposed on a first well region of the first conductivity type; and
   wherein at least one of the dual gate structures is disposed on a second well region of the second conductivity type that is different from the first conductivity type.

9. The integrated circuit of claim 1, wherein the active device cell comprises a metal oxide semiconductor field effect transistor (MOSFET).

10. The integrated circuit of claim 1, wherein the active device cell comprises a fin field effect transistor (finFET).

11. An integrated circuit, comprising:
    a substrate;

first and second active source/drain (S/D) regions disposed on or within the substrate;
an active gate structure with a gate fill layer disposed on the substrate;
first and second dummy S/D regions disposed on or within the substrate;
a dummy gate structure disposed on the substrate, wherein the dummy gate structure comprises:
a first gate fill layer;
a second gate fill layer that is different from the first gate fill layer;
a first gate dielectric layer surrounding the first gate fill layer; and
a second gate dielectric layer surrounding the second gate fill layer,
wherein a vertical sidewall of the first gate dielectric layer is in contact with a vertical sidewall of the second dielectric layer, and
wherein the first gate fill layer has a first top surface area and the second gate fill layer has a second top surface area that is substantially equal to the first top surface area.

12. The integrated circuit of claim 11, wherein the active gate structure is disposed on a first fin structure on the substrate; and
wherein the dummy gate structure is disposed on a second fin structure on the substrate.

13. The integrated circuit of claim 11, wherein the dummy gate structure comprises:
a first gate structure surrounding a first fin structure disposed on the substrate; and
a second gate structure surrounding a second fin structure disposed on the substrate.

14. The integrated circuit of claim 11, wherein the first and second active S/D regions are epitaxial regions disposed on a first fin structure; and
wherein the first and second dummy S/D regions are epitaxial regions disposed on a second fin structure.

15. The integrated circuit of claim 11, wherein the gate fill layer of the active gate structure and the first gate fill layer of the dummy gate structure comprises a same metal.

16. The integrated circuit of claim 11, wherein a top surface area of the gate fill layer is greater than a top surface area of the first or second gate fill layer.

17. An integrated circuit, comprising:
a substrate;
first and second n-type source/drain (S/D) regions disposed on or in the substrate;
first and second p-type S/D regions disposed on or in the substrate; and
a dual gate structure disposed between the first and second n-type S/D regions and between the first and second p-type S/D regions, wherein the dual gate structure comprises:
a first gate structure comprising a first gate dielectric layer and a first gate fill material; and
a second gate structure comprising a second gate dielectric layer and a second gate fill material that is different from the first gate fill material,
wherein a vertical sidewall of the first gate dielectric layer is in contact with a vertical sidewall of the second dielectric layer.

18. The integrated circuit of claim 17, wherein the first gate structure has a first top surface area and the second gate structure has a second top surface area that is substantially equal to the first top surface area.

19. The integrated circuit of claim 17, wherein the first gate structure has a first end surface and the second gate structure has a second end surface that abuts the first end surface.

20. The integrated circuit of claim 17, further comprising an active transistor with an active gate structure disposed on the substrate, wherein the dual gate structure is a dummy gate structure disposed adjacent to the active gate structure.

* * * * *

UNITED STATES PATENT AND TRADEMARK OFFICE
CERTIFICATE OF CORRECTION

PATENT NO. : 11,948,939 B2
APPLICATION NO. : 17/320171
DATED : April 2, 2024
INVENTOR(S) : Wu et al.

It is certified that error appears in the above-identified patent and that said Letters Patent is hereby corrected as shown below:

In the Specification

In Column 13, Line 65, delete "TO" and insert -- IO --, therefor.

Signed and Sealed this
Fifteenth Day of October, 2024

Katherine Kelly Vidal
*Director of the United States Patent and Trademark Office*